United States Patent
Sakita et al.

(10) Patent No.: US 11,156,917 B2
(45) Date of Patent: Oct. 26, 2021

(54) ACTINIC RAY-SENSITIVE OR RADIATION-SENSITIVE RESIN COMPOSITION, RESIST FILM, PATTERN FORMING METHOD, AND METHOD FOR MANUFACTURING ELECTRONIC DEVICE

(71) Applicant: FUJIFILM Corporation, Tokyo (JP)

(72) Inventors: Kyohei Sakita, Haibara-gun (JP); Mitsuhiro Fujita, Haibara-gun (JP); Takumi Tanaka, Haibara-gun (JP); Keishi Yamamoto, Haibara-gun (JP); Akiyoshi Goto, Haibara-gun (JP); Keita Kato, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 216 days.

(21) Appl. No.: 16/546,867

(22) Filed: Aug. 21, 2019

(65) Prior Publication Data
US 2019/0377261 A1  Dec. 12, 2019

Related U.S. Application Data

(63) Continuation of application No. PCT/JP2018/006632, filed on Feb. 23, 2018.

(30) Foreign Application Priority Data

Mar. 31, 2017 (JP) .............................. JP2017-071291

(51) Int. Cl.
| | | |
|---|---|---|
| G03F 7/004 | (2006.01) | |
| G03F 7/038 | (2006.01) | |
| G03F 7/039 | (2006.01) | |
| G03F 7/20 | (2006.01) | |
| G03F 7/40 | (2006.01) | |
| H01L 21/027 | (2006.01) | |
| G03F 7/16 | (2006.01) | |
| G03F 7/32 | (2006.01) | |
| G03F 7/38 | (2006.01) | |

(52) U.S. Cl.
CPC .......... *G03F 7/0045* (2013.01); *G03F 7/0382* (2013.01); *G03F 7/0392* (2013.01); *H01L 21/0274* (2013.01); *G03F 7/168* (2013.01); *G03F 7/2006* (2013.01); *G03F 7/2041* (2013.01); *G03F 7/325* (2013.01); *G03F 7/38* (2013.01); *G03F 7/40* (2013.01)

(58) Field of Classification Search
CPC .... G03F 7/0045; G03F 7/0046; G03F 7/0382; G03F 7/0392
See application file for complete search history.

(56) References Cited

U.S. PATENT DOCUMENTS

| | | | |
|---|---|---|---|
| 2013/0230804 A1 | 9/2013 | Sakakibara et al. | |
| 2013/0280657 A1* | 10/2013 | Kasahara | G03F 7/004 430/285.1 |
| 2014/0186767 A1* | 7/2014 | Thackeray | G03F 7/0382 430/281.1 |
| 2014/0342288 A1 | 11/2014 | Tomioka et al. | |
| 2015/0010857 A1* | 1/2015 | Yokokawa | C08F 232/08 430/18 |
| 2015/0125667 A1 | 5/2015 | Brust et al. | |
| 2015/0277225 A1* | 10/2015 | Kojima | C07D 335/02 430/18 |
| 2015/0346600 A1 | 12/2015 | Adachi et al. | |

FOREIGN PATENT DOCUMENTS

| | | | |
|---|---|---|---|
| EP | 2143711 A1 | 1/2010 | |
| EP | 2950143 A1 | 12/2015 | |
| JP | 2013-213951 A | 10/2013 | |
| JP | 2014-130280 A | 7/2014 | |
| JP | 2015-004967 A | 1/2015 | |
| JP | 2015-194703 A | 11/2015 | |
| JP | 2015-225251 A | 12/2015 | |
| KR | 10-2013-0111997 A | 10/2013 | |
| KR | 10-2015-0080625 A | 7/2015 | |
| TW | 201426174 A | 7/2014 | |
| WO | 2012/053527 A1 | 4/2012 | |
| WO | WO-2015141504 A1 * | 9/2015 | ........... C07D 333/50 |

OTHER PUBLICATIONS

Extended European Search Report dated Mar. 23, 2020, from the European Patent Office in Application No. 18774945.2.
International Search Report dated May 29, 2018, issued by the International Searching Authority in corresponding application No. PCT/JP2018/006632.
Written Opinion dated May 29, 2018, issued by the International Searching Authority in corresponding application No. PCT/JP2018/006632.
International Preliminary Report on Patentability dated Oct. 1, 2019, issued by the International Bureau in corresponding application No. PCT/JP2018/006632.
Communication dated Apr. 7, 2020, from the Japanese Patent Office in application No. 2019-508793.
Communication dated Feb. 18, 2021, from the European Patent Office in European Application No. 18774945.2.
Office Action dated Jun. 9, 2021 issued by the Korean Patent Office in Korean Application No. 10-2019-7024914.
Communication dated Dec. 8, 2020, from the Korean Intellectual Property Office in application No. KR 10-2019-7024914.
Office Action dated Jun. 23, 2021 issued by the Taiwanese Patent Office in Taiwanese Application No. 107107323.

\* cited by examiner

*Primary Examiner* — John A McPherson
*Assistant Examiner* — Nicholas E Brown
(74) *Attorney, Agent, or Firm* — Sughrue Mion, PLLC

(57) ABSTRACT

An actinic ray-sensitive or radiation-sensitive resin composition contains a resin having an acid-decomposable group whose polarity increases through decomposition by the action of an acid, an acid generator A capable of generating a first acid upon irradiation with actinic rays or radiation, and an acid generator B capable of generating a second acid upon irradiation with actinic rays or radiation, and the first acid and the second acid satisfy predetermined requirements.

8 Claims, 2 Drawing Sheets

ACTINIC RAY-SENSITIVE OR RADIATION-SENSITIVE RESIN COMPOSITION, RESIST FILM, PATTERN FORMING METHOD, AND METHOD FOR MANUFACTURING ELECTRONIC DEVICE

CROSS-REFERENCE TO RELATED APPLICATIONS

This application is a Continuation of PCT International Application No. PCT/JP2018/6632, filed on Feb. 23, 2018, which claims priority under 35 U.S.C. § 119(a) to Japanese Patent Application No. 2017-071291, filed on Mar. 31, 2017. Each of the above application(s) is hereby expressly incorporated by reference, in its entirety, into the present application.

BACKGROUND OF THE INVENTION

1. Field of the Invention

The present invention relates to an actinic ray-sensitive or radiation-sensitive resin composition, a resist film, a pattern forming method, and a method for manufacturing an electronic device.

2. Description of the Related Art

In processes for manufacturing semiconductor devices such as an integrated circuit (IC) and a large scale integrated circuit (LSI) in the related art, microfabrication by lithography using a resist composition has been carried out.

A chemically amplified resist composition usually contains an acid generator capable of generating an acid upon irradiation with actinic rays or radiation. An acid generated by this acid generator causes a deprotection reaction of resin components in the composition or generates a crosslinking reaction of the resin components.

For example, WO2012/053527A discloses a radiation-sensitive resin composition containing a radiation-sensitive acid generator capable of generating an acid upon irradiation with actinic rays or radiation, and a compound capable of generating a relatively weaker acid than an acid generated from the radiation-sensitive acid generator upon irradiation with actinic rays or radiation (refer to WO2012/053527A: paragraphs 0097 to 0104, Examples, and the like).

SUMMARY OF THE INVENTION

The present inventors have prepared an actinic ray-sensitive or radiation-sensitive resin composition containing two or more kinds of acid generators, based on the description in WO2012/053527A, and have investigated the composition, and they have thus found that a pattern thus formed is not necessarily sufficient in pattern line width roughness (LWR) and critical dimension uniformity (CDU), and has a room for further improvement.

Therefore, an object of the present invention is to provide an actinic ray-sensitive or radiation-sensitive resin composition capable of forming a pattern having excellent pattern line width roughness (LWR) and critical dimension uniformity (CDU).

Furthermore, another object of the present invention is to provide a resist film, a pattern forming method, and a method for manufacturing an electronic device, for which the actinic ray-sensitive or radiation-sensitive resin composition is used.

The present inventors have conducted studies in order to accomplish the objects, and as a result, they have found that the objects can be accomplished with an actinic ray-sensitive or radiation-sensitive resin composition containing a resin having an acid-decomposable group whose polarity increases through decomposition by the action of an acid, and two or more kinds of acid generators, and has an adjusted decomposition reaction rate of the acid-decomposable group of each of the acid generators, thereby leading to completion of the present invention.

That is, the present inventors have found that the objects can be accomplished by the following configurations.

[1] An actinic ray-sensitive or radiation-sensitive resin composition comprising:
a resin having an acid-decomposable group whose polarity increases through decomposition by the action of an acid;
an acid generator A capable of generating a first acid upon irradiation with actinic rays or radiation; and
an acid generator B capable of generating a second acid upon irradiation with actinic rays or radiation,
in which the second acid is capable of decomposing the acid-decomposable group and has a larger pKa than the first acid, and
in a case where a decomposition reaction rate of the acid-decomposable group by the first acid is defined as k0 and a decomposition reaction rate of the acid-decomposable group by the second acid is defined as k'0, k'0/k0 is more than 0.05 and 0.90 or less,
provided that k0 and k'0 are determined by a method which will be described later.

[2] The actinic ray-sensitive or radiation-sensitive resin composition as described in [1],
in which a pKa of the first acid is −3.50 or more.

[3] The actinic ray-sensitive or radiation-sensitive resin composition as described in [1] or [2],
in which a molecular weight of the second acid is 250 or more.

[4] The actinic ray-sensitive or radiation-sensitive resin composition as described in any one of [1] to [3],
in which the acid generator A and the acid generator B have a cation structure containing a sulfonium ion.

[5] The actinic ray-sensitive or radiation-sensitive resin composition as described in any one of [1] to [4],
in which at least one of the acid generator A or the acid generator B is a compound represented by General Formula (ZI-3) which will be described later.

[6] A resist film formed using the actinic ray-sensitive or radiation-sensitive resin composition as described in any one of [1] to [5].

[7] A pattern forming method comprising:
forming a resist film using the actinic ray-sensitive or radiation-sensitive resin composition as described in any one of [1] to [5];
exposing the resist film; and
developing the exposed resist film using a developer.

[8] A method for manufacturing an electronic device, comprising the pattern forming method as described in [7].

According to the present invention, it is possible to provide an actinic ray-sensitive or radiation-sensitive resin composition capable of forming a pattern having excellent pattern line width roughness (LWR) and critical dimension uniformity (CDU).

In addition, according to the present invention, it is possible to provide a resist film, a pattern forming method, and a method for manufacturing an electronic device, for which the actinic ray-sensitive or radiation-sensitive resin composition is used.

DESCRIPTION OF THE PREFERRED EMBODIMENTS

Figure 1A:
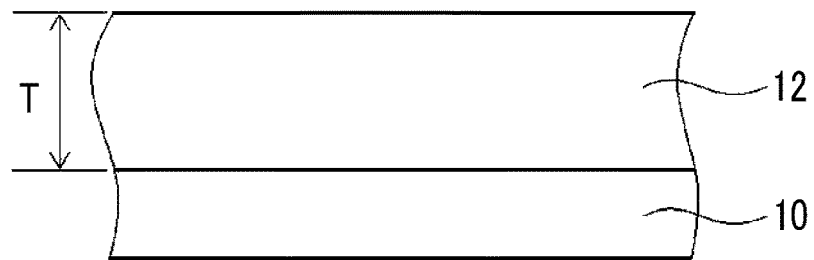
FIG. 1A is a schematic view for illustrating a method for calculating k'0 and k0.

Hereinafter, the actinic ray-sensitive or radiation-sensitive resin composition, the resist film, the pattern forming method, and the method for manufacturing an electronic device of the embodiments of the present invention will be described in detail.

Description of configuration requirements described below may be made on the basis of representative embodiments of the present invention in some cases, but the present invention is not limited to such embodiments.

In citations for a group (atomic group) in the present specification, in a case where the group is denoted without specifying whether it is substituted or unsubstituted, the group includes both a group not having a substituent and a group having a substituent. For example, an "alkyl group" includes not only an alkyl group not having a substituent (unsubstituted alkyl group), but also an alkyl group having a substituent (substituted alkyl group). In addition, an "organic group" in the present specification refers to a group including at least one carbon atom.

"Actinic rays" or "radiation" in the present specification means, for example, a bright line spectrum of a mercury lamp, far ultraviolet rays typified by an excimer laser, extreme ultraviolet rays (EUV rays), X-rays, electron beams (EB), or the like. "Light" in the present specification means actinic rays or radiation.

"Exposure" in the present specification encompasses, unless otherwise specified, not only exposure by a bright line spectrum of a mercury lamp, far ultraviolet rays typified by an excimer laser, extreme ultraviolet rays (EUV rays), X-rays, or the like, but also writing by particle rays such as electron beams and ion beams.

In the present specification, a numerical range expressed using "to" is used in a meaning of a range that includes the preceding and succeeding numerical values of "to" as the lower limit value and the upper limit value, respectively.

In the present specification, (meth)acrylate represents acrylate and methacrylate.

In the present specification, the weight-average molecular weight (Mw), the number-average molecular weight (Mn), and the dispersity (also referred to as a molecular weight distribution (Mw/Mn) of a resin are defined as values in terms of polystyrene by means of gel permeation chromatography (GPC) measurement (solvent: tetrahydrofuran, flow amount (amount of a sample injected): 10 μL, columns: TSK gel Multipore HXL-M manufactured by Tosoh Corporation, column temperature: 40° C., flow rate: 1.0 mL/min, and detector: differential refractive index detector) using a GPC apparatus (HLC-8120GPC manufactured by Tosoh Corporation).

[Actinic Ray-Sensitive or Radiation-Sensitive Resin Composition]

The actinic ray-sensitive or radiation-sensitive resin composition of an embodiment of the present invention (hereinafter also referred to as "the composition of the embodiment of the present invention") contains a resin having an acid-decomposable group whose polarity increases through decomposition by the action of an acid (hereinafter also referred to as a "resin having an acid-decomposable group"), an acid generator A capable of generating a first acid upon irradiation with actinic rays or radiation, and an acid generator B capable of generating a second acid upon irradiation with actinic rays or radiation, and satisfies both the following conditions 1 and 2.

Condition 1: The second acid is capable of decomposing the acid-decomposable group and has a larger pKa than the first acid.

Condition 2: In a case where the decomposition reaction rate of the acid-decomposable group by the first acid is defined as k0 and the decomposition reaction rate of the acid-decomposable group by the second acid is defined as k'0, k'0/k0 is more than 0.05 and 0.90 or less.

In the composition of the embodiment of the present invention, an acid (first acid) generated by the acid generator A usually contributes to deprotection of the resin having an acid-decomposable group. On the other hand, an acid (second acid) generated by the acid generator B usually contributes to deprotection of the resin having an acid-decomposable group and also functions as a neutralizing agent for the first acid. That is, since the second acid is weaker than the first acid (that is, it is a relatively weaker acid than the first acid), an equilibrium reaction of the first acid and the second acid occurs in the proton exchange with an anion. As a result, the first acid is neutralized.

Furthermore, in the composition of the embodiment of the present invention, a ratio of the decomposition reaction rate k'0 of the acid-decomposable group by the second acid to the decomposition reaction rate k0 of the acid-decomposable group by the first acid is more than 0.05 and 0.90 or less.

The decomposition reaction rate of the acid-decomposable group by the acid is a parameter which can be calculated by a method which will be described later, and can be usually controlled by the type of the acid-decomposable group, the pKa of the acid, and the size of the acid. Further, in a case where the acid is weak and the deprotection of the acid-decomposable group does not substantially occur, the decomposition reaction rate of the acid-decomposable group becomes zero. In addition, the size of the acid refers to the bulkiness (volume) of the acid; and as the acid is smaller, the diffusiveness is increased, and thus, the decomposition reaction rate is increased.

The present inventors have conducted studies on variation in the surface shape of a pattern using a composition containing a resin having an acid-decomposable group and a plurality of acid generators having different pKa's of acids thus generated, and have thus found that in a case where a plurality of acid generators are used in combination satisfying the conditions 1 and 2, a variation in the surface shape of the pattern can be further decreased, as compared with a case where the acid generator and a basic compound (which is a so-called acid diffusion control agent and does not contribute to a deprotection reaction as it is (in other words, a compound not capable of decomposing an acid-decomposable group)) as in the related art. A reason therefor is not clear, but is presumed to be suppression of a variation in the acid concentration in the resist film system after exposure. As a result, a pattern formed with the composition of the embodiment of the present invention becomes excellent in pattern line width roughness (LWR) and critical dimension uniformity (CDU).

Furthermore, the composition of the embodiment of the present invention does not necessarily contain a basic compound that has been contained as an acid diffusion control agent in the related art, and even in a case where the basic compound is contained, a content thereof can be reduced. This is clear from the results in the section of Examples of the present specification, and can be seen specifically from the viewpoint that the acid decomposition reaction rate ratio is 0.05 or less and the results of Example 1 in which a compound C-7 not substantially contributing to the deprotection reaction was not added and Example 9 in which the compound C-7 was added were equivalent.

Furthermore, the radiation-sensitive resin composition of WO2012/053527A contains an actinic ray-sensitive acid generator capable of generating an acid upon irradiation with actinic rays or radiation and a compound capable of generating an acid which is weaker than an acid generated from the actinic ray-sensitive acid generator upon irradiation with actinic rays or radiation (hereinafter also referred to as a "compound C"), but a decomposition rate ratio k'0/k0 with respect to the acid-decomposable groups of two acids becomes 0.05 or less (refer to Comparative Examples 1 and 2 in the section of Examples of the present specification). That is, it is considered that the compound C does not substantially contribute to the deprotection reaction of the acid-decomposable group.

Hereinafter, methods for calculating k'0 and k0 will be described with reference to drawings.

(Calculation of k0)

A composition for forming an organic antireflection film, ARC29A (manufactured by Brewer Science Ltd.), is applied onto a silicon wafer and baked at 205° C. for 60 seconds to form an antireflection film having a film thickness of 86 nm. By the procedure, an antireflection film-adhered substrate is obtained.

Next, an actinic ray-sensitive or radiation-sensitive resin film having a film thickness T (hereinafter simply referred to as a "film") is formed on the antireflection film-adhered substrate. Specifically, as shown in FIG. 1A, a film 12 with a thickness T is formed on a substrate 10. Further, the thickness T can be set to be, for example, in the range of 90 nm±20 nm.

During formation of the film, an actinic ray-sensitive or radiation-sensitive resin composition including only a resin having an acid-decomposable group, a test acid generator which is an onium salt including an anion of the first acid and a triphenylsulfonium cation, and a solvent is used. Specifically, the composition is applied onto the substrate by a spin coating method and prebaked at 100° C. for 60 seconds to produce a film having a thickness T. Further, the content of the test acid generator A in the actinic ray-sensitive or radiation-sensitive resin composition was 1.94 mmol/the solid content g of the composition. In addition, the concentration of the solid content of the actinic ray-sensitive or radiation-sensitive resin composition is in the range of 3.5%±0.5% by mass.

The type of the solvent depends on the type of the resin and the type of the acid generator, but examples of the solvent include a solvent selected from the group consisting of propylene glycol monomethyl ether acetate (PGMEA), propylene glycol monomethyl ether (PGME), cyclohexanone, and γ-butyrolactone.

Figure 1B:
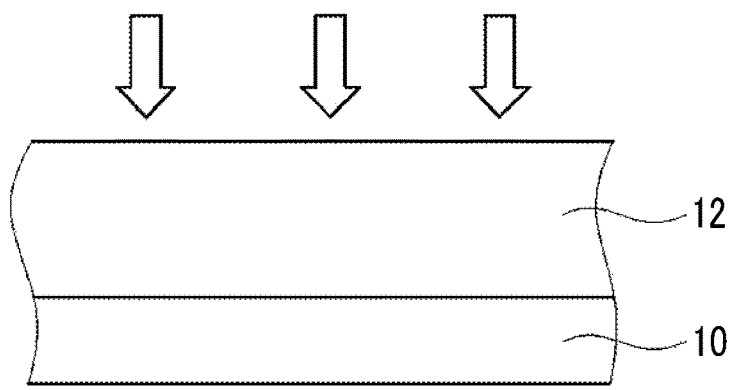
FIG. 1B is a schematic view for illustrating a method for calculating k'0 and k0.

Next, the obtained film is subjected to exposure at 99 positions while increasing the exposure dose from 1 mJ/cm$^2$ with an interval of 0.3 mJ/cm$^2$ using an ArF excimer laser. That is, exposures with different exposure doses are each performed at different 99 positions on the film surface. At this time, the exposure dose at each exposed position is increased from 1 mJ/cm$^2$ with an interval of 0.3 mJ/cm$^2$. More specifically, as indicated by outline arrows in FIG. 1B, exposures are performed at different positions of the film at varying exposure doses. Further, in FIG. 1B, exposures are performed at different 3 positions of the film 12 at varying exposure doses. In the leftmost exposure in FIG. 1B, exposure is performed at an exposure dose of A mJ/cm$^2$; in the middle exposure, exposure is performed at an exposure dose of (A+0.3) mJ/cm$^2$; and in the rightmost exposure, exposure is performed at an exposure dose of (A+0.6) mJ/cm$^2$. As such, at each of the positions exposed, exposure is performed while increasing the exposure dose with an interval of 0.3 mJ/cm$^2$.

Thereafter, the film which has been subjected to the exposure treatment is post-exposure-baked (PEB) at 90° C. for 60 seconds. Then, the film thickness of the film which has been subjected to the exposure treatment (which is meant to be a film that has been subjected to PEB after exposure) is calculated. In addition, the film thickness is measured at 99 positions at which the exposures have been performed. Next, a plot diagram is created using data of the exposure dose and the film thickness at each exposed position, but the plot diagram (hereinafter also referred to as a "film thickness-exposure dose plot diagram after the exposure treatment") will be described later.

Figure 1C:
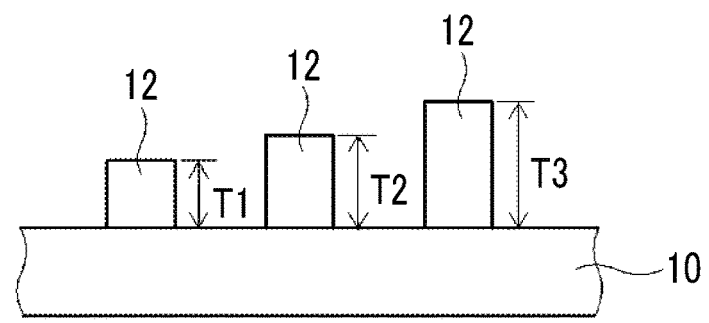
FIG. 1C is a schematic view for illustrating a method for calculating k'0 and k0.

Thereafter, the obtained film is subjected to a development treatment. In a method for the development treatment, the film is developed with butyl acetate for 30 seconds and then spin-dried. In a case of performing a development treatment, the film is removed at the exposed positions. The amount removed at that time varies depending on the exposure dose. For example, FIG. 1C is a view illustrating the film shown in FIG. 1B, which has further been subjected to a development treatment, and has the smallest film thickness at the leftmost exposed position and the largest film thickness at the rightmost exposed position. That is, a relationship of T3>T2>T1 is satisfied. In FIG. 1C, only film thicknesses at three points are described, but the film thicknesses are actually measured at 99 points in the exposed positions.

Figure 2:
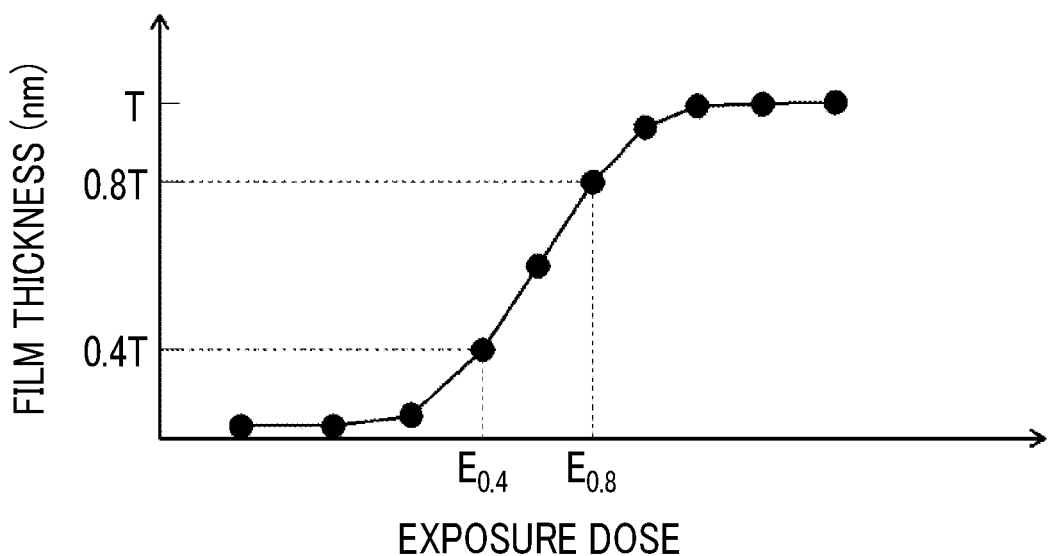
FIG. 2 is a plot diagram (film thickness-exposure dose plot diagram after a development treatment) created for illustrating a method for calculating k'0 and k0.

Next, with regard to the film after the development treatment, a plot diagram (hereinafter also referred to as a "film thickness-exposure dose plot diagram after the development treatment") is created using the data on the exposure dose and the film thickness at each exposed position. Specifically, points corresponding to the exposure dose and the film thickness at each exposed position are plotted in an orthogonal coordinate having the film thicknesses on the vertical axis and the exposure doses on the horizontal axis. That is, a graph having the film thicknesses at each exposed position on the vertical axis and the exposure doses at each exposed position on the horizontal axis is created. Further, the unit of the vertical axis is nm and the unit of the exposure dose is mJ/cm$^2$. FIG. 2 shows an example of the film thickness-exposure dose plot diagram after the development treatment. Incidentally, each black dot in FIG. 2 corresponds to the results (the film thickness and the exposure dose) at each exposed point. In addition, in FIG. 2, for ease of description, the plot number of black dots is less than the actual 99 points.

Next, a coordinate $E_{0.4}$ on the horizontal axis at a point where the value of the thickness on the vertical axis on the obtained line becomes 0.4×T (a thickness equaling to 40% of T), and a coordinate $E_{0.8}$ on the horizontal axis at a point where the value of the thickness on the vertical axis on the obtained line becomes 0.8×T (a thickness equaling to 80% of T) are calculated.

Next, in the same manner as for the film thickness-exposure dose plot diagram after the development treatment, a film thickness-exposure dose plot diagram after the exposure treatment is created. A method for creating the film thickness-exposure dose plot diagram after the exposure treatment is the same as that for the film thickness-exposure dose plot diagram after the development treatment, except that a film to be measured is the film after the exposure treatment.

Figure 3:
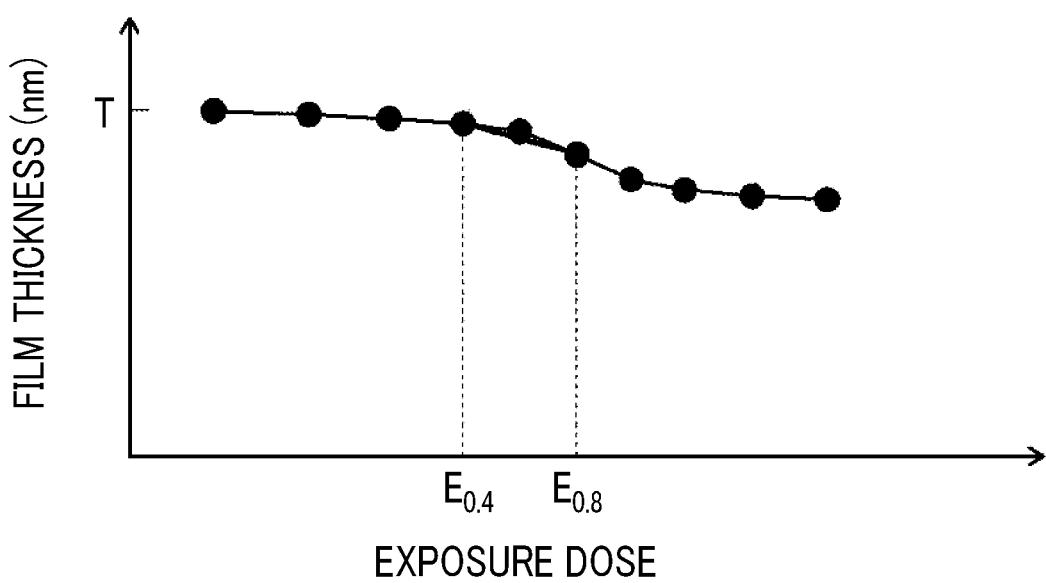
FIG. 3 is a plot diagram (film thickness-exposure dose plot diagram after an exposure treatment) created for illustrating a method for calculating k'0 and k0.

Specifically, points corresponding to the exposure dose and the film thickness at each exposed position are plotted in an orthogonal coordinate having the film thicknesses on the vertical axis and the exposure doses on the horizontal axis. That is, a graph having the film thicknesses at each exposed position on the vertical axis and the exposure doses at each exposed position on the horizontal axis is created. Further, the unit of the vertical axis is nm and the unit of the exposure dose is mJ/cm². FIG. 3 shows an example of a film thickness-exposure dose plot diagram after the exposure treatment. Incidentally, each black dot in FIG. 3 corresponds to the results (the film thickness and the exposure dose) at each exposed point. In addition, in FIG. 3, for ease of description, the plot number of black dots is less than the actual 99 points. Further, as shown in FIG. 3, in a case where the exposure dose is large in the film after the exposure treatment, decomposition of the acid-decomposable group further proceeds and volatilization and the like of the acid-decomposable group are further proceeds, and therefore, as the exposure dose is increased, the film thickness is decreased.

Next, a line is created by connecting the respective plotted points in the obtained plot diagram. A point A corresponding to the $E_{0.4}$ on the horizontal axis and a point B corresponding to the $E_{0.8}$ on the horizontal axis, as determined from the film thickness-exposure dose plot diagram after the development treatment, are selected, and an absolute value of an inclination of a straight line obtained by connecting the points A and B is calculated and taken as k0.

For example, in a case where the thickness T is 2,000 nm, 0.4 T corresponds to 800 nm and 0.8 T corresponds to 1,600 nm. Here, from FIG. 2, the value on the horizontal axis of a point at which the thickness on the vertical axis is 800 nm is calculated as $E_{0.4}$, and the value on the horizontal axis of a point at which the thickness on the vertical axis is 1,600 nm is calculated as $E_{0.8}$. Next, from FIG. 3, the value $T_{0.4}$ on the vertical axis in a case where the value on the horizontal axis is $E_{0.4}$, and the value $T_{0.8}$ on the vertical axis in a case where the value on the horizontal axis is $E_{0.8}$ are each calculated, an absolute value $|(T_{0.8}-T_{0.4})/(E_{0.8}-E_{0.4})|$ of the inclination of the two points is calculated, and the absolute value is taken as k0.

(Calculation of k'0)

Next, k'0 is also calculated by the same method as for the k0, using an actinic ray-sensitive or radiation-sensitive resin composition only including a resin having an acid-decomposable group, a test acid generator B (1.94 mmol/the solid content g of the composition) which is an onium salt including an anion of the second acid and a triphenylsulfonium cation, and a solvent.

Moreover, the test acid generator A which is an onium salt including an anion of the first acid and a triphenylsulfonium cation is an onium salt having an anion produced by withdrawing a proton from the first acid generated from the acid generator A upon irradiation with actinic rays or radiation, and a triphenylsulfonium cation. In addition, the test acid generator B which is an onium salt including an anion of the second acid and a triphenylsulfonium cation is an onium salt having an anion produced by withdrawing a proton from the second acid generated from the acid generator upon irradiation with actinic rays or radiation, and a triphenylsulfonium cation.

A specific structural formula of the test acid generator A and the test acid generator B is set forth below. In addition, in the following structural formula, X⁻ corresponds to an anion produced by withdrawing a proton from the first acid generated from the acid generator A, or an anion produced by withdrawing a proton from the second acid generated from the acid generator B.

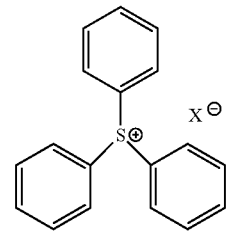

(Calculation of k'0/k0)

k'0/k0 is calculated from the results of k0 and k'0 obtained above.

(Measurement of pKa)

In the present specification, the pKa of an acid generated from an acid generator is determined using the following software package 1, by computation from a value based on a Hammett substituent constant and the database of publicly known literature values.

Software package 1: Advanced Chemistry Development (ACD/Labs) Software V 8.14 for Solaris (1994-2007 ACD/Labs).

Hereinafter, the respective components of the composition of the embodiment of the present invention will be described.

<Resin (A)>

The composition of the embodiment of the present invention contains a resin (hereinafter also referred to as an "acid-decomposable resin" or a "resin (A)") having a group (hereinafter also referred to as an "acid-decomposable group") whose polarity increases through decomposition by the action of an acid. The acid-decomposable group of the resin (A) is a group whose polarity increases through decomposition by the action of each of at least the first acid and the second acid.

In this case, in the pattern forming method of the embodiment of the present invention, typically, in a case where an alkali developer is adopted as the developer, a positive-tone pattern is suitably formed, and in a case where an organic developer is adopted as the developer, a negative-tone pattern is suitably formed.

The resin (A) preferably has a repeating unit having an acid-decomposable group.

As the resin (A), a known resin can be appropriately used. For example, known resins disclosed in paragraphs <0055> to <0191> of US2016/0274458A1A, paragraphs <0035> to <0085> of US2015/0004544A1, and paragraphs <0045> to <0090> of US2016/0147150A1 can be suitably used as the resin (A).

The acid-decomposable group preferably has a structure in which a polar group is protected with a group (leaving group) capable of decomposing by the action of an acid to leave.

Examples of the polar group an acidic group (a group that dissociates in a 2.38%-by-mass aqueous tetramethylammonium hydroxide solution such as a carboxy group, a phenolic hydroxyl group, a fluorinated alcohol group, a sulfonic acid group, a sulfonamido group, a sulfonylimido group, an (alkyl sulfonyl)(alkylcarbonyl)methylene group, an (alkyl sulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, and a tris(alkylsulfonyl)methylene group, and an alcoholic hydroxyl group.

Furthermore, the alcoholic hydroxyl group refers to a hydroxyl group bonded to a hydrocarbon group, which is a hydroxyl group other than a hydroxyl group (phenolic hydroxyl group) directly bonded to an aromatic ring, from which an aliphatic alcohol (for example, a hexafluoroisopropanol group) having the α-position substituted with an electron withdrawing group such as a fluorine atom is excluded as a hydroxyl group. The alcoholic hydroxyl group is preferably a hydroxyl group having an acid dissociation constant (pKa) from 12 to 20.

Preferred examples of the polar group include a carboxyl group, a fluorinated alcohol group (preferably a hexafluoroisopropanol group), and a sulfonic acid group.

A group which is preferable as the acid-decomposable group is a group in which a hydrogen atom of the polar group is substituted with a group that leaves by the action of an acid.

Examples of the group (leaving group) that leaves by an acid include —C($R_{36}$)($R_{37}$)($R_{38}$), —C($R_{36}$)($R_{37}$)($OR_{39}$), and —C($R_{01}$)($R_{02}$)($OR_{39}$).

In the formulae, $R_{36}$ to $R_{39}$ each independently represent an alkyl group, a cycloalkyl group, an aryl group, an aralkyl group, or an alkenyl group. $R_{36}$ and $R_{37}$ may be bonded to each other to form a ring.

$R_{01}$ and $R_{02}$ each independently represent a hydrogen atom, an alkyl group, a cycloalkyl group, an aryl group, an aralkyl group, or an alkenyl group.

As the alkyl group as each of $R_{36}$ to $R_{39}$, $R_{01}$, and $R_{02}$, an alkyl group having 1 to 8 carbon atoms is preferable, and examples thereof include a methyl group, an ethyl group, a propyl group, an n-butyl group, a sec-butyl group, a hexyl group, and an octyl group.

A cycloalkyl group as each of $R_{36}$ to $R_{39}$, $R_{01}$, and $R_{02}$ may be a monocyclic cycloalkyl group or a polycyclic cycloalkyl group. As the monocyclic cycloalkyl group, a cycloalkyl group having 3 to 8 carbon atoms is preferable, and examples thereof include a cyclopropyl group, a cyclobutyl group, a cyclopentyl group, a cyclohexyl group, and a cyclooctyl group. As the polycyclic cycloalkyl group, a cycloalkyl group having 6 to 20 carbon atoms is preferable, and examples thereof include an adamantyl group, a norbornyl group, an isobornyl group, a camphonyl group, a dicyclopentyl group, an α-pinene group, a tricyclodecanyl group, a tetracyclododecyl group, and an androstanyl group. Further, at least one carbon atom in the cycloalkyl group may be substituted with heteroatoms such as an oxygen atom.

An aryl group as each of $R_{36}$ to $R_{39}$, $R_{01}$, and $R_{02}$ is preferably an aryl group having 6 to 10 carbon atoms, and examples thereof include a phenyl group, a naphthyl group, and an anthryl group.

An aralkyl group as each of $R_{36}$ to $R_{39}$, $R_{01}$, and $R_{02}$ is preferably an aralkyl group having 7 to 12 carbon atoms, and examples thereof include a benzyl group, a phenethyl group, and a naphthylmethyl group.

An alkenyl group as each of $R_{36}$ to $R_{39}$, $R_{01}$, and $R_{02}$ is preferably an alkenyl group having 2 to 8 carbon atoms, and examples thereof include a vinyl group, an allyl group, a butenyl group, and a cyclohexenyl group.

A ring formed by the bonding of $R_{36}$ and $R_{37}$ is preferably a (monocyclic or polycyclic) cycloalkyl group. As the cycloalkyl group, monocyclic cycloalkyl groups such as a cyclopentyl group and a cyclohexyl group, and polycyclic cycloalkyl groups such as a norbornyl group, a tetracyclodecanyl group, a tetracyclododecanyl group, and an adamantyl group are preferable.

The acid-decomposable group is preferably a cumyl ester group, an enol ester group, an acetal group, an acetal ester group, a tertiary alkyl ester group, or the like, and more preferably an acetal ester group or a tertiary alkyl ester group.

The resin (A) preferably has a repeating unit represented by General Formula (AI) as the repeating unit having an acid-decomposable group.

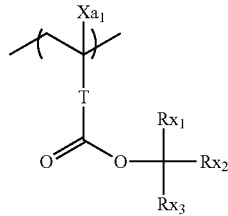

(AI)

In General Formula (AI), $Xa_1$ represents a hydrogen atom, halogen atom, or a monovalent organic group.

T represents a single bond or a divalent linking group.

$Rx_1$ to $Rx_3$ each independently represent an alkyl group or a cycloalkyl group.

Any two of $Rx_1$ to $Rx_3$ may or may not be bonded to each other to form a ring structure.

Examples of the divalent linking group of T include an alkylene group, an arylene group, —COO-Rt—, and —O-Rt—. In the formulae, Rt represents an alkylene group, a cycloalkylene group, or an arylene group. Further, —COO— has the same definition as —CO—O—.

T is preferably a single bond or —COO-Rt—. Rt is preferably an alkylene group having 1 to 5 carbon atoms, and more preferably a —CH$_2$— group, a —(CH$_2$)$_2$— group, or a —(CH$_2$)$_3$— group. T is more preferably a single bond.

$Xa_1$ is preferably a hydrogen atom or an alkyl group.

The alkyl group of $Xa_1$ may have a substituent, and examples of the substituent include a hydroxyl group and a halogen atom (preferably a fluorine atom).

The alkyl group of $Xa_1$ preferably has 1 to 4 carbon atoms, and examples thereof include a methyl group, an ethyl group, a propyl group, a hydroxymethyl group, and a trifluoromethyl group. The alkyl group of $Xa_1$ is preferably a methyl group.

The alkyl group of each of $Rx_1$, $Rx_2$, and $Rx_3$ may be linear or branched, and is preferably a methyl group, an ethyl group, an n-propyl group, an isopropyl group, an n-butyl group, an isobutyl group, a t-butyl group, or the like is preferable. The number of the carbon atoms of the alkyl group is preferably 1 to 10, more preferably 1 to 5, and still more preferably 1 to 3. The alkyl group of each of $Rx_1$, $Rx_2$, and $Rx_3$ may have some of carbon-carbon bonds that are double-bonded.

The cycloalkyl group of each of $Rx_1$, $Rx_2$, and $Rx_3$ is preferably a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group.

As the ring structure formed by the bonding of two of $Rx_1$, $Rx_2$, and $Rx_3$, a monocyclic cycloalkane ring such as a cyclopentyl ring, a cyclohexyl ring, a cycloheptyl ring, and a cyclooctane ring, and a polycyclic cycloalkyl group such as a norbornane ring, a tetracyclodecane ring, a tetracyclododecane ring, and an adamantane ring are preferable. Among those, the cyclopentyl ring, the cyclohexyl ring, or the adamantane ring is more preferable. As the ring structure formed by the bonding of two of $Rx_1$, $Rx_2$, and $Rx_3$, a structure set forth below is also preferable.

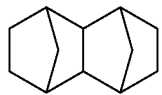

Specific examples of a monomer corresponding to the repeating unit represented by General Formula (AI) are set forth below, but the present invention is not limited to these specific examples. The following specific examples correspond to a case where $Xa_1$ in General Formula (AI) is a methyl group, but $Xa_1$ can be optionally substituted with a hydrogen atom, a halogen atom, or a monovalent organic group.

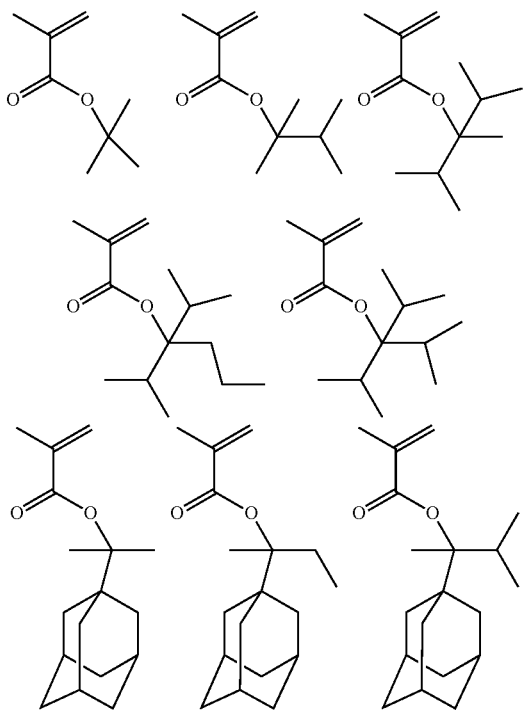

-continued

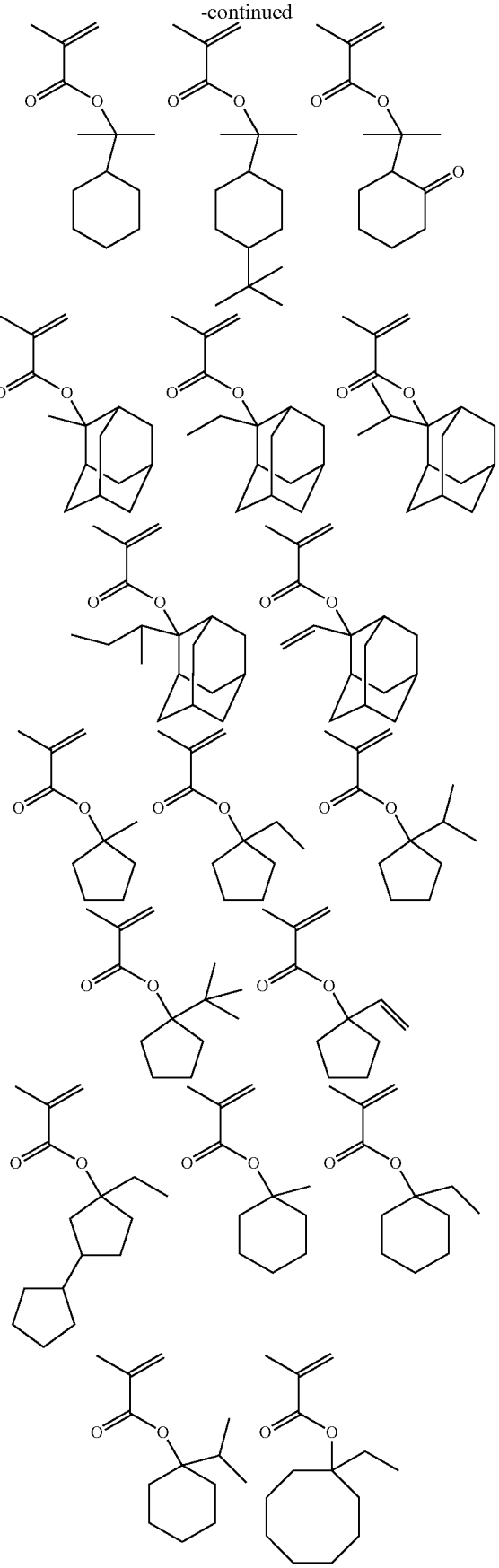

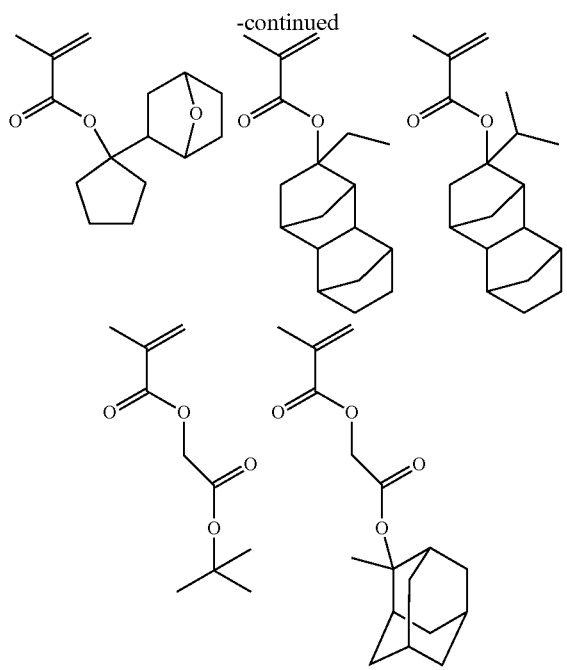

Moreover, the resin (A) may have a repeating unit represented by General Formula (AII) or (AIII) as the repeating unit having an acid-decomposable group.

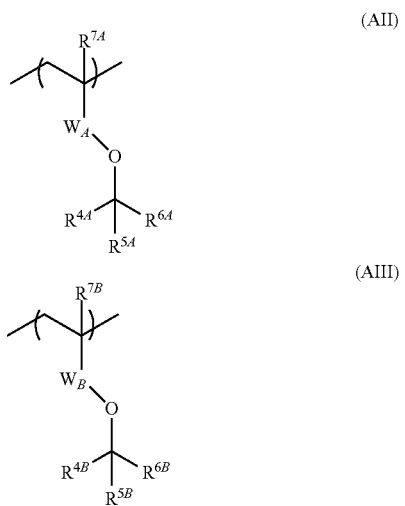

In General Formula (AII), $R^{4A}$, $R^{5A}$, and $R^{6A}$ each independently represent a monovalent organic group. $W_A$ represents —CO— or a divalent aromatic ring group. $R^{7A}$ represents a hydrogen atom, a methyl group, or a trifluoromethyl group. $R^{5A}$ and $R^{6A}$ may be bonded to each other to form a ring.

In General Formula (AIII), $R^{4B}$, $R^{5B}$, and $R^{6B}$ each independently represent a hydrogen atom or a monovalent organic group. $R^{5B}$ and $R^{6B}$ may be bonded to each other to form a ring. $W_B$ represents —CO— or a divalent aromatic ring group. $R^{7B}$ represents a hydrogen atom, a methyl group, or a trifluoromethyl group.

The monovalent organic group as each of $R^{4A}$, $R^{5A}$, $R^{6A}$, $R^{4B}$, $R^{5B}$, and $R^{6B}$ preferably has 1 to 30 carbon atoms, more preferably has 1 to 20 carbon atoms, and still more preferably has 1 to 10 carbon atoms. Examples of the monovalent organic group as each of $R^{4A}$, $R^{5A}$, $R^{6A}$, $R^{4B}$, $R^{5B}$, and $R^{6B}$ include an alkyl group, a cycloalkyl group, an aryl group, an aralkyl group, an alkenyl group, an alkylcarbonyl group, a cycloalkylcarbonyl group, and an alkyloxycarbonyl group. These groups may further have a substituent.

The substituent may be any one of a halogen atom, an alkyl group (which may be linear or branched, and preferably has 1 to 12 carbon atoms), a cycloalkyl group (which may be any one of a monocycle, a polycycle, or a spiro ring, and preferably has 3 to 20 carbon atoms), an aryl group (preferably having 6 to 14 carbon atoms), a group, a carbonyl group, an ether group, a cyano group, an alkoxy group, an ester group, an amido group, a urethane group, a ureido group, a thioether group, a sulfonamido group, a sulfonic acid ester group, and a group formed by combination of two or more selected from these atoms and groups.

Examples of the divalent aromatic ring group as each of $W_A$ and $W_B$ include a phenylene group, a naphthylene group, and an anthranylene group, and among these, the phenylene group is preferable.

Incidentally, the divalent aromatic ring group may further have a substituent. Examples of the substituent include the same ones as the substituents that may be contained in the monovalent organic group represented by each of $R^{4A}$, $R^{5A}$, $R^{6A}$, $R^{4B}$, $R^{5B}$, and $R^{6B}$.

Examples of the repeating unit represented by General Formula (AII) and the repeating unit represented by General Formula (AIII) include the repeating units mentioned as specific examples of the repeating unit represented by General Formula (AI), and the repeating units set forth below.

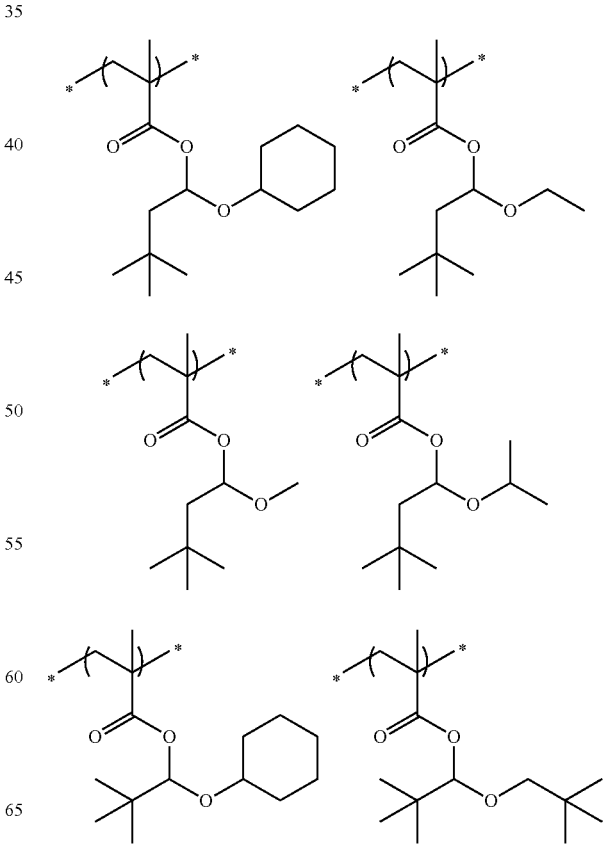

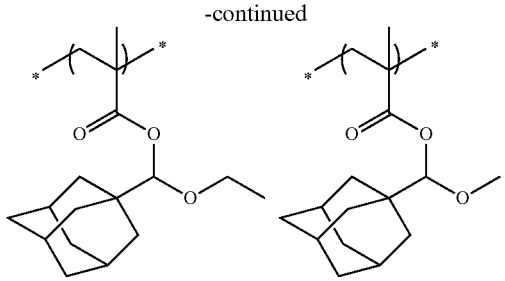
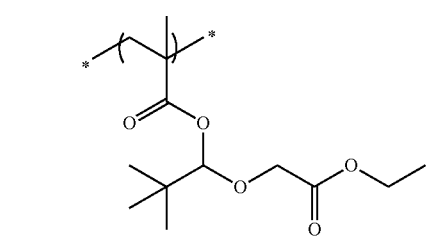
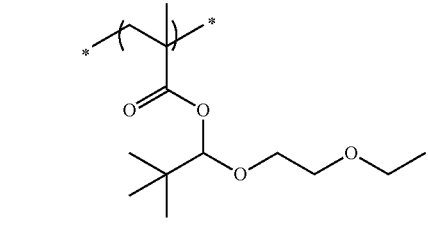
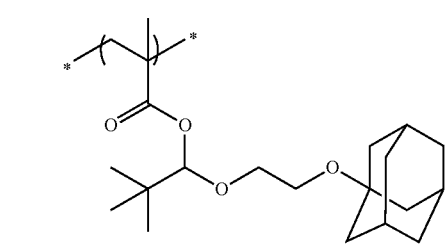
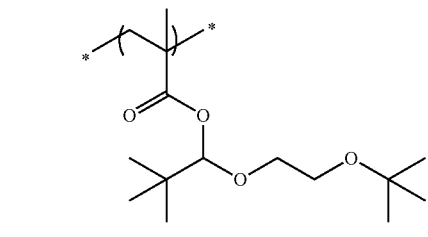
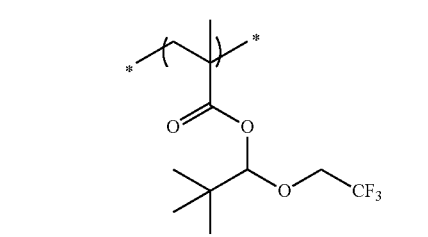
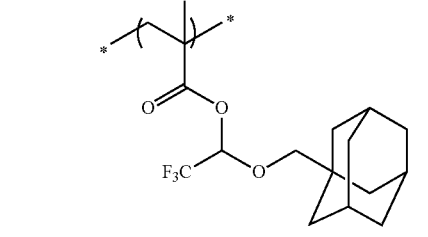
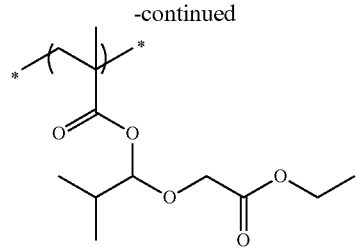
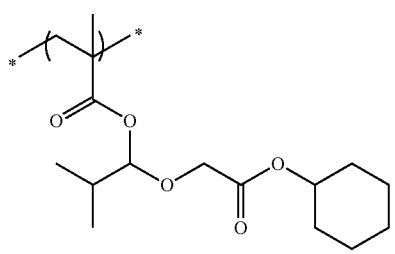
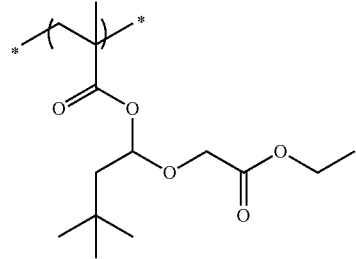
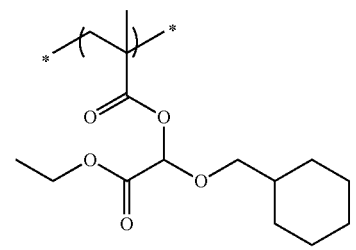
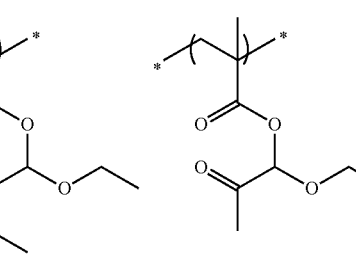
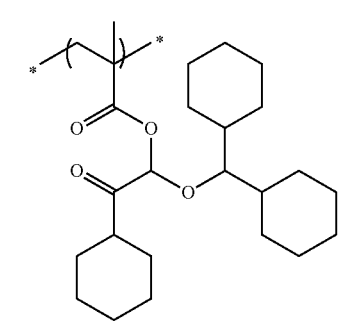

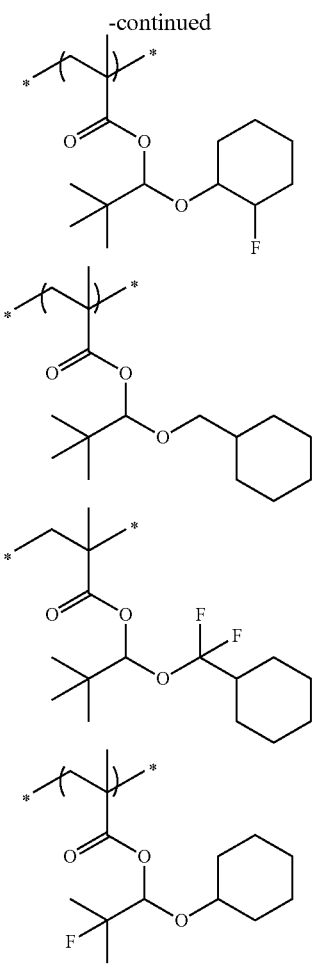

It is also preferable that the resin (A) has the repeating unit described in paragraphs <0336> to <0369> of US2016/0070167A1 as the repeating unit having an acid-decomposable group.

In addition, the resin (A) may have a repeating unit including a group capable of decomposing by the action of an acid to generate an alcoholic hydroxyl group described in paragraphs <0363> and <0364> of US2016/0070167A1 as the repeating unit having an acid-decomposable group.

The resin (A) may include only one kind or two or more kinds of repeating units having an acid-decomposable group in combination.

The content of the repeating units having an acid-decomposable group included in the resin (A) (a total of the contents in a case where the repeating units having an acid-decomposable group are present in plural number) is preferably 10% to 90% by mole, more preferably 20% to 80% by mole, and still more preferably 30% to 70% by mole, with respect to all the repeating units in the resin (A).

The resin (A) preferably has a repeating unit having at least one selected from the group consisting of a lactone structure, a sultone structure, and a carbonate structure.

As the lactone structure or sultone structure, any structure may be used as long as it has a lactone structure or sultone structure, but the structure is preferably a 5- to 7-membered ring lactone structure or a 5- to 7-membered ring sultone structure. Among those, the structure is more preferably a 5- to 7-membered ring lactone structure to which another ring structure is fused in the form of forming a bicyclo structure or a spiro structure or a 5- to 7-membered ring sultone structure to which another ring structure is fused in the form of forming a bicyclo structure or a spiro structure.

The resin (A) still more preferably has a repeating unit having a lactone structure represented by any one of General Formulae (LC1-1) to (LC1-21) or a sultone structure represented by any one of General Formulae (SL1-1) to (SL1-3). Further, the lactone structure or sultone structure may be bonded directly to the main chain. Preferred examples of the structure include a lactone structure represented by General Formula (LC1-1), General Formula (LC1-4), General Formula (LC1-5), General Formula (LC1-8), General Formula (LC1-16), or General Formula (LC1-21), or a sultone structure represented by General Formula (SL1-1).

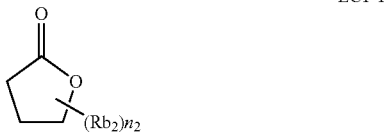

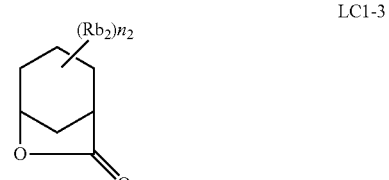

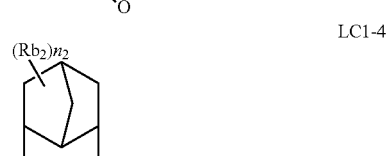

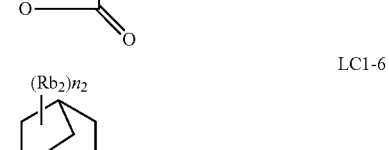

-continued
LC1-8
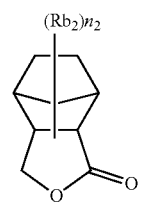
LC1-9
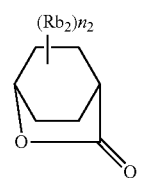
LC1-10
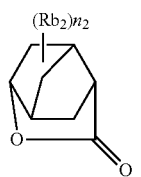
LC1-11
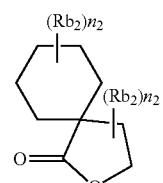
LC1-12
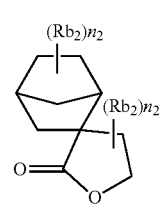
LC1-13
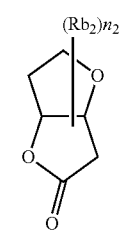
LC1-14
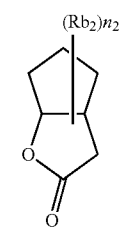
LC1-15
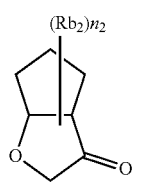
-continued
LC1-16
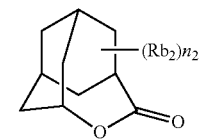
LC1-17
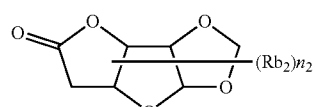
LC1-18
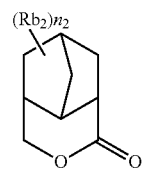
LC1-19
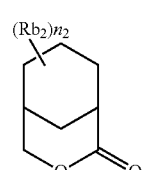
LC1-20
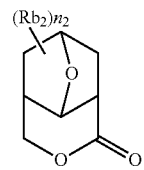
LC1-21
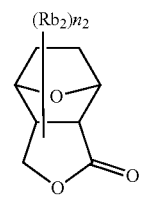
SL1-1
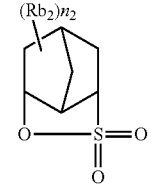
SL1-2
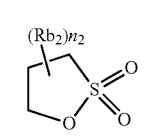
SL1-3
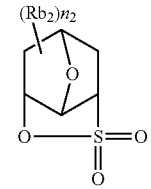

The lactone structural moiety or the sultone structural moiety may or may not have a substituent ($Rb_2$). Preferred examples of the substituent ($Rb_2$) include an alkyl group having 1 to 8 carbon atoms, a cycloalkyl group having 4 to 7 carbon atoms, an alkoxy group having 1 to 8 carbon atoms, an alkoxycarbonyl group having 2 to 8 carbon atoms, a carboxyl group, a halogen atom, a hydroxyl group, a cyano group, and an acid-decomposable group, and an alkyl group having 1 to 4 carbon atoms, a cyano group, or an acid-decomposable group is preferable. $n_2$ represents an integer of 0 to 4. In a case where $n_2$ is 2 or more, the substituents ($Rb_2$) which are present in plural number may be the same as or different from each other. Further, the substituents ($Rb_2$) which are present in plural number may be bonded to each other to form a ring.

As the repeating unit having a lactone structure or sultone structure, a repeating unit represented by General Formula (III) is preferable.

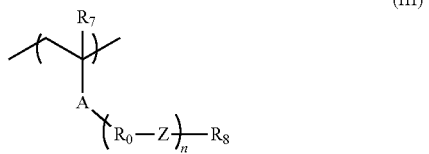

(III)

In General Formula (III),

A represents an ester bond (a group represented by —COO—) or an amide bond (a group represented by —CONH—).

n is the repetition number of the structure represented by —$R_0$—Z—, represents an integer of 0 to 5, and is preferably 0 or 1, and more preferably 0. In a case where n is 0, —$R_0$—Z— is not present, and is thus a single bond.

$R_0$ represents an alkylene group, a cycloalkylene group, or a combination thereof. In a case where $R_0$'s are present in plural number, they each independently represent an alkylene group, a cycloalkylene group, or a combination thereof.

Z represents a single bond, an ether bond, an ester bond, an amide bond, a urethane bond, or a urea bond. In a case where Z's are present in plural number, they each independently represent a single bond, an ether bond, an ester bond, an amide bond, or a urethane bond.

$R_8$ represents a monovalent organic group having a lactone structure or sultone structure.

$R_7$ represents a hydrogen atom, a halogen atom, or a monovalent organic group (preferably a methyl group).

The alkylene group or the cycloalkylene group of $R_0$ may have a substituent.

Z is preferably an ether bond or an ester bond, and more preferably an ester bond.

The resin (A) may have a repeating unit having a carbonate structure. The carbonate structure is preferably a cyclic carbonate ester structure.

The repeating unit having a cyclic carbonate ester structure is preferably a repeating unit represented by General Formula (A-1).

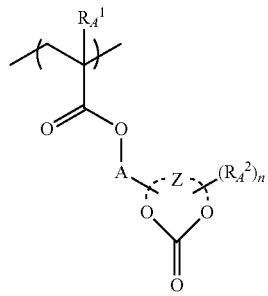

(A-1)

In General Formula (A-1), $R_A^1$ represents a hydrogen atom, a halogen atom, or a monovalent organic group (preferably a methyl group).

n represents an integer of 0 or more.

$R_A^2$ represents a substituent. In a case where n is 2 or more, $R_A^2$'s each independently represent a substituent.

A represents a single bond or a divalent linking group.

Z represents an atomic group which forms a monocyclic or polycyclic structure together with a group represented by —O—C(=O)—O— in the formula.

It is also preferable that the resin (A) has the repeating unit described in paragraphs <0370> to <0414> of US2016/0070167A1 as the repeating unit having at least one selected from the group consisting of a lactone structure, a sultone structure, and a carbonate structure.

The resin (A) may have only one kind or two or more kinds of repeating units having at least one selected from the group consisting of a lactone structure, a sultone structure, and a carbonate structure.

Specific examples of a monomer corresponding to the repeating unit represented by General Formula (III) and a monomer corresponding to the repeating unit represented by General Formula (A-1) are set forth below, but the present invention is not limited to these specific examples. The following specific examples correspond to a case where $R_7$ in General Formula (III) and $R_A^1$ in General Formula (A-1) are each a methyl group, but $R_7$ and $R_A^1$ may be optionally substituted with a hydrogen atom, a halogen atom, or a monovalent organic group.

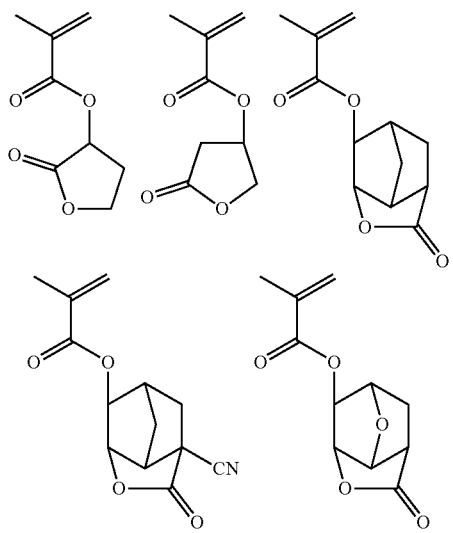

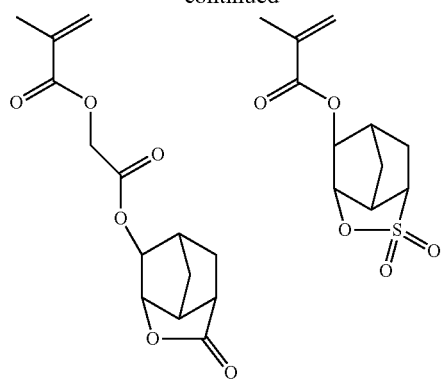
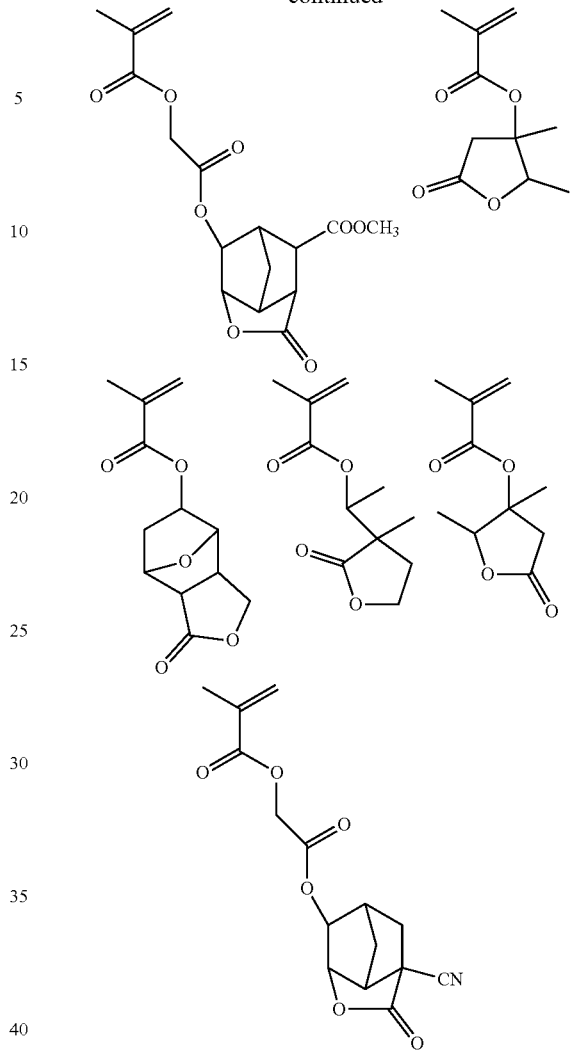

In addition to the monomers, monomers set forth below are also suitably used as a raw material of the resin (A).

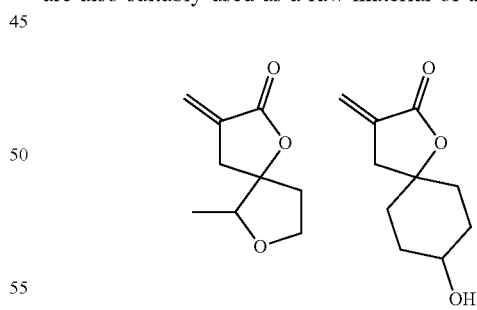

The content of the repeating unit having at least one selected from the group consisting of a lactone structure, a sultone structure, and a carbonate structure included in the resin (A) (a total of the contents in a case where the repeating units having at least one selected from the group consisting of a lactone structure, a sultone structure, and a carbonate structure are present in plural number) is preferably 5% to 70% by mole, more preferably 10% to 65% by mole, and still more preferably 20% to 60% by mole, with respect to all the repeating units in the resin (A).

The resin (A) preferably has a repeating unit having a polar group.

Examples of the polar group include a hydroxyl group, a cyano group, a carboxy group, and a fluorinated alcohol group.

As the repeating unit having a polar group, a repeating unit having an alicyclic hydrocarbon structure substituted with a polar group is preferable. Further, it is preferable that the repeating unit having a polar group does not have an acid-decomposable group. As the alicyclic hydrocarbon structure in the alicyclic hydrocarbon structure substituted with a polar group, an adamantyl group or a norbornane group is preferable.

Specific examples of a monomer corresponding to the repeating unit having a polar group are set forth below, but the present invention is not limited to these specific examples.

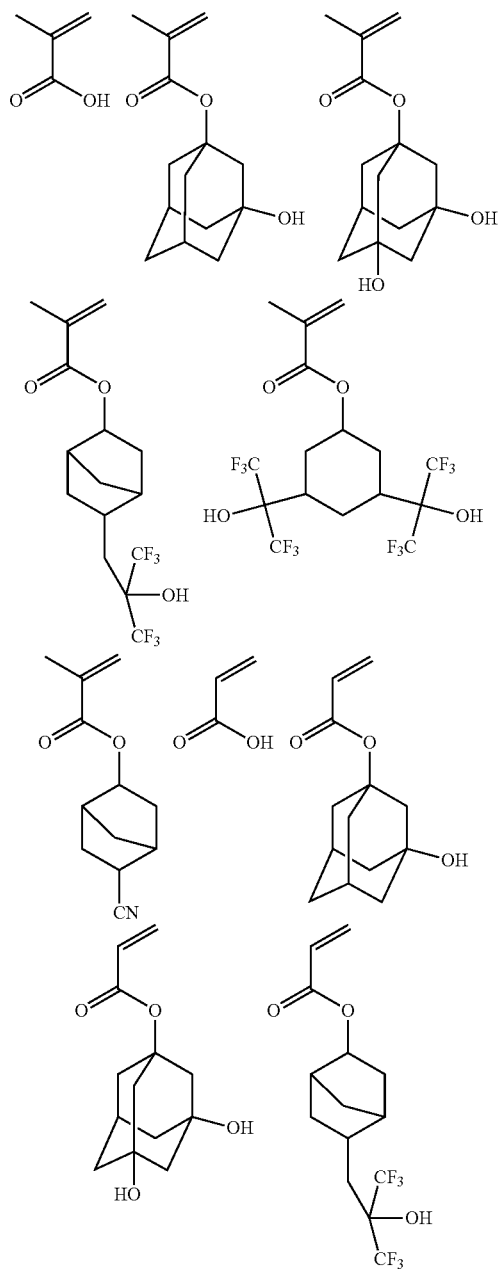

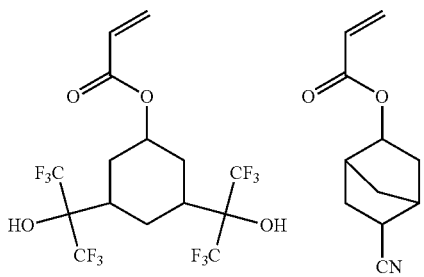

In addition to these, specific examples of the repeating unit having a polar group include the repeating units disclosed in paragraphs <0415> to <0433> of US2016/0070167A1.

The resin (A) may have only one kind or two or more kinds of repeating units having a polar group in combination.

The content of the repeating unit having a polar group is preferably 5% to 40% by mole, more preferably 5% to 30% by mole, and still more preferably 10% to 25% by mole, with respect to all the repeating units in the resin (A).

The resin (A) may further have a repeating unit having neither an acid-decomposable group nor a polar group. The repeating unit having neither an acid-decomposable group nor a polar group preferably has an alicyclic hydrocarbon structure. Examples of the repeating unit having neither an acid-decomposable group nor a polar group include the repeating units described in paragraphs <0236> and <0237> of US2016/0026083A1. Preferred examples of a monomer corresponding to the repeating unit having neither an acid-decomposable group nor a polar group are set forth below.

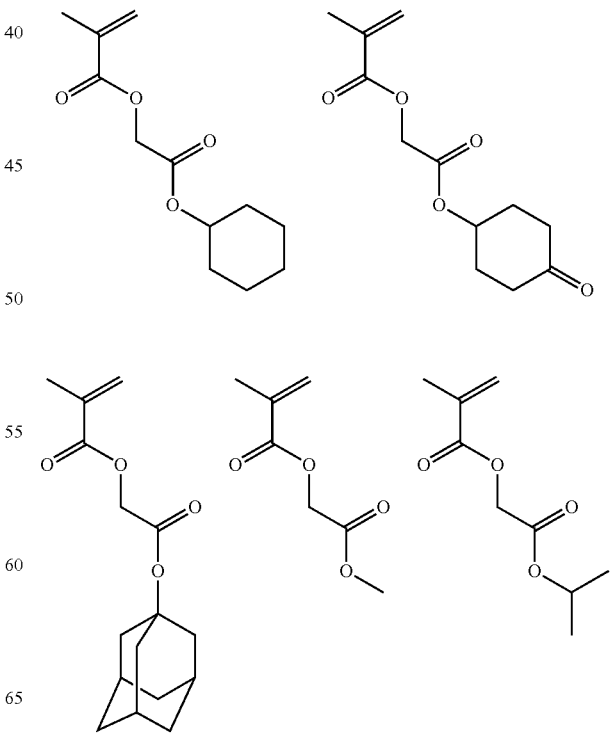

-continued

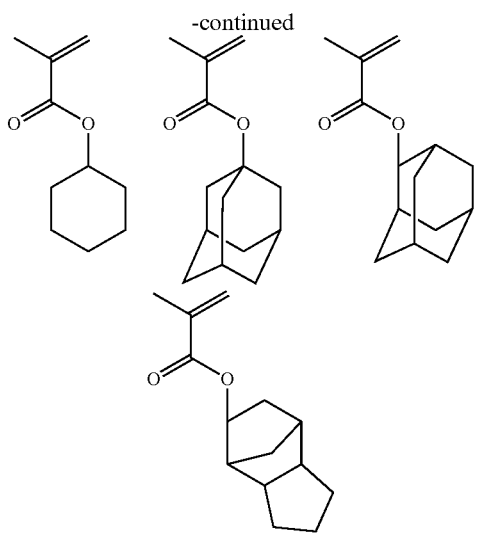

In addition to these, specific examples of the repeating unit having neither an acid-decomposable group nor a polar group include the repeating units disclosed in paragraph <0433> of US2016/0070167A1.

The resin (A) may have only one kind or two or more kinds of repeating units having neither an acid-decomposable group nor a polar group in combination.

The content of the repeating unit having neither an acid-decomposable group nor a polar group is preferably 5% to 40% by mole, more preferably 5% to 30% by mole, and still more preferably 5% to 25% by mole, with respect to all the repeating units in the resin (A).

The resin (A) may include a variety of repeating structural units, in addition to the repeating structural units, for the purpose of controlling dry etching resistance, suitability for a standard developer, adhesiveness to a substrate, and a resist profile, resolving power, heat resistance, sensitivity, and the like which are general characteristics required for a resist.

Examples of such a repeating structural unit include, but are not limited to, repeating structural units corresponding to a predetermined monomer.

Examples of such a predetermined monomer include a compound having one addition-polymerizable unsaturated bond, which is selected from acrylic acid esters, methacrylic acid esters, acrylamides, methacrylamides, allyl compounds, vinyl ethers, vinyl esters, and the like.

In addition to these, an addition-polymerizable unsaturated compound that is copolymerizable with the monomers corresponding to various repeating structural units as described above may be copolymerized.

In the resin (A), the molar ratio of each repeating structural unit contained is appropriately set in order to control various types of performance.

In a case where the composition of the embodiment of the present invention is for ArF exposure, it is preferable that the resin (A) does not substantially have an aromatic group in terms of transparency to ArF light. More specifically, the proportion of repeating units having an aromatic group in all the repeating units of the resin (A) is preferably 5% by mole or less, and more preferably 3% by mole or less, and ideally 0% by mole of all the repeating units, that is, it is even more preferable that the resin (A) does not have a repeating unit having an aromatic group. Further, it is preferable that the resin (A) has a monocyclic or polycyclic alicyclic hydrocarbon structure.

The resin (A) is preferably a resin in which all the repeating units are constituted with (meth)acrylate-based repeating units. In this case, any of a resin in which all of the repeating units are methacrylate-based repeating units, a resin in which all of the repeating units are acrylate-based repeating units, and a resin in which all of the repeating units are methacrylate-based repeating units and acrylate-based repeating units can be used, but it is preferable that the acrylate-based repeating units account for 50% by mole or less of all the repeating units of the resin (A).

In a case where the composition of the embodiment of the present invention is for KrF exposure, EB exposure, or EUV exposure, it is preferable that the resin (A) has a repeating unit having an aromatic hydrocarbon ring group. It is more preferable that the resin (A) has a repeating unit including a phenolic hydroxyl group. Examples of the repeating unit including containing a phenolic hydroxyl group include a hydroxystyrene repeating unit and a hydroxystyrene (meth)acrylate repeating unit.

In a case where the composition of the embodiment of the present invention is for KrF exposure, EB exposure, or EUV exposure, it is preferable that the resin (A) has a structure protected with a group in which a hydrogen atom of the phenolic hydroxyl group decomposes by the action of an acid to leave (leaving group).

The content of the repeating unit having the aromatic hydrocarbon ring group included in the resin (A) is preferably 30% to 100% by mole, more preferably 40% to 100% by mole, and still more preferably 50% to 100% by mole, with respect to all the repeating units in the resin (A).

The weight-average molecular weight of the resin (A) is preferably 1,000 to 200,000, more preferably 2,000 to 20,000, still more preferably 3,000 to 15,000, and particularly preferably 3,000 to 11,000. The dispersity (Mw/Mn) is usually 1.0 to 3.0, preferably 1.0 to 2.6, more preferably 1.0 to 2.0, and still particularly preferably 1.1 to 2.0.

The resin (A) may be used singly or in combination of two or more kinds thereof.

The content of the resin (A) in the composition of the embodiment of the present invention is generally 20% by mass or more with respect to the total solid content in many cases, and is preferably 40% by mass or more, more preferably 60% by mass or more, still more preferably 75% by mass or more, and even still more preferably 80% by mass or more. The upper limit is not particularly limited, but is preferably 99.5% by mass or less, more preferably 99% by mass or less, and still more preferably 97% by mass or less.

<Resin (B)>

In a case where the composition of the embodiment of the present invention includes a crosslinking agent (G) which will be described later, it is preferable that the composition of the embodiment of the present invention includes an alkali-soluble resin (B) having a phenolic hydroxyl group (hereinafter also referred to as a "resin (B)"). The resin (B) preferably has a repeating unit having a phenolic hydroxyl group.

In this case, typically, the negative-tone pattern is suitably formed.

The crosslinking agent (G) may be in a form that is carried in the resin (B).

The resin (B) may have the above-mentioned acid-decomposable group.

As the repeating unit having a phenolic hydroxyl group contained in the resin (B), a repeating unit represented by General Formula (II) is preferable.

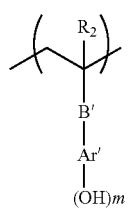

In General Formula (II), $R_2$ represents a hydrogen atom, an alkyl group (preferably a methyl group), or a halogen atom (preferably a fluorine atom).

B' represents a single bond or a divalent linking group.

Ar' represents an aromatic ring group.

m represents an integer of 1 or more.

The resin (B) may be used singly or in combination of two or more kinds thereof.

The content of the resin (B) in the total solid content of the composition of the embodiment of the present invention is generally 30% by mass or more in many cases, and is preferably 40% by mass or more, and more preferably 50% by mass or more. The upper limit is not particularly limited, but is preferably 99% by mass or less, more preferably 90% by mass or less, and still more preferably 85% by mass or less.

Suitable examples of the resin (B) include the resins disclosed in paragraphs <0142> to <0347> of US2016/0282720A1.

The composition of the embodiment of the present invention may include both of the resin (A) and the resin (B).

<Acid Generator (C)>

The composition of the embodiment of the present invention includes two or more kinds of acid generators (hereinafter also referred to as "acid generators (C)"). Further, the acid generator is a compound capable of generating an acid upon irradiation with actinic rays or radiation. The type of the acid generator is not particularly limited as long as it satisfies the condition 1 and the condition 2.

In a case where the composition of the embodiment of the present invention contains two or more kinds of acid generators, the acid generator having a relatively smaller pKa of an acid generated corresponds to the acid generator A and the acid generator having a relatively larger pKa of an acid generated corresponds to the acid generator B.

In a case where the composition of the embodiment of the present invention contains three or more kinds of acid generators, it is only necessary that at least one k'0/k0 satisfies a predetermined range in a combination of an acid having a relatively smaller pKa and an acid having a relatively larger pKa among the acids generated. It is preferable that among those, the acid having the smallest pKa among the acids generated corresponds to the acid generator A and the acid having the largest pKa among the acids generated correspond to the acid generator B.

As the acid generator, for example, a compound capable of generating an organic acid upon irradiation with actinic rays or radiation is preferable. Examples thereof include a sulfonium salt compound, an iodonium salt compound, a diazonium salt compound, a phosphonium salt compound, an imidesulfonate compound, an oximesulfonate compound, a diazodisulfone compound, a disulfone compound, and an o-nitrobenzylsulfonate compound.

As the acid generator, known compounds capable of generating an acid upon irradiation with actinic rays or radiation can be appropriately selected and used singly or as a mixture thereof. For example, the known compounds disclosed in paragraphs <0125> to <0319> of US2016/0070167A1, paragraphs <0086> to <0094> of US2015/0004544A1, and paragraphs <0323> to <0402> of US2016/0237190A1 can be suitably used as the acid generator (C).

As the acid generator (C), for example, a compound represented by General Formula (ZI), General Formula (ZII), or General Formula (ZIII) is preferable and the compound represented by General Formula (ZI) is more preferable.

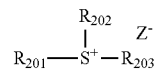

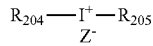

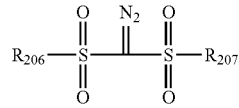

In General Formula (ZI), $R_{201}$, $R_{202}$, and $R_{203}$ each independently represent an organic group.

The number of carbon atoms of the organic group as $R_{201}$, $R_{202}$, and $R_{203}$ is generally 1 to 30, and preferably 1 to 20.

In addition, two of $R_{201}$ to $R_{203}$ may be bonded to each other to form a ring structure, and the ring may include an oxygen atom, a sulfur atom, an ester bond, an amide bond, or a carbonyl group. Examples of the group formed by the bonding of two of $R_{201}$ to $R_{203}$ include an alkylene group (for example, a butylene group and a pentylene group) and —$CH_2$—$CH_2$—O—$CH_2$—$CH_2$—.

$Z^-$ represents an anion.

Examples of the compound represented by General Formula (ZI) include groups a compound (ZI-1), a compound (ZI-2), a compound (ZI-3), and a compound (ZI-4) which will be described later, and among these, the compound (ZI-3) which will be described later is preferable.

Incidentally, the acid generator (C) may also be a compound having a plurality of the structures represented by General Formula (ZI). For example, it may be a compound having a structure in which at least one of $R_{201}$, . . . , or $R_{203}$ in the compound represented by General Formula (ZI) is bonded to at least one of $R_{201}$, . . . , or $R_{203}$ of another compound represented by General Formula (ZI) through a single bond or a linking group.

First, the compound (ZI-1) will be described.

The compound (ZI-1) is an arylsulfonium compound in which at least one of $R_{201}$, . . . , or $R_{203}$ in General Formula (ZI) is an aryl group, a that is, a compound having arylsulfonium as a cation.

In the arylsulfonium compound, all of $R_{201}$ to $R_{203}$ may be aryl groups, or some of $R_{201}$ to $R_{203}$ may be aryl groups and the remainders may be alkyl groups or cycloalkyl groups.

Examples of the arylsulfonium compound include a triarylsulfonium compound, a diarylalkyl sulfonium compound, an aryldialkylsulfonium compound, a diarylcycloalkyl sulfonium compound, and an aryldicycloalkyl sulfonium compound.

The aryl group in the arylsulfonium compound is preferably a phenyl group or a naphthyl group, and more preferably a phenyl group. The aryl group may be an aryl group having a heterocyclic structure having an oxygen atom, a nitrogen atom, a sulfur atom, or the like. Examples of the heterocyclic structure include a pyrrole ring, a furan ring, a thiophene ring, an indole ring, a benzofuran ring, and a benzothiophene ring. In a case where the arylsulfonium compound has two or more aryl groups, these two or more aryl groups may be the same as or different from each other.

The alkyl group or the cycloalkyl group which may be contained, as desired, in the arylsulfonium compound, is preferably a linear alkyl group having 1 to 15 carbon atoms, a branched alkyl group having 3 to 15 carbon atoms, or a cycloalkyl group having 3 to 15 carbon atoms, for example, a methyl group, an ethyl group, a propyl group, an n-butyl group, a sec-butyl group, a t-butyl group, a cyclopropyl group, a cyclobutyl group, and a cyclohexyl group.

The aryl group, a the alkyl group, and the cycloalkyl group of each of $R_{201}$ to $R_{203}$ may have an alkyl group (for example, an alkyl group having 1 to 15 carbon atoms), a cycloalkyl group (for example, a cycloalkyl group having 3 to 15 carbon atoms), an aryl group (for example, an aryl group having 6 to 14 carbon atoms), an alkoxy group (for example, an alkoxy group having 1 to 15 carbon atoms), a halogen atom, a hydroxyl group, or a phenylthio group as a substituent.

Next, the compound (ZI-2) will be described.

The compound (ZI-2) is a compound in which $R_{201}$ to $R_{203}$ in Formula (ZI) each independently represent an organic group not having an aromatic ring. Here, the aromatic ring also encompasses an aromatic ring containing a heteroatom.

The organic group, as each of $R_{201}$ to $R_{203}$, containing no aromatic ring has generally 1 to 30 carbon atoms, and preferably 1 to 20 carbon atoms.

$R_{201}$ to $R_{203}$ are each independently preferably an alkyl group, a cycloalkyl group, an allyl group, or a vinyl group, more preferably a linear or branched 2-oxoalkyl group, a 2-oxocycloalkyl group, or an alkoxycarbonylmethyl group, and still more preferably a linear or branched 2-oxoalkyl group.

As the alkyl group and the cycloalkyl group of each of $R_{201}$ to $R_{203}$, a linear alkyl group having 1 to 10 carbon atoms or a branched alkyl group having 3 to 10 carbon atoms (for example, a methyl group, an ethyl group, a propyl group, a butyl group, and a pentyl group), or a cycloalkyl group having 3 to 10 carbon atoms (a cyclopentyl group, a cyclohexyl group, and a norbornyl group) is preferable.

$R_{201}$ to $R_{203}$ may further be substituted with a halogen atom, an alkoxy group (for example, an alkoxy group having 1 to 5 carbon atoms), a hydroxyl group, a cyano group, or a nitro group.

Next, the compound (ZI-3) will be described.

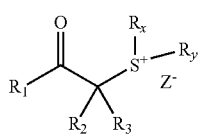

(ZI-3)

In General Formula (ZI-3), $R_1$ represents an alkyl group, a cycloalkyl group, an alkoxy group, a cycloalkoxy group, an aryl group, or an alkenyl group. $R_2$ and $R_3$ each independently represent a hydrogen atom, an alkyl group, a cycloalkyl group, a halogen atom, a cyano group, or an aryl group. $R_x$ and $R_y$ each independently represent an alkyl group, a cycloalkyl group, an alkenyl group, an aryl group, a 2-oxoalkyl group, a 2-oxocycloalkyl group, an alkoxycarbonylalkyl group, an alkoxycarbonylcycloalkyl group, an allyl group, or a vinyl group.

In addition, $R_2$ and $R_3$ may be linked to each other to form a ring, and $R_1$ and $R_2$ may be linked to each other to form a ring. Further, $R_x$ and $R_y$ may be linked to each other to form a ring, and a ring structure formed by mutual linking of $R_x$ and $R_y$ may include an oxygen atom, a nitrogen atom, a sulfur atom, a ketone group, an ether bond, an ester bond, or an amide bond.

$Z^-$ represents an anion.

In General Formula (ZI-3), as each of the alkyl group and the cycloalkyl group represented by $R_1$, a linear alkyl group having 1 to 15 carbon atoms (preferably having 1 to 10 carbon atoms), a branched alkyl group having 3 to 15 carbon atoms (preferably having 3 to 10 carbon atoms), or a cycloalkyl group having 3 to 15 carbon atoms (preferably having 1 to 10 carbon atoms) is preferable, and specific examples of the alkyl group and the cycloalkyl group include a methyl group, an ethyl group, a propyl group, an n-butyl group, a sec-butyl group, a t-butyl group, a cyclopropyl group, a cyclobutyl group, a cyclohexyl group, and a norbornyl group.

As each of the alkoxy group and the cycloalkoxy group represented by $R_1$, a linear alkoxy group having 1 to 15 carbon atoms (preferably having 1 to 10 carbon atoms), a branched alkoxy group having 3 to 15 carbon atoms (preferably having 3 to 10 carbon atoms), or a cycloalkoxy group having 3 to 15 carbon atoms (preferably having 1 to 10 carbon atoms) is preferable, and specific examples of the alkoxy group and the cycloalkoxy group include a methoxy group, an ethoxy group, and a propoxy group.

As the aryl group represented by $R_1$, a phenyl group or a naphthyl group is preferable, and the phenyl group is more preferable. The aryl group may be an aryl group having a heterocyclic structure having an oxygen atom, a nitrogen atom, a sulfur atom, or the like. Examples of the heterocyclic structure include a pyrrole ring, a furan ring, a thiophene ring, an indole ring, a benzofuran ring, and a benzothiophene ring.

As the alkenyl group represented by $R_1$, a linear alkenyl group having 2 to 15 carbon atoms (preferably having 2 to 10 carbon atoms), or a branched alkenyl group having 3 to 15 carbon atoms (preferably having 3 to 10 carbon atoms) is preferable.

Examples of the alkyl group, the cycloalkyl group, and the aryl group represented by each of $R_2$ and $R_3$ include the same ones as those of $R_1$ as mentioned above and preferred aspects thereof are also the same.

Examples of the halogen atom represented by each of $R_2$ and $R_3$ include a fluorine atom, a chlorine atom, a bromine atom, and an iodine atom.

Examples of the alkyl group, the cycloalkyl group, the alkenyl group, and the aryl group represented by each of $R_x$ and $R_y$ include the same ones as those of $R_1$ as mentioned above and preferred aspects thereof are also the same.

Examples of the 2-oxoalkyl group represented by each of $R_x$ and $R_y$ include a 2-oxoalkyl group example having 1 to 15 carbon atoms (preferably having 1 to 10 carbon atoms), and specific examples of the 2-oxoalkyl group include a 2-oxopropyl group and a 2-oxobutyl group.

Examples of the 2-oxocycloalkyl group represented by each of $R_x$ and $R_y$ include a 2-oxocycloalkyl group example having 1 to 15 carbon atoms (preferably having 1 to 10 carbon atoms), and specific examples of the 2-oxocycloalkyl group include a 2-oxocyclohexyl group.

Examples of the alkoxycarbonylalkyl group represented by each of $R_x$ and $R_y$ include an alkoxycarbonylalkyl group having 1 to 15 carbon atoms (preferably having 1 to 10 carbon atoms).

Examples of the alkoxycarbonylcycloalkyl group represented by each of $R_x$ and $R_y$ include an alkoxycarbonylcycloalkyl group having 1 to 15 carbon atoms (preferably having 1 to 10 carbon atoms).

Among those, the compound (ZI-3) is preferably a compound (ZI-3A).

The compound (ZI-3A) is a compound which is represented by General Formula (ZI-3A) and has a phenacylsulfonium salt structure.

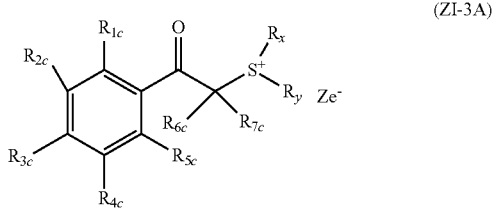

(ZI-3A)

In General Formula (ZI-3A), $R_{1c}$ to $R_{5c}$ each independently represent a hydrogen atom, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group, or an arylthio group.

$R_{6c}$ and $R_{7c}$ each independently represent a hydrogen atom, an alkyl group, a cycloalkyl group, a halogen atom, a cyano group, or an aryl group.

$R_x$ and $R_y$ each independently represent an alkyl group, a cycloalkyl group, a 2-oxoalkyl group, a 2-oxocycloalkyl group, an alkoxycarbonylalkyl group, an allyl group, or a vinyl group.

Among any two or more of $R_{1c}$ to $R_{5c}$, $R_{5c}$ and $R_{6c}$, $R_{6c}$ and $R_{7c}$, $R_{5c}$ and $R_x$, and $R_x$ and $R_y$ each may be bonded to each other to form a ring structure, and the ring structure may each independently contain an oxygen atom, a sulfur atom, a ketone group, an ester bond, or an amide bond.

Examples of the ring structure include an aromatic or non-aromatic hydrocarbon ring, an aromatic or non-aromatic heterocycle, or a polycyclic fused ring composed of two or more of these rings. Examples of the ring structure include 3- to 10-membered rings, and the ring structures are preferably 4- to 8-membered ring, and more preferably 5- or 6-membered rings.

Examples of groups formed by the bonding of any two or more of $R_{1c}$ to $R_{5c}$, $R_{6c}$ and $R_{7c}$, and $R_x$ and $R_y$ include a butylene group and a pentylene group.

As groups formed by the bonding of $R_{5c}$ and $R_6$, and $R_5$ and $R_x$, a single bond or alkylene group is preferable. Examples thereof include a methylene group and an ethylene group.

$Zc^-$ represents an anion.

Next, the compound (ZI-4) will be described.

The compound (ZI-4) is represented by General Formula (ZI-4).

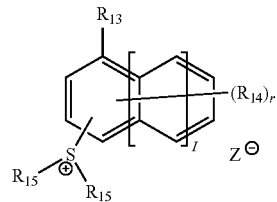

(ZI-4)

In General Formula (ZI-4), l represents an integer of 0 to 2.

r represents an integer of 0 to 8.

$R_{13}$ represents a hydrogen atom, a fluorine atom, a hydroxyl group, an alkyl group, a cycloalkyl group, an alkoxy group, an alkoxycarbonyl group, or a group having a cycloalkyl group. These groups may have a substituent.

$R_{14}$ represents a hydroxyl group, an alkyl group, a cycloalkyl group, an alkoxy group, an alkoxycarbonyl group, an alkylcarbonyl group, an alkylsulfonyl group, a cycloalkylsulfonyl group, or a group having a cycloalkyl group. These groups may have a substituent. In a case where $R_{14}$'s are present in plural number, they each independently represent the group such as a hydrogen as above.

$R_{15}$'s each independently represent an alkyl group, a cycloalkyl group, or a naphthyl group. These groups may have a substituent. Two $R_{15}$'s may be bonded to each other to form a ring. In a case where two $R_{15}$'s are bonded to form a ring, a the ring skeleton may include a heteroatom such as an oxygen atom and a nitrogen atom. In one aspect, it is preferable that two $R_{15}$'s are alkylene groups, and are bonded to each other to form a ring structure.

$Z^-$ represents an anion.

In General Formula (ZI-4), as the alkyl group of each of $R_{13}$, $R_{14}$, and $R_{15}$, an alkyl which is linear or branched. The number of carbon atoms of the alkyl group is preferably 1 to 10. As the alkyl group, a methyl group, an ethyl group, an n-butyl group, a t-butyl group, or the like is more preferable.

Next, General Formula (ZII) and General Formula (ZIII) will be described.

In General Formulae (ZII) and (ZIII), $R_{204}$ to $R_{207}$ each independently represent an aryl group, an alkyl group, or a cycloalkyl group.

As the aryl group of each of $R_{204}$ to $R_{207}$, a phenyl group or a naphthyl group is preferable, and the phenyl group is more preferable. The aryl group of each of $R_{204}$ to $R_{207}$ may be an aryl group having a heterocyclic structure having an oxygen atom, a nitrogen atom, a sulfur atom, or the like. Examples of the skeleton of the aryl group having a heterocyclic structure include pyrrole, furan, thiophene, indole, benzofuran, and benzothiophene.

Preferred examples of the alkyl group and the cycloalkyl group in each of $R_{204}$ to $R_{207}$ include a linear alkyl group having 1 to 10 carbon atoms or a branched alkyl group having 3 to 10 carbon atoms (for example, a methyl group, an ethyl group, a propyl group, a butyl group, and a pentyl group), and a cycloalkyl group having 3 to 10 carbon atoms (a cyclopentyl group, a cyclohexyl group, and a norbornyl group).

The aryl group, a the alkyl group, and the cycloalkyl group of each of $R_{204}$ to $R_{207}$ may each independently have a substituent. Examples of the substituent which the aryl group, a the alkyl group, or the cycloalkyl group of each of $R_{204}$ to $R_{207}$ may have include an alkyl group (for example, having 1 to 15 carbon atoms), a cycloalkyl group (for example, having 3 to 15 carbon atoms), an aryl group (for example, having 6 to 15 carbon atoms), an alkoxy group (for example, having 1 to 15 carbon atoms), a halogen atom, a hydroxyl group, and a phenylthio group.

$Z^-$ represents an anion.

As $Z^-$ in General Formula (ZI), $Z^-$ in General Formula (ZII), $Zc^-$ in General Formula (ZI-3), and $Z^-$ in General Formula (ZI-4), an anion represented by General Formula (3) is preferable.

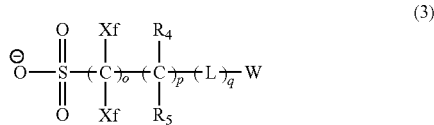

(3)

In General Formula (3), o represents an integer of 1 to 3. p represents an integer of 0 to 10. q represents an integer of 0 to 10.

Xf's each independently represent a fluorine atom or an alkyl group substituted with at least one fluorine atom. The number of carbon atoms of the alkyl group is preferably 1 to 10, and more preferably 1 to 4. Further, as the alkyl group substituted with at least one fluorine atom, a perfluoroalkyl group is preferable.

Xf is preferably a fluorine atom or a perfluoroalkyl group having 1 to 4 carbon atoms, and more preferably a fluorine atom or $CF_3$. In particular, it is still more preferable that both Xf's are fluorine atoms.

$R_4$ and $R_5$ each independently represent a hydrogen atom, a fluorine atom, an alkyl group, or an alkyl group substituted with at least one fluorine atom. In a case where $R_4$'s and $R_5$'s are each present in plural number, $R_4$'s and $R_5$'s may be the same as or different from each other.

The alkyl group represented by each of $R_4$ and $R_5$ may have a substituent, and preferably has 1 to 4 carbon atoms. $R_4$ and $R_5$ are each preferably a hydrogen atom.

Specific examples and suitable embodiments of the alkyl group substituted with at least one fluorine atom are the same as the specific examples and suitable embodiments of Xf in General Formula (3).

L represents a divalent linking group. In a case where L's are present in plural number, they may be the same as or different from each other.

Examples of the divalent linking group include —COO— (—C(=O)—O—), —OCO—, —CONH—, —NHCO—, —CO—, —O—, —S—, —SO—, —SO$_2$—, an alkylene group (preferably having 1 to 6 carbon atoms), a cycloalkylene group (preferably having 3 to 15 carbon atoms), an alkenylene group (preferably having 2 to 6 carbon atoms), or a divalent linking group formed by combination of these plurality of groups. Among these, —COO—, —OCO—, —CONH—, —NHCO—, —CO—, —O—, —SO$_2$—, —COO-alkylene group-, —OCO-alkylene group-, —CONH-alkylene group-, or —NHCO— alkylene group— is preferable, and —COO—, —OCO—, —CONH—, —SO$_2$—, —COO-alkylene group-, or —OCO-alkylene group—is more preferable.

W represents an organic group including a cyclic structure. Among these, a cyclic organic group is preferable.

Examples of the cyclic organic group include an alicyclic group, an aryl group, and a heterocyclic group.

The alicyclic group may be monocyclic or polycyclic. Examples of the monocyclic alicyclic group include monocyclic cycloalkyl groups such as a cyclopentyl group, a cyclohexyl group, and a cyclooctyl group. Examples of the polycyclic alicyclic group include polycyclic cycloalkyl groups such as a norbornyl group, a tricyclodecanyl group, a tetracyclodecanyl group, a tetracyclododecanyl group, and an adamantyl group. Among these, an alicyclic group having a bulky structure having 7 or more carbon atoms, such as a norbornyl group, a tricyclodecanyl group, a tetracyclodecanyl group, a tetracyclododecanyl group, and an adamantyl group is preferable.

The aryl group may be monocyclic or polycyclic. Examples of the aryl group include a phenyl group, a naphthyl group, a phenanthryl group, and an anthryl group.

The heterocyclic group may be monocyclic or polycyclic. In a case where it is polycyclic, it is possible to suppress acid diffusion. Further, the heterocyclic group may have aromaticity or may not have aromaticity. Examples of the heterocycle having aromaticity include a furan ring, a thiophene ring, a benzofuran ring, a benzothiophene ring, a dibenzofuran ring, a dibenzothiophene ring, and a pyridine ring. Examples of the heterocycle not having an aromaticity include a tetrahydropyran ring, a lactone ring, a sultone ring, and a decahydroisoquinoline ring. Examples of the lactone ring and the sultone ring include the above-mentioned lactone structures and sultone structures exemplified in the resin. As the heterocycle in the heterocyclic group, a furan ring, a thiophene ring, a pyridine ring, or a decahydroisoquinoline ring is particularly preferable.

The cyclic organic group may have a substituent. Examples of the substituent include, an alkyl group (which may be linear or branched, and preferably has 1 to 12 carbon atoms), a cycloalkyl group (which may be monocyclic, polycyclic, or spiro ring, and preferably has 3 to 20 carbon atoms), an aryl group (preferably having 6 to 14 carbon atoms), a hydroxyl group, an alkoxy group, an ester group, an amido group, a urethane group, a ureido group, a thioether group, a sulfonamido group, and a sulfonic acid ester group. Incidentally, the carbon constituting the cyclic organic group (carbon contributing to ring formation) may be carbonyl carbon.

As the anion represented by General Formula (3), $SO_3^-$—$CF_2$—$CH_2$—OCO-(L)q'—W, $SO_3^-$—$CF_2$—CHF—$CH_2$—OCO-(L)q'—W, $SO_3^-$—$CF_2$—COO-(L)q'—W, $SO_3^-$—$CF_2$—$CF_2$—$CH_2$—$CH_2$-(L)q-W, or $SO_3^-$—$CF_2$—CH($CF_3$)—OCO-(L)q'—W is preferable. Here, L, q, and W are each the same as in General Formula (3). q' represents an integer of 0 to 10.

In one aspect, as $Z^-$ in General Formula (ZI), $Z^-$ in General Formula (ZII), $Zc^-$ in General Formula (ZI-3), and $Z^-$ in General Formula (ZI-4), an anion represented by General Formula (4) is also preferable.

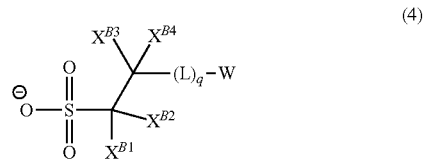

(4)

In General Formula (4), $X^{B1}$ and $X^{B2}$ each independently represent a hydrogen atom or a monovalent organic group having no fluorine atom. $X^{B1}$ and $X^{B2}$ are each preferably a hydrogen atom.

$X^{B3}$ and $X^{B4}$ each independently represent a hydrogen atom or a monovalent organic group. It is preferable that at least one of $X^{B3}$ or $X^{B4}$ is a fluorine atom or a monovalent organic group having a fluorine atom, and it is more preferable that both of $X^{B3}$ and $X^{B4}$ are a fluorine atom or a monovalent organic group having a fluorine atom. It is still more preferable that $X^{B3}$ and $X^{B4}$ are both an alkyl group substituted with a fluorine atom.

L, q, and W are the same as in General Formula (3).

$Z^-$ in General Formula (ZI), $Z^-$ in General Formula (ZII), $Zc^-$ in General Formula (ZI-3), and $Z^-$ in General Formula (ZI-4) may be a benzenesulfonic acid anion, and is preferably a benzenesulfonic acid anion substituted with a branched alkyl group or a cycloalkyl group.

As $Z^-$ in General Formula (ZI), $Z^-$ in General Formula (ZII), $Zc^-$ in General Formula (ZI-3), and $Z^-$ in General Formula (ZI-4), an aromatic sulfonic acid anion represented by General Formula (SA1) is also preferable.

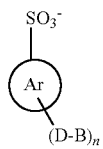
(SA1)

In Formula (SA1),

Ar represents an aryl group and may further have a substituent other than a sulfonic acid anion and a —(D-B) group. Examples of the substituent that may further be contained include a fluorine atom and a hydroxyl group.

n represents an integer of 0 or more. n is preferably 1 to 4, more preferably 2 or 3, and still more preferably 3.

D represents a single bond or a divalent linking group. Examples of the divalent linking group include an ether group, a thioether group, a carbonyl group, a sulfoxide group, a sulfone group, a sulfonic acid ester group, an ester group, and a group formed by combination of two or more kinds of these groups.

B represents a hydrocarbon group.

It is preferable that D is a single bond and B is an aliphatic hydrocarbon structure. It is more preferable that B is an isopropyl group or a cyclohexyl group.

Preferred examples of the sulfonium cation in General Formula (ZI) and the iodonium cation in General Formula (ZII) are set forth below.

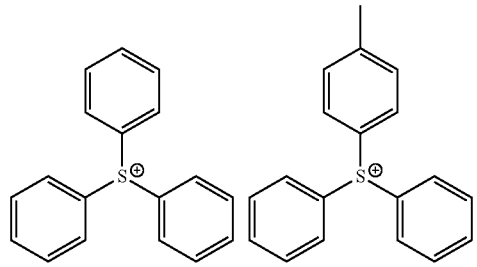

-continued

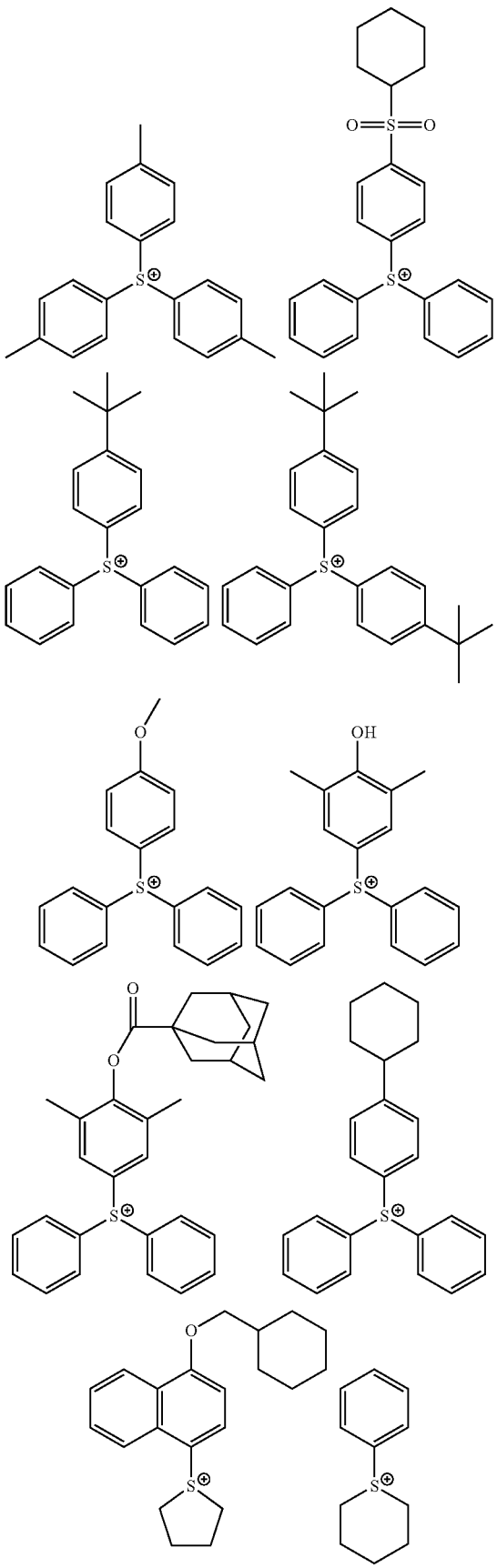

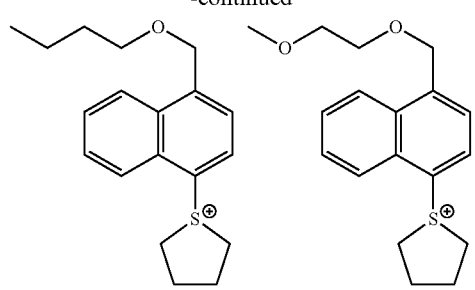
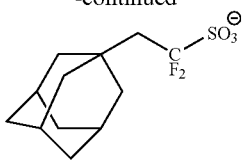
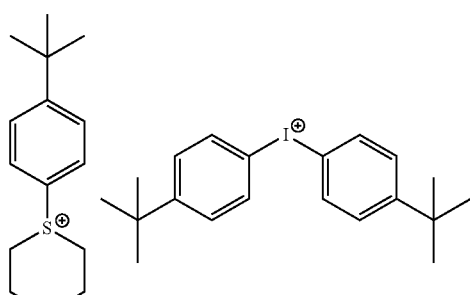
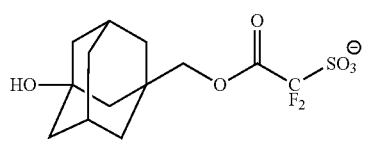
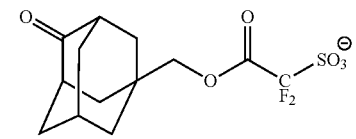
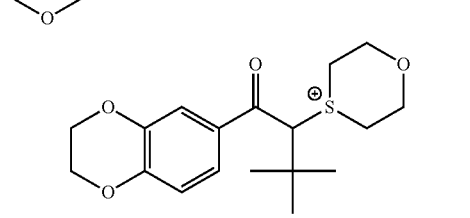
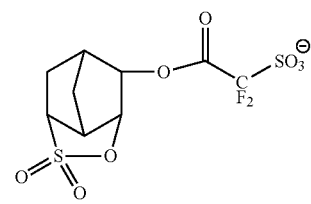
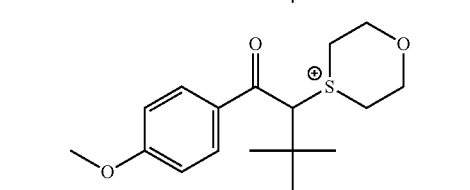
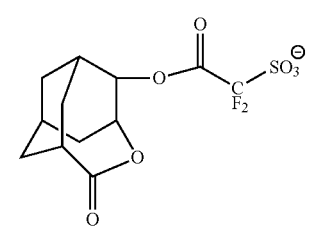
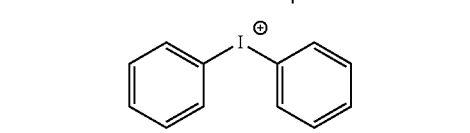
Preferred examples of the anion $Z^-$ in General Formula (ZI) and General Formula (ZII), $Zc^-$ in General Formula (ZI-3), and $Z^-$ in General Formula (ZI-4) are set forth below.
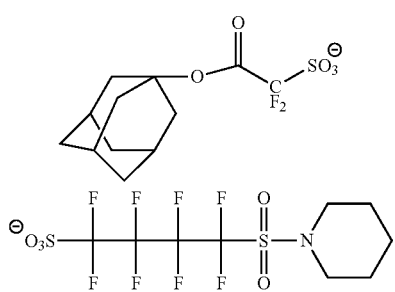
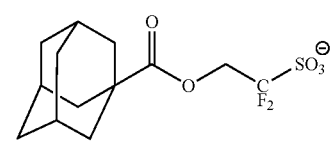
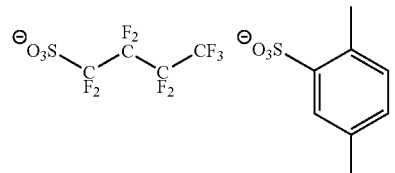
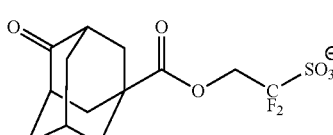
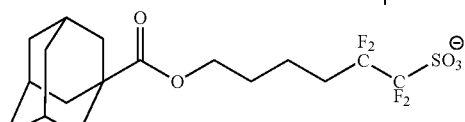
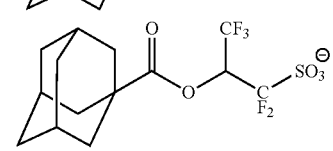
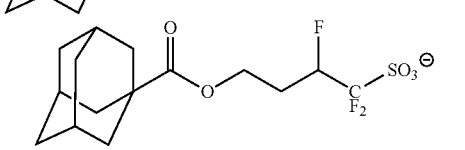

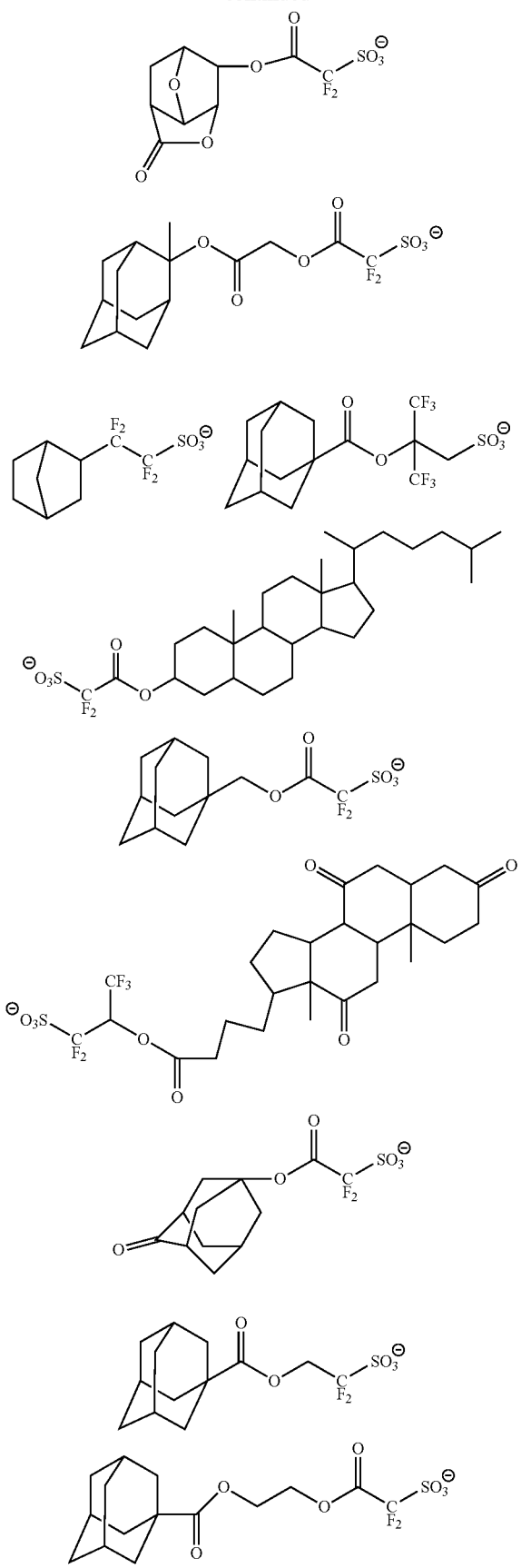

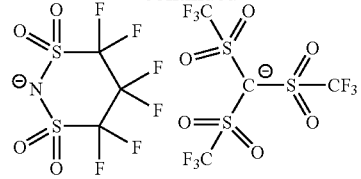

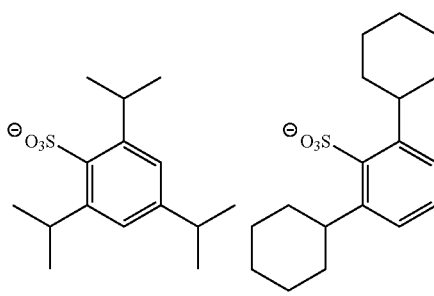

The cation and the anion can be optionally combined and be used as an acid generator.

The acid generator may be in a form of a low-molecular-weight compound or in a form incorporated into a part of a polymer. Further, a combination of the form of a low-molecular-weight compound and the form incorporated into a part of a polymer may also be used.

In the present invention, the acid generator is preferably in the form of the low-molecular-weight compound.

In a case where the acid generator is in the form of the low-molecular-weight compound, the molecular weight is preferably 3,000 or less, more preferably 2,000 or less, and still more preferably 1,000 or less.

In a case where the acid generator is in the form incorporated into a part of a polymer, it may be incorporated into the above-mentioned resin (A) or into a resin other than the resin (A).

The content of the acid generator in the composition of the embodiment of the present invention is preferably 0.1% to 35% by mass, more preferably 0.5% to 25% by mass, still more preferably 1% to 20% by mass, and particularly preferably 1% to 15% by mass, with respect to the total solid contents of the composition.

In addition, the content of the acid generator A in the composition of the embodiment of the present invention is preferably 0.1% to 35% by mass, more preferably 0.5% to 20% by mass, and still more preferably 1% to 18% by mass, with respect to the total solid contents of the composition. The content of the acid generator B is preferably 0.1% to 20% by mass, more preferably 0.5% to 15% by mass, and still more preferably 1% to 10% by mass, with respect to the total solid contents of the composition.

From the viewpoint that performance of LWR and/or CDU is further improved, it is preferable that at least one of the acid generators in the composition of the embodiment of the present invention is an onium salt compound having the cation structure represented by General Formula (ZI-3).

Moreover, from the viewpoint that performance of LWR and/or CDU is further improved, the pKa of an acid generated from the acid generator A in the composition of the embodiment of the present invention is preferably −3.50 or more, more preferably −3.00 or more, still more preferably −2.50 or more, particularly preferably −2.00 or more, and most preferably −1.00 or more. Further, the upper limit is not particularly limited, but is, for example, 3.00 or less. In addition, in a case where the compound is other than the compound having the phenacylsulfonium structure represented by General Formula (ZI-3), LWR is more excellent with a pKa of −2.50 or more.

In addition, from the viewpoint that performance of LWR and/or CDU is further improved, the molecular weight of a second acid generated from the acid generator B in the composition of the embodiment of the present invention is preferably 250 or more. Further, the upper limit is not particularly limited, but is, for example, 800.

<Acid Diffusion Control Agent (D)>

The composition of the embodiment of the present invention may include an acid diffusion control agent (D). The acid diffusion control agent (D) acts as a quencher that inhibits a reaction of the acid-decomposable resin in the unexposed area by excessive generated acids by trapping the acids generated from an acid generator or the like upon exposure. For example, a basic compound (DA), a basic compound (DB) whose basicity is reduced or lost upon irradiation with actinic rays or radiation, an onium salt (DC) which becomes a relatively weak acid with respect to an acid generator, a low-molecular-weight compound (DD) which has a nitrogen atom and a group that leaves by the action of an acid, an onium compound (DE) having a nitrogen atom in a cationic moiety, or the like can be used as the acid diffusion control agent. In the composition of the embodiment of the present invention, a known acid diffusion control agent can be appropriately used. For example, the known compounds disclosed in paragraphs <0627> to <0664> of US2016/0070167A1, paragraphs <0095> to <0187> of US2015/0004544A1, paragraphs <0403> to <0423> of US2016/0237190A1, and paragraphs <0259> to <0328> of US2016/0274458A1 can be suitably used as the acid diffusion control agent (D).

As the basic compound (DA), compounds having structures represented by Formulae (A) to (E) are preferable.

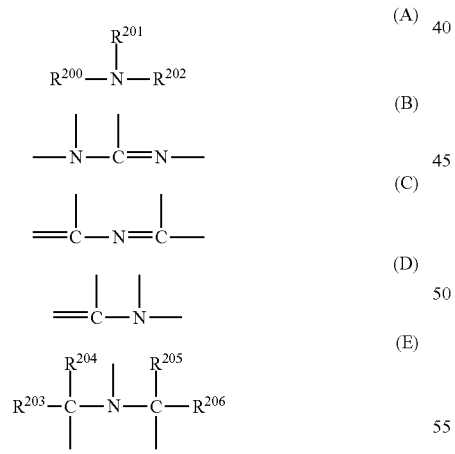

In General Formulae (A) and (E), $R^{200}$, $R^{201}$, and $R^{202}$ may be the same as or different from each other, and each represent a hydrogen atom, an alkyl group (preferably having 1 to 20 carbon atoms), a cycloalkyl group (preferably having 3 to 20 carbon atoms), or an aryl group (having 6 to 20 carbon atoms). $R^{201}$ and $R^{202}$ may be bonded to each other to form a ring.

$R^{203}$, $R^{204}$, $R^{205}$, and $R^{206}$ may be the same as or different from each other, and each represent an alkyl group having 1 to 20 carbon atoms.

The alkyl group in each of General Formulae (A) and (E) may have a substituent or may be unsubstituted.

With regard to the alkyl group, a the alkyl group having a substituent is preferably an aminoalkyl group having 1 to 20 carbon atoms, a hydroxyalkyl group having 1 to 20 carbon atoms, or a cyanoalkyl group having 1 to 20 carbon atoms.

The alkyl groups in each of General Formulae (A) and (E) are more preferably unsubstituted.

As the basic compound (DA), guanidine, aminopyrrolidine, pyrazole, pyrazoline, piperazine, aminomorpholine, aminoalkylmorpholine, piperidine, or the like is preferable; and a compound having an imidazole structure, a diazabicyclo structure, an onium hydroxide structure, an onium carboxylate structure, a trialkylamine structure, an aniline structure, or a pyridine structure, an alkylamine derivative having a hydroxyl group and/or an ether bond, and an aniline derivative having a hydroxyl group and/or an ether bond, or the like is more preferable.

The basic compound (DB) whose basicity is reduced or lost upon irradiation with actinic rays or radiation (hereinafter also referred to as a "compound (DB)") is a compound which has a proton-accepting functional group, and decomposes under irradiation with actinic rays or radiation to exhibit deterioration in proton-accepting properties, no proton-accepting properties, or a change from the proton-accepting properties to acidic properties.

The proton-accepting functional group refers to a functional group having a group or an electron which is capable of electrostatically interacting with a proton, and for example, means a functional group with a macrocyclic structure, such as a cyclic polyether, or a functional group having a nitrogen atom having an unshared electron pair not contributing to π-conjugation. The nitrogen atom having an unshared electron pair not contributing to π-conjugation is, for example, a nitrogen atom having a partial structure represented by the following formula.

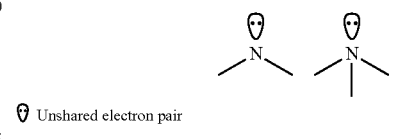

⊖ Unshared electron pair

Preferred examples of the partial structure of the proton-accepting functional group include crown ether, azacrown ether, primary to tertiary amines, pyridine, imidazole, and pyrazine structures.

The compound (DB) decomposes upon irradiation with actinic rays or radiation to generate a compound exhibiting deterioration in proton-accepting properties, no proton-accepting properties, or a change from the proton-accepting properties to acidic properties. Here, exhibiting deterioration in proton-accepting properties, no proton-accepting properties, or a change from the proton-accepting properties to acidic properties means a change of proton-accepting properties due to the proton being added to the proton-accepting functional group, and specifically a decrease in the equilibrium constant at chemical equilibrium in a case where a proton adduct is generated from the compound (DB) having the proton-accepting functional group and the proton.

The proton-accepting properties can be confirmed by performing pH measurement.

In the present invention, the acid dissociation constant pKa of the compound generated by the decomposition of the compound (DB) upon irradiation with actinic rays or radiation preferably satisfies pKa<−1, more preferably −13<pKa<−1, and still more preferably −13<pKa<−3.

The acid dissociation constant pKa as mentioned herein refers to an acid dissociation constant pKa in an aqueous solution, and is defined, for example, in Chemical Handbook (II) (Revised 4$^{th}$ Edition, 1993, compiled by the Chemical Society of Japan, Maruzen Company, Ltd.). A lower value thereof indicates higher acid strength. Specifically, the acid dissociation constant pKa in an aqueous solution may be measured by using an infinite-dilution aqueous solution and measuring the acid dissociation constant at 25° C. Alternatively, the acid dissociation constant pKa can also be determined using the following software package 1, by computation from a value based on a Hammett substituent constant and the database of publicly known literature values.

Software package 1: Advanced Chemistry Development (ACD/Labs) Software V8.14 for Solaris (1994-2007 ACD/Labs).

In the composition of the embodiment of the present invention, an onium salt (DC) which becomes a relatively weak acid with respect to the acid generator can be used as an acid diffusion control agent.

In a case of mixing the acid generator and the onium salt capable of generating an acid which is a relatively weak acid with respect to an acid generated from the acid generator, and then using the mixture, in a case where the acid generated from the acid generator upon irradiation with actinic rays or radiation collides with an onium salt having an unreacted weak acid anion, a weak acid is discharged by salt exchange, thereby generating an onium salt having a strong acid anion. In this process, the strong acid is exchanged with a weak acid having a lower catalytic ability, and therefore, the acid is deactivated in appearance, and thus, it is possible to carry out the control of acid diffusion.

As the onium salt which becomes a relatively weak acid with respect to the acid generator, compounds represented by General Formulae (d1-1) to (d1-3) are preferable.

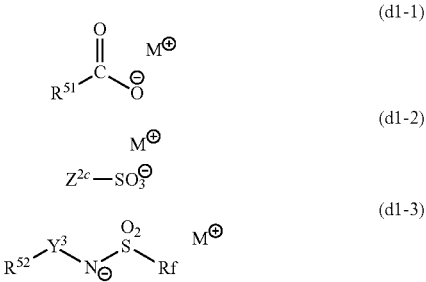

In the formulae, $R^{51}$ is a hydrocarbon group which may have a substituent, $Z^{2c}$ is a hydrocarbon group (provided that carbon adjacent to S is not substituted with a fluorine atom) having 1 to 30 carbon atoms, which may have a substituent, $R^{52}$ is an organic group, $Y^3$ is a linear, branched, or cyclic alkylene group or arylene group, Rf is a hydrocarbon group including a fluorine atom, and M$^+$'s are each independently an ammonium cation, a sulfonium cation, or an iodonium cation.

Preferred examples of the sulfonium cation or the iodonium cation represented by M$^+$ include the sulfonium cations exemplified for General Formula (ZI) and the iodonium cations exemplified for General Formula (ZII) of the acid generator.

The onium salt (DC) which becomes a relatively weak acid with respect to the acid generator may be a compound (hereinafter also referred to as a "compound (DCA)") having a cationic moiety and an anionic moiety in the same molecule, in which the cationic moiety and the anionic moiety are linked to each other through a covalent bond.

As the compound (DCA), a compound represented by any one of General Formulae (C-1), . . . , or (C-3) is preferable.

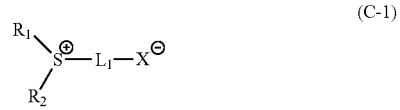

In General Formulae (C-1) to (C-3), $R_1$, $R_2$, and $R_3$ represent a substituent having 1 or more carbon atoms.

$L_1$ represents a divalent linking group that links a cationic moiety with an anionic moiety, or a single bond.

—X⁻ represents an anionic moiety selected from —COO⁻, —SO$_3$⁻, —SO$_2$⁻, and —N⁻—R$_4$. R$_4$ represents a monovalent substituent having a carbonyl group: —C(=O)—, a sulfonyl group: —S(=O)$_2$—, or a sulfinyl group: —S(=O)— at a site for linking to an adjacent N atom.

$R_1$, $R_2$, $R_3$, $R_4$, and $L_1$ may be bonded to one another to form a ring structure. Further, in General Formula (C-3), two of $R_1$ to $R_3$ may be bonded to each other to form a double bond with an N atom.

Examples of the substituent having 1 or more carbon atoms in each of $R_1$ to $R_3$ include an alkyl group, a cycloalkyl group, an aryl group, an alkyloxycarbonyl group, a cycloalkyloxycarbonyl group, an aryloxycarbonyl group, an alkylaminocarbonyl group, a cycloalkylaminocarbonyl group, and an arylaminocarbonyl group. The substituent is preferably an alkyl group, a cycloalkyl group, or an aryl group.

Examples of $L_1$ as a divalent linking group include a linear or branched alkylene group, a cycloalkylene group, an arylene group, a carbonyl group, an ether bond, ester bond, amide bond, a urethane bond, a urea bond, and a group formed by a combination of two or more kinds of these groups. $L_1$ is preferably an alkylene group, an arylene group, an ether bond, ester bond, and a group formed by a combination of two or more kinds of these groups.

The low-molecular-weight compound (DD) (hereinafter referred to as a "compound (DD)") which has a nitrogen atom and a group that leaves by the action of an acid is preferably an amine derivative having a group that leaves by the action of an acid on a nitrogen atom.

As the group that leaves by the action of an acid, an acetal group, a carbonate group, a carbamate group, a tertiary ester group, a tertiary hydroxyl group, or a hemiaminal ether group are preferable, and a carbamate group or a hemiaminal ether group is particularly preferable.

The molecular weight of the compound (DD) is preferably 100 to 1,000, more preferably 100 to 700, and still more preferably 100 to 500.

The compound (DD) may have a carbamate group having a protecting group on a nitrogen atom. The protecting group constituting the carbamate group can be represented by General Formula (d-1).

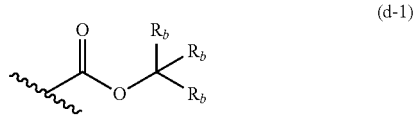

In General Formula (d-1), $R_b$'s each independently represent a hydrogen atom, an alkyl group (preferably having 1 to 10 carbon atoms), a cycloalkyl group (preferably having 3 to 30 carbon atoms), an aryl group (preferably having 3 to 30 carbon atoms), an aralkyl group (preferably having 1 to 10 carbon atoms), or an alkoxyalkyl group (preferably having 1 to 10 carbon atoms). $R_b$'s may be linked to each other to form a ring.

The alkyl group, a the cycloalkyl group, a the aryl group, or the aralkyl group represented by $R_b$ may be substituted with a functional group such as a hydroxyl group, a cyano group, an amino group, a pyrrolidino group, a piperidino group, a morpholino group, and an oxo group, an alkoxy group, or a halogen atom. This shall apply to the alkoxyalkyl group represented by $R_b$.

$R_b$ is preferably a linear or branched alkyl group, a cycloalkyl group, or an aryl group, and more preferably a linear or branched alkyl group, or a cycloalkyl group.

Examples of the ring formed by the mutual linking of two $R_b$'s include an alicyclic hydrocarbon group, an aromatic hydrocarbon group, a heterocyclic hydrocarbon group, and derivatives thereof.

Examples of the specific structure of the group represented by General Formula (d-1) include, but are not limited to, the structures disclosed in paragraph <0466> in US2012/0135348A1.

It is preferable that the compound (DD) has a structure represented by General Formula (6).

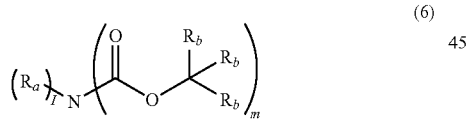

In General Formula (6), 1 represents an integer of 0 to 2, and m represents an integer of 1 to 3, satisfying l+m=3.

$R_a$ represents a hydrogen atom, an alkyl group, a cycloalkyl group, an aryl group, or an aralkyl group. In a case where 1 is 2, two $R_a$'s may be the same as or different from each other, and two $R_a$'s may be linked to each other to form a heterocycle, together with the nitrogen atom in the formula. The heterocycle may include a heteroatom other than the nitrogen atom in the formula.

$R_b$ has the same meaning as $R_b$ in General Formula (d-1), and preferred examples are also the same.

In General Formula (6), the alkyl group, a the cycloalkyl group, a the aryl group, and the aralkyl group as $R_a$ may be substituted with the same groups as the group mentioned above as a group which may be substituted in the alkyl group, a the cycloalkyl group, a the aryl group, and the aralkyl group as $R_b$.

Specific examples of the alkyl group, the cycloalkyl group, the aryl group, and the aralkyl group (these groups may be substituted with the groups as described above) of $R_a$ include the same groups as the specific examples as described above with respect to $R_b$.

Specific examples of the particularly preferred compound (DD) in the present invention include, but are not limited to, the compounds disclosed in paragraph <0475> in US2012/0135348A1.

The onium salt compound (DE) (hereinafter also referred to as a "compound (DE)") having a nitrogen atom in a cation portion is preferably a compound having a basic moiety including a nitrogen atom in a cation portion. The basic moiety is preferably an amino group, and more preferably an aliphatic amino group. It is more preferable that all of the atoms adjacent to the nitrogen atom in the basic moiety are hydrogen atoms or carbon atoms. Further, from the viewpoint of improvement of basicity, it is preferable that an electron-withdrawing functional group (a carbonyl group, a sulfonyl group, a cyano group, a halogen atom, and the like) is not directly linked to the nitrogen atom.

Specific preferred examples of the compound (DE) include, but are not limited to, the compounds disclosed in paragraph <0203> of US2015/0309408A1.

Preferred examples of the acid diffusion control agent (D) are set forth below.

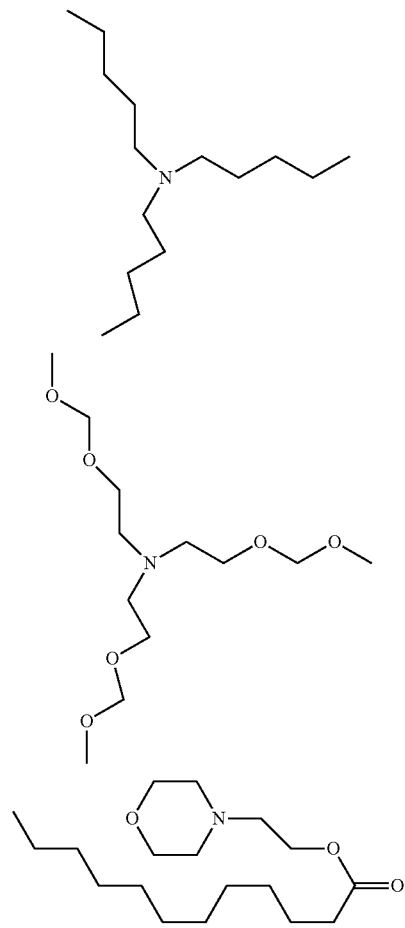

49
-continued
50
-continued
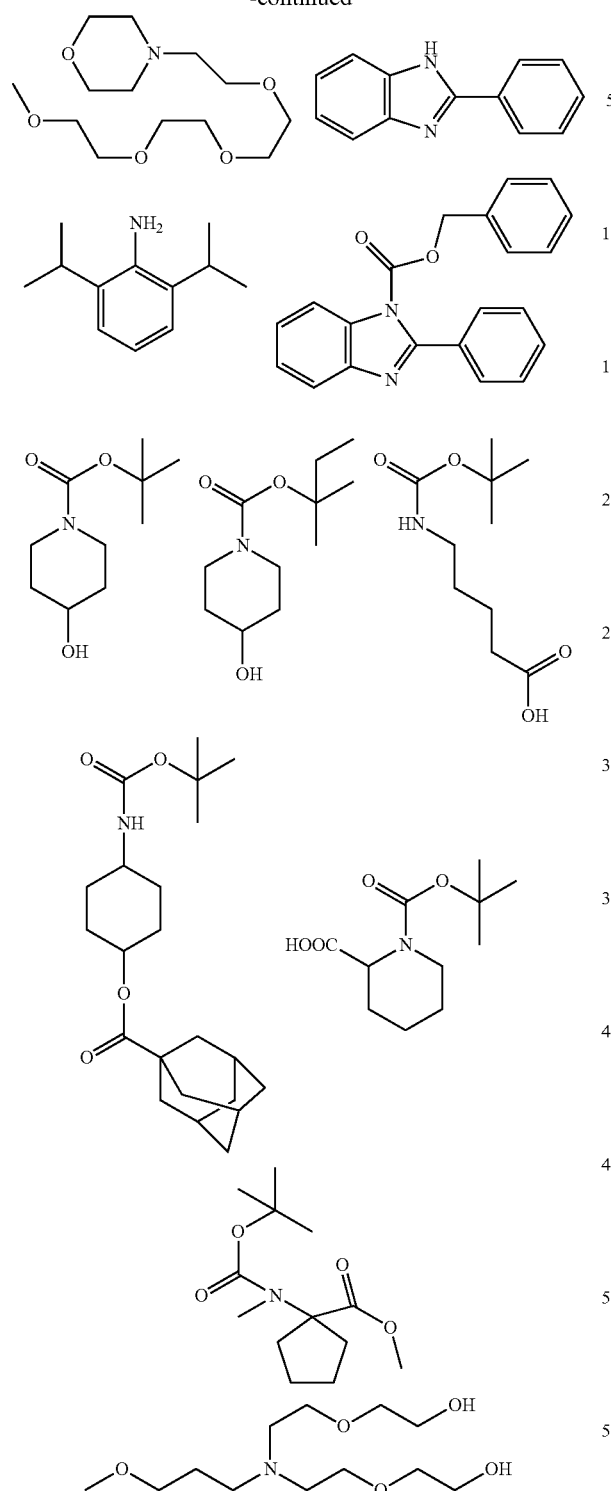
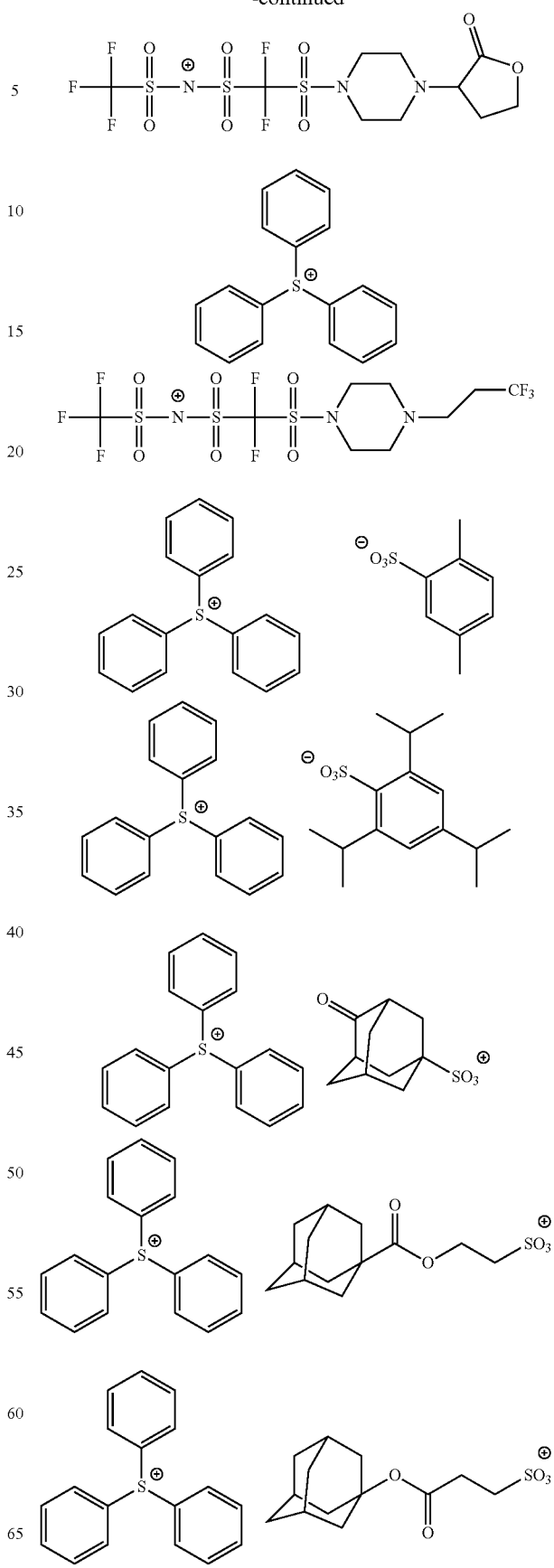

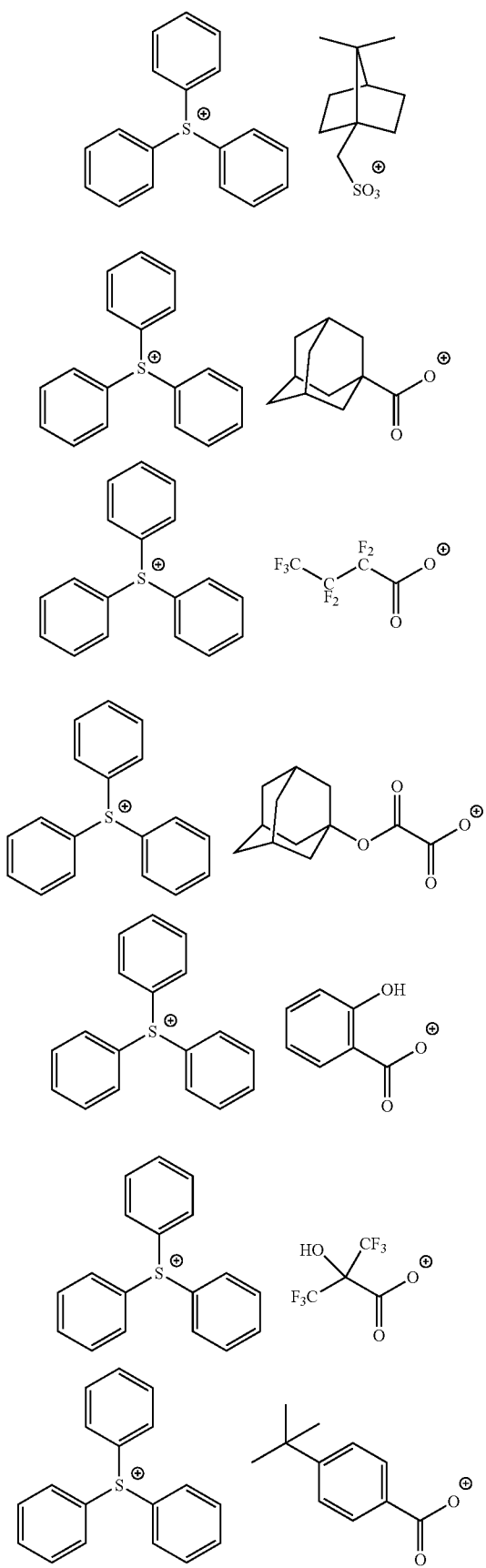
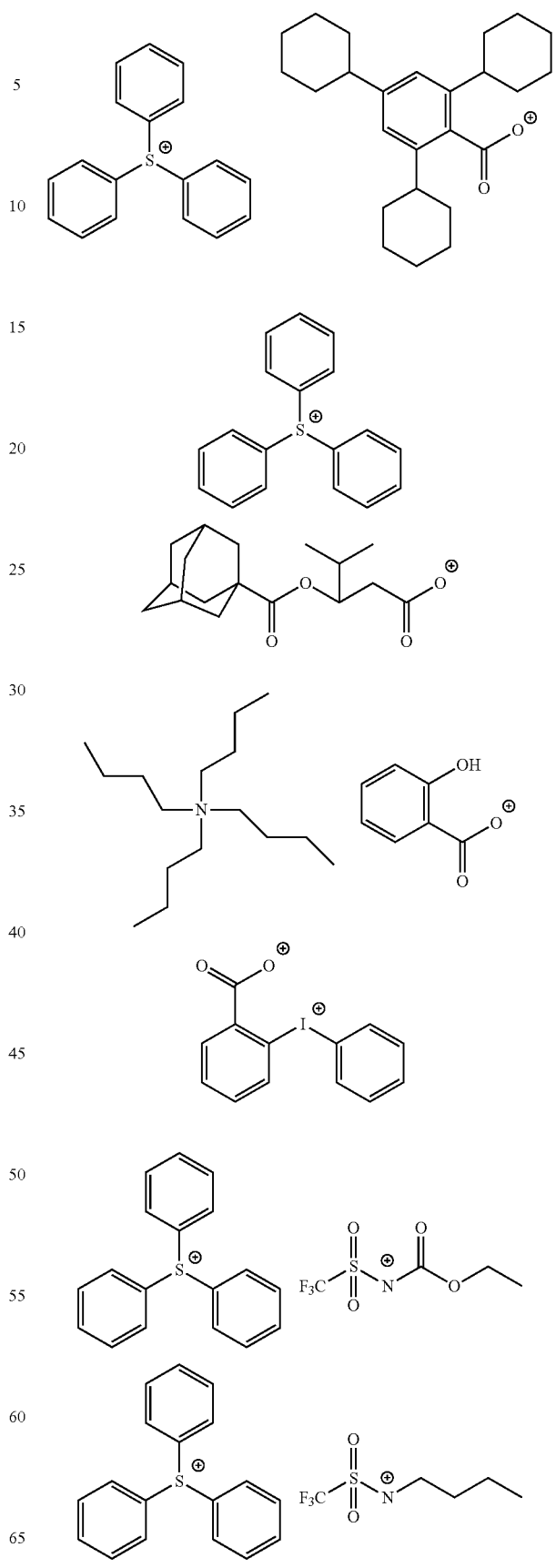

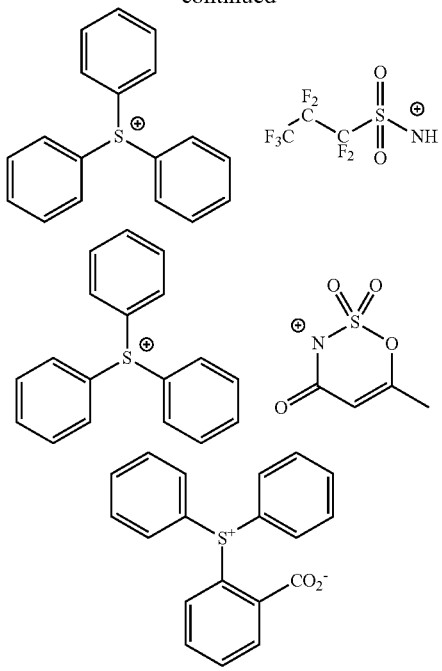

In the composition of the embodiment of the present invention, the acid diffusion control agent (D) may be used singly or in combination of two or more kinds thereof. Further, the composition of the embodiment of the present invention may not contain the acid diffusion control agent (D), as described above.

In a case where the composition contains the acid diffusion control agent (D), the content of the acid diffusion control agent (D) (a total of the contents in a case where the acid diffusion control agents (D) are present in plural number) in the composition is preferably 0.001% to 5% by mass, more preferably 0.001% to 3% by mass, and still more preferably 0.001% to 1% by mass, with respect to the total solid content of the composition.

<Hydrophobic Resin (E)>

The composition of the embodiment of the present invention may include a hydrophobic resin (E). Further, the hydrophobic resin (E) is preferably a resin which is different from the resin (A) and the resin (B).

By incorporating the hydrophobic resin (E) into the composition of the embodiment of the present invention, it is possible to improve the static/dynamic contact angle at a surface of an actinic ray-sensitive or radiation-sensitive film. Thus, it becomes possible to improve development characteristics, suppress generation of out gas, improve immersion liquid tracking properties upon immersion liquid exposure, and reduce liquid immersion defects, for example.

It is preferable that the hydrophobic resin (E) is designed to be unevenly distributed on a surface of a resist film, but unlike the surfactant, the hydrophobic resin (E) does not necessarily have a hydrophilic group in a molecule thereof and does not necessarily contribute to uniform mixing of polar/non-polar materials.

The hydrophobic resin (E) is preferably a resin having a repeating unit having at least one selected from a "fluorine atom", a "silicon atom", or a "$CH_3$ partial structure which is contained in a side chain portion of a resin" from the viewpoint of uneven distribution on a film surface layer, and more preferably has two or more types.

In a case where the hydrophobic resin (E) includes a fluorine atom and/or a silicon atom, the fluorine atom and/or the silicon atom described above in the hydrophobic resin (E) may be included in the main chain of a resin or may be included in a side chain.

In a case where the hydrophobic resin (E) includes a fluorine atom, it is preferably a resin which has an alkyl group having a fluorine atom, a cycloalkyl group having a fluorine atom, or an aryl group having a fluorine atom as a partial structure having a fluorine atom.

It is preferable that the hydrophobic resin (E) has at least one group selected from the following (x) to (z) groups:

(x) an acid group, (y) a group whose solubility in an alkali developer through decomposition by the action of the alkali developer (hereinafter also referred to as a polarity converting group), and (z) a group capable of decomposing by the action of an acid.

Examples of the acid group (x) include a phenolic hydroxyl group, a carboxylic acid group, a fluorinated alcohol group, a sulfonic acid group, a sulfonamido group, a sulfonylimido group, an (alkyl sulfonyl)(alkylcarbonyl) methylene group, an (alkyl sulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, and a tris(alkylsulfonyl)methyl ene group.

As the acid group, a fluorinated alcohol group (preferably hexafluoroisopropanol), a sulfonimido group, or a bis(alkylcarbonyl)methylene group is preferable.

Examples of the group (y) whose solubility in an alkali developer through decomposition by the action of the alkali developer include a lactone group, a carboxylic acid ester group (—COO—), an acid anhydride group (—C(O)OC(O)—), an acid imido group (—NHCONH—), a carboxylic acid thioester group (—COS —), a carbonate ester group (—OC(O)O—), a sulfuric acid ester group (—OSO$_2$O—), and a sulfonic acid ester group (—SO$_2$O—), and the lactone group or the carboxylic acid ester group (—COO—) is preferable.

Examples of the repeating unit including the group include a repeating unit in which the group is directly bonded to the main chain of a resin, such as a repeating unit with an acrylic acid or a methacrylic acid. In this repeating unit, the group may be bonded to the main chain of the resin through a linking group. Alternatively, the group may also be incorporated into a terminal of the resin by using a polymerization initiator or chain transfer agent having the group during polymerization.

Examples of the repeating unit having a lactone group include the same ones as the repeating unit having a lactone structure as described earlier in the section of the resin (A).

The content of the group (y) whose solubility in an alkali developer through decomposition by the action of the alkali developer is preferably 1% to 100% by mole, more preferably 3% to 98% by mole, and still more preferably 5% to 95% by mole, with respect to all the repeating units in the hydrophobic resin (E).

With respect to the hydrophobic resin (E), examples of the repeating unit having a group (z) capable of decomposing by the action of an acid include the same ones as the repeating units having an acid-decomposable group, as exemplified in the resin (A). The repeating unit having a group (z) capable of decomposing by the action of an acid may have at least one of a fluorine atom or a silicon atom. The content of the repeating units having a group (z) capable of decomposing by the action of an acid is preferably 1% to 80% by mole, more preferably 10% to 80% by mole, and still more preferably 20% to 60% by mole, with respect to all the repeating units in the hydrophobic resin (E).

The hydrophobic resin (E) may have a repeating unit which is different from the above-mentioned repeating units.

The content of the repeating units including a fluorine atom is preferably 10% to 100% by mole, and more preferably 30% to 100% by mole, with respect to all the repeating units in the hydrophobic resin (E). Further, the content of the repeating units including a silicon atom is preferably 10% to 100% by mole, and more preferably 20% to 100% by mole, with respect to all the repeating units in the hydrophobic resin (E).

On the other hand, in a case where the hydrophobic resin (E) includes a $CH_3$ partial structure in the side chain moiety thereof, it is also preferable that the hydrophobic resin (E) has a form not having substantially any one of a fluorine atom and a silicon atom. Further, it is preferable that the hydrophobic resin (E) is substantially constituted with only repeating units, which are composed of only atoms selected from a carbon atom, an oxygen atom, a hydrogen atom, a nitrogen atom, and a sulfur atom.

The weight-average molecular weight of the hydrophobic resin (E) in terms of standard polystyrene is preferably 1,000 to 100,000, and more preferably 1,000 to 50,000.

The total content of residual monomers and/or oligomer components included in the hydrophobic resin (E) is preferably 0.01% to 5% by mass, and more preferably 0.01% to 3% by mass. Further, the dispersity (Mw/Mn) is preferably in the range of 1 to 5, and more preferably in the range of 1 to 3.

As the hydrophobic resin (E), known resins can be appropriately selected and used singly or as a mixture. For example, the known resins disclosed in paragraphs <0451> to <0704> of US2015/0168830A1 and paragraphs <0340> to <0356> of US2016/0274458A1 can be suitably used as the hydrophobic resin (E). Further, the repeating units disclosed in paragraphs <0177> to <0258> of US2016/0237190A1 are also preferable as a repeating unit constituting the hydrophobic resin (E).

Preferred examples of a monomer corresponding to the repeating unit constituting the hydrophobic resin (E) are set forth below.

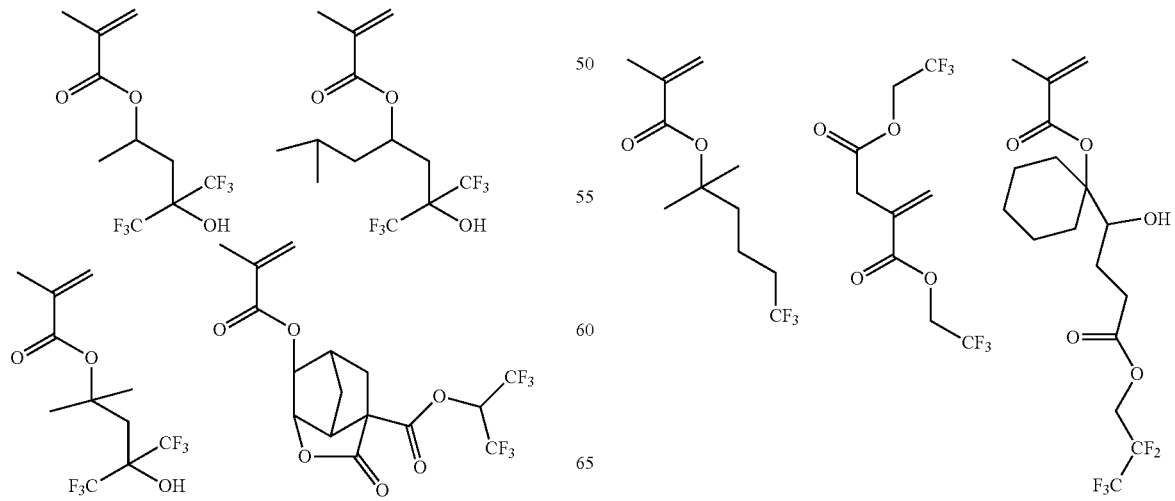

-continued

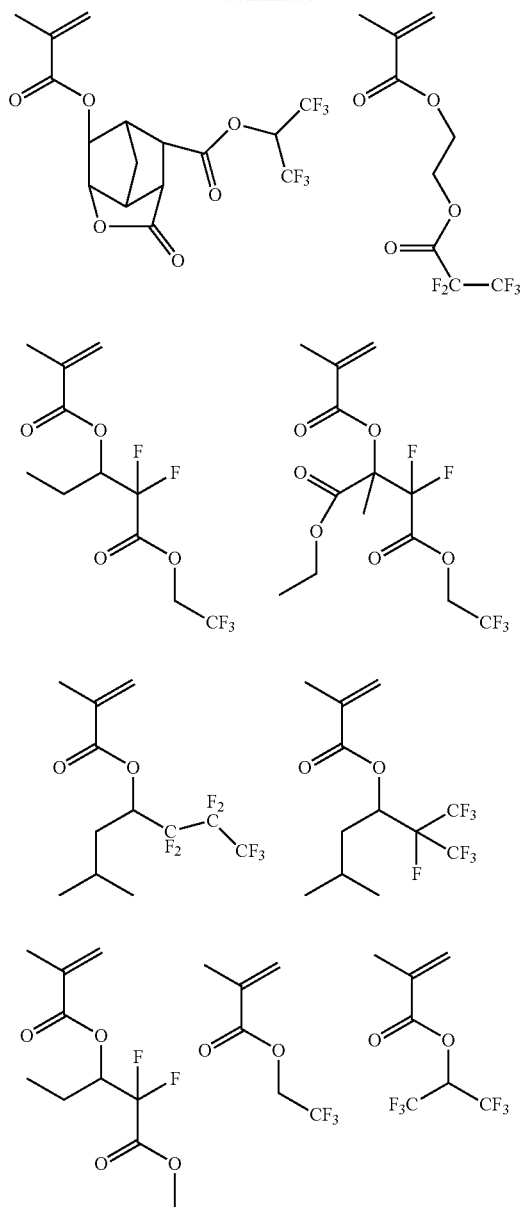

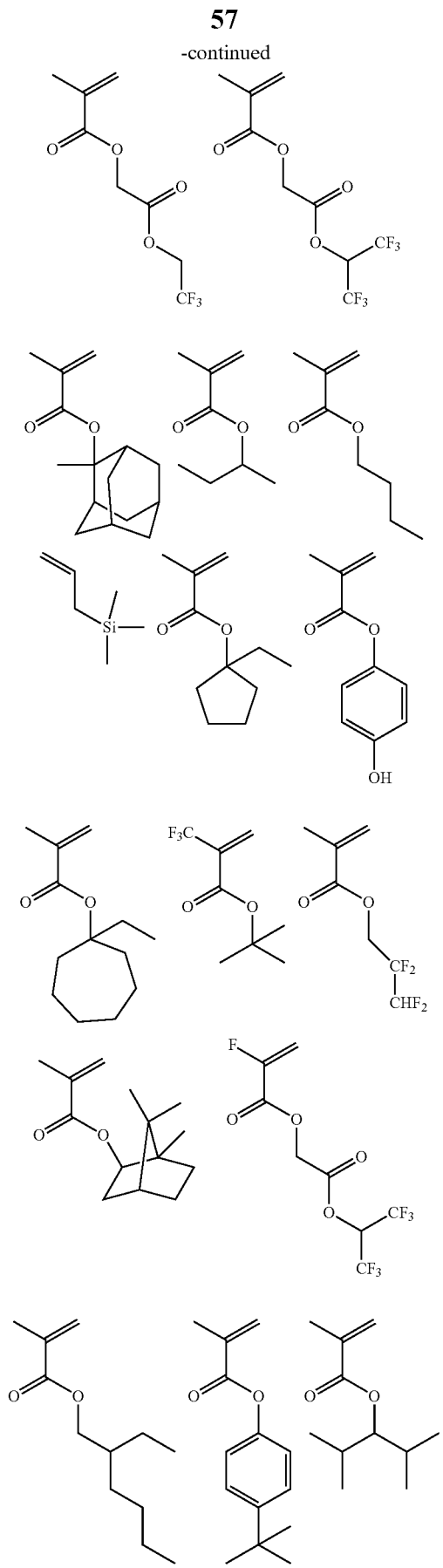

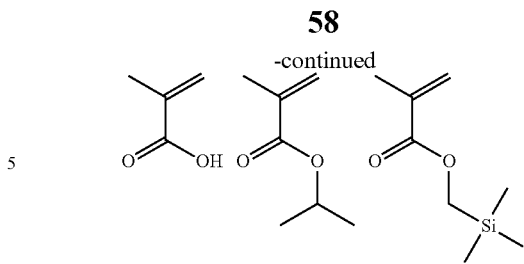

The hydrophobic resin (E) may be used singly or in combination of two or more kinds thereof.

It is preferable to use a mixture of two or more kinds of hydrophobic resins (E) having different levels of surface energy from the viewpoint of satisfying both the immersion liquid tracking properties and the development characteristics upon liquid immersion exposure.

The content of the hydrophobic resin (E) in the composition is preferably 0.01% to 10% by mass, more preferably 0.05% to 8% by mass, and still more preferably 0.1% to 5% by mass, with respect to the total solid content in the composition.

<Solvent (F)>

The composition of the embodiment of the present invention may include a solvent. In the composition of the embodiment of the present invention, a known resist solvent can be appropriately used. For example, the known solvents disclosed in paragraphs <0665> to <0670> of US2016/0070167A1, paragraphs <0210> to <0235> of US2015/0004544A1, paragraphs <0424> to <0426> of US2016/0237190A1, and paragraphs <0357> to <0366> of US2016/0274458A1 can be suitably used.

Examples of the solvent which can be used in the preparation of the composition include organic solvents such as alkylene glycol monoalkyl ether carboxylate, alkylene glycol monoalkyl ether, alkyl lactate ester, alkyl alkoxypropionate, a cyclic lactone (preferably having 4 to 10 carbon atoms), a monoketone compound (preferably having 4 to 10 carbon atoms) which may have a ring, alkylene carbonate, alkyl alkoxyacetate, and alkyl pyruvate.

A mixed solvent obtained by mixing a solvent having a hydroxyl group in the structure and a solvent having no hydroxyl group in the structure may be used as the organic solvent.

As the solvent having a hydroxyl group and the solvent having no hydroxyl group, a the above-mentioned exemplary compounds can be appropriately selected, but as the solvent including a hydroxyl group, an alkylene glycol monoalkyl ether, alkyl lactate, or the like is preferable, and propylene glycol monomethyl ether (PGME), propylene glycol monoethyl ether (PGEE), methyl 2-hydroxyisobutyrate, or ethyl lactate is more preferable. Further, as the solvent having no hydroxyl group, alkylene glycol monoalkyl ether acetate, alkyl alkoxy propionate, a monoketone compound which may have a ring, cyclic lactone, alkyl acetate, or the like is preferable; among these, propylene glycol monomethyl ether acetate (PGMEA), ethyl ethoxypropionate, 2-heptanone, γ-butyrolactone, cyclohexanone, cyclopentanone, or butyl acetate is more preferable; and propylene glycol monomethyl ether acetate, γ-butyrolactone, ethyl ethoxypropionate, cyclohexanone, cyclopentanone, or 2-heptanone is still more preferable. As the solvent having no hydroxyl group propylene carbonate is also preferable.

The mixing ratio (mass ratio) of the solvent having a hydroxyl group to the solvent having no hydroxyl group is 1/99 to 99/1, preferably 10/90 to 90/10, and more preferably 20/80 to 60/40. A mixed solvent containing 50% by mass or more of the solvent having no hydroxyl group is preferable from the viewpoint of coating evenness.

The solvent preferably includes propylene glycol monomethyl ether acetate, and may be a single solvent formed of propylene glycol monomethyl ether acetate or a mixed solvent of two or more kinds of solvents containing propylene glycol monomethyl ether acetate.

<Crosslinking Agent (G)>

The composition of the embodiment of the present invention may include a compound capable of crosslinking a resin by the action of an acid (hereinafter also referred to as a crosslinking agent (G)). As the crosslinking agent (G), a known compound can be appropriately used. For example, the known compounds disclosed in paragraphs <0379> to <0431> of US2016/0147154A1 and paragraphs <0064> to <0141> of US2016/0282720A1 can be suitably used as the crosslinking agent (G).

The crosslinking agent (G) is a compound having a crosslinkable group which can crosslink a resin, and examples of the crosslinkable group include a hydroxymethyl group, an alkoxymethyl group, an acyloxymethyl group, an alkoxymethyl ether group, an oxirane ring, and an oxetane ring.

The crosslinkable group is preferably a hydroxymethyl group, an alkoxymethyl group, an oxirane ring, or an oxetane ring.

The crosslinking agent (G) is preferably a compound (which also includes a resin) having two or more crosslinkable groups.

The crosslinking agent (G) is preferably a phenol derivative, a urea-based compound (compound having a urea structure), or a melamine-based compound (compound having a melamine structure), which has a hydroxymethyl group or an alkoxymethyl group.

The crosslinking agent may be used singly or in combination of two or more kinds thereof.

The content of the crosslinking agent (G) is preferably 1% to 50% by mass, more preferably 3% to 40% by mass, and still more preferably 5% to 30% by mass.

<Surfactant (H)>

The composition of the embodiment of the present invention may include a surfactant. In a case where the composition includes the surfactant, a fluorine-based and/or silicon-based surfactant (specifically a fluorine-based surfactant, a silicon-based surfactant, or a surfactant having both of a fluorine atom and a silicon atom) is preferable.

By incorporating the surfactant into the composition of the embodiment of the present invention, it becomes possible to form a pattern which has excellent adhesiveness and decreased development defects with good sensitivity and resolution in a case of using an exposure light source of 250 nm or less, and particularly 220 nm or less.

Examples of the fluorine-based and/or silicon-based surfactant include the surfactants described in paragraph <0276> of US2008/0248425A.

In addition, another surfactant other than the fluorine-based and/or silicon-based surfactant, described in paragraph <0280> of US2008/0248425A can also be used.

These surfactants may be used alone or in combination of two or more kinds thereof.

In a case where the composition of the embodiment of the present invention includes a surfactant, the content of the surfactant is preferably 0.0001% to 2% by mass, and more preferably 0.0005% to 1% by mass, with respect to the total solid content of the composition.

On the other hand, by setting the amount of the surfactant to 10 ppm or more with respect to the total solid content of the composition, the hydrophobic resin (E) is further unevenly distributed on the surface. Thus, a surface of the actinic ray-sensitive or radiation-sensitive film can be made more hydrophobic, which can enhance water tracking properties upon liquid immersion exposure.

(Other Additives)

The composition of the embodiment of the present invention may further include an acid proliferation agent, a dye, a plasticizer, a light sensitizer, a light absorber, an alkali-soluble resin, a dissolution inhibitor, a dissolution promoter, or the like.

<Preparation Method>

The concentration of the solid content of the composition of the embodiment of the present invention is preferably 1.0% to 10% by mass, more preferably 2.0% to 5.7% by mass, and still more preferably 2.0% to 5.3% by mass. The concentration of the solid content refers to a mass percentage of resist components excluding the solvent, with respect to the total mass of the composition.

In addition, the film thickness of the actinic ray-sensitive or radiation-sensitive film including the composition of the embodiment of the present invention is preferably 90 nm or less, and more preferably 85 nm or less, from the viewpoint of improving resolving power. The lower limit is not particularly limited, but is preferably 1 µm or more, more preferably 3 or more, still more preferably 5 µm or more, and particularly preferably 10 µm or more. By setting the concentration of the solid content in the composition to be in an appropriate range to provide an appropriate viscosity and improve the coatability or film forming properties, such a film thickness can be obtained.

The composition of the embodiment of the present invention is used after being applied onto a predetermined support (substrate) to be used after dissolving the above-mentioned components in a predetermined organic solvent, preferably the mixed solvent, and filtering. A pore size of the filter is preferably 0.1 µm or less, more preferably 0.05 µm or less, and still more preferably 0.03 µm or less. The filter is preferably a polytetrafluoroethylene-, polyethylene- or nylon-made filter. In the filtration using a filter, as disclosed in, for example, JP2002-062667A, circulating filtration may be performed or the filtration may be performed by connecting plural kinds of filters in series or in parallel. In addition, the composition may be filtered in plural times. Furthermore, the composition may be subjected to a deaeration treatment or the like before or after filtration using a filter.

<Applications>

The composition of the embodiment of the present invention relates to an actinic ray-sensitive or radiation-sensitive resin composition whose properties change by undergoing a reaction upon irradiation with actinic rays or radiation. More specifically, the composition of the embodiment of the present invention relates to an actinic ray-sensitive or radiation-sensitive resin composition which can be used in a step of manufacturing a semiconductor such as an integrated circuit (IC), for manufacture of a circuit board for a liquid crystal, a thermal head, or the like, the manufacture of a mold structure for imprinting, other photofabrication processes, a planographic printing plate, or an acid-curable composition. A pattern formed in the present invention can be used in an etching step, an ion implantation step, a bump electrode forming step, a rewiring forming step, a microelectromechanical system (MEMS), or the like.

[Pattern Forming Method]

The present invention also relates to a pattern forming method using the actinic ray-sensitive or radiation-sensitive resin composition. Hereinafter, the pattern forming method of the embodiment of the present invention will be described. Further, the actinic ray-sensitive or radiation-sensitive film of the present invention will also be described, together with the pattern forming method.

The pattern forming method of the embodiment of the present invention includes:

(i) a step of forming a resist film (actinic ray-sensitive or radiation-sensitive film) on a support using the above-mentioned actinic ray-sensitive or radiation-sensitive resin composition (resist film forming step), (ii) a step of exposing the resist film (irradiating actinic rays or radiation) (exposing step), and (iii) a step of developing the exposed resist film using a developer (developing step).

The pattern forming method of the embodiment of the present invention is not particularly limited as long as it includes the (i) to (iii) steps, and may further include the following steps.

In the pattern forming method of the embodiment of the present invention, the exposing method in the (ii) exposing step may be liquid immersion exposure.

The pattern forming method of the embodiment of the present invention preferably includes a (iv) prebaking (PB) step before the (ii) exposing step.

The pattern forming method of the embodiment of the present invention preferably includes a (v) post-exposure baking (PEB) step after the (ii) exposing step and before the (iii) developing step.

The pattern forming method of the embodiment of the present invention may include the (ii) exposing step a plurality of times.

The pattern forming method of the embodiment of the present invention may include the (iv) prebaking heating step a plurality of times.

The pattern forming method of the embodiment of the present invention may include the (v) post-exposure baking step a plurality of times.

In the pattern forming method of the embodiment of the present invention, the above-mentioned (i) film forming step, (ii) exposing step, and (iii) developing step can be performed by a generally known method.

In addition, a resist underlayer film (for example, spin on glass (SOG), spin on carbon (SOC), and an antireflection film) may be formed between the resist film and the support, as desired. As a material constituting the resist underlayer film, known organic or inorganic materials can be appropriately used.

A protective film (topcoat) may be formed on the upper layer of the resist film. As the protective film, a known material can be appropriately used. The compositions for forming a protective film disclosed in, for example, US2007/0178407A, US2008/0085466A, US2007/0275326A, US2016/0299432A, US2013/0244438A, or WO2016/157988A can be suitably used. The composition for forming a protective film preferably includes the above-mentioned acid diffusion control agent.

A protective film may be formed on the upper layer of the resist film containing the above-mentioned hydrophobic resin.

The support is not particularly limited, and a substrate which is generally used in a process for manufacturing a semiconductor such as an IC, and a process for manufacturing a circuit board for a liquid crystal, a thermal head, or the like, and other lithographic processes of photofabrication can be used. Specific examples of the support include an inorganic substrate such as silicone, $SiO_2$, and SiN.

For any of the (iv) prebaking step and the (v) post-exposure baking step, the heating temperature is preferably 70° C. to 130° C., and more preferably 80° C. to 120° C.

For any of the (iv) prebaking step and the (v) post-exposure baking step, the heating time is preferably 30 to 300 seconds, more preferably 30 to 180 seconds, and still more preferably 30 to 90 seconds.

Heating may be performed using a means comprised in an exposure device and a development device, or may also be performed using a hot plate or the like.

The light source wavelength used in the exposing step is not particularly limited, and examples thereof include infrared rays, visible light, ultraviolet rays, far ultraviolet rays, extreme ultraviolet rays (EUV), X-rays, and electron beams. Among those, far ultraviolet rays are preferable, whose wavelength is preferably 250 nm or less, more preferably 220 nm or less, and still more preferably 1 to 200 nm. Specific examples thereof include a KrF excimer laser (248 nm), an ArF excimer laser (193 nm), an $F_2$ excimer laser (157 nm), X-rays, EUV (13 nm), and electron beams, and the KrF excimer laser, the ArF excimer laser, EUV, or the electron beams are preferable.

In the (iii) developing step, the developer may be either an alkali developer or a developer including an organic solvent (hereinafter also referred to as an organic developer).

As the alkali developer, a quaternary ammonium salt typified by tetramethylammonium hydroxide is usually used, but in addition to the developer, an aqueous alkali solution such as an inorganic alkali, primary to tertiary amines, alcohol amine, and cyclic amine can also be used.

In addition, the alkali developer may include an appropriate amount of alcohols and/or a surfactant. The alkali concentration of the alkali developer is usually 0.1% to 20% by mass. The pH of the alkali developer is usually 10 to 15.

The time for performing development using the alkali developer is usually 10 to 300 seconds.

The alkali concentration, the pH, and the development time using the alkali developer can be appropriately adjusted depending on a pattern formed.

As the organic developer, a developer including at least one organic solvent selected from the group consisting of a ketone-based solvent, an ester-based solvent, an alcohol-based solvent, an amide-based solvent, an ether-based solvent, and hydrocarbon-based solvents is preferable.

Examples of the ketone-based solvent include 1-octanone, 2-octanone, 1-nonanone, 2-nonanone, acetone, 2-heptanone (methyl amyl ketone), 4-heptanone, 1-hexanone, 2-hexanone, diisobutyl ketone, cyclohexanone, methylcyclohexanone, phenyl acetone, methyl ethyl ketone, methyl isobutyl ketone, acetyl acetone, acetonyl acetone, ionone, diacetonyl alcohol, acetyl carbinol, acetophenone, methyl naphthyl ketone, isophorone, and propylene carbonate.

Examples of the ester-based solvent include methyl acetate, butyl acetate, ethyl acetate, isopropyl acetate, pentyl acetate, isopentyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate, propyl lactate, butyl butanoate, methyl 2-hydroxyisobutyrate, isoamyl acetate, isobutyl isobutyrate, and butyl propionate.

As the alcohol-based solvent, the amide-based solvent, the ether-based solvent, and the hydrocarbon-based solvent, the solvents disclosed in paragraphs <0715> to <0718> of US2016/0070167A1 can be used.

A plurality of the solvents may be mixed or the solvent may be used in admixture with a solvent other than those described above or water. The moisture content in the entire developer is preferably less than 50% by mass, more preferably less than 20% by mass, and still more preferably less than 10% by mass, and particularly preferably, moisture is not substantially included.

The content of the organic solvent with respect to the organic developer is preferably 50% to 100% by mass, more preferably 80% to 100% by mass, still more preferably 90% to 100% by mass, and particularly preferably 95% to 100% by mass, with respect to the total amount of the developer.

The organic developer may include an appropriate amount of a known surfactant, as desired.

The content of the surfactant is usually 0.001% to 5% by mass, preferably 0.005% to 2% by mass, and still more preferably 0.01% to 0.5% by mass, with respect to the total amount of the developer.

The organic developer may include the above-mentioned acid diffusion control agent.

Examples of the developing method include a method in which a substrate is immersed in a tank filled with a developer for a certain period of time (a dip method), a method in which development is performed by heaping a developer up onto the surface of a substrate by surface tension, and then leaving it to stand for a certain period of time (a puddle method), a method in which a developer is sprayed on the surface of a substrate (a spray method), and a method in which a developer is continuously discharged onto a substrate spun at a constant rate while scanning a developer discharging nozzle at a constant rate (a dynamic dispense method).

A combination of a step of performing development using an aqueous alkali solution (an alkali developing step) and a step of performing development using a developer including an organic solvent (an organic solvent developing step) may be used. Thus, a finer pattern can be formed since a pattern can be formed by keeping only a region with an intermediate exposure intensity from not being dissolved.

It is preferable that after the (iii) developing step, a step of performing washing using a rinsing liquid (a rinsing step) is included.

As the rinsing liquid used in the rinsing step after the developing step using an alkali developer, for example, pure water can be used. Pure water may include an appropriate amount of a surfactant. In this case, after the developing step or the rinsing step, a treatment for removing the developer or the rinsing liquid adhering on a pattern by a supercritical fluid may be added. In addition, after the rinsing treatment or the treatment using a supercritical fluid, a heating treatment for removing moisture remaining in the pattern may be performed.

The rinsing liquid used in the rinsing step after the step of performing development using a developer including an organic solvent is not particularly limited as long as the rinsing liquid does not dissolve the resist pattern, and a solution including a common organic solvent can be used. As the rinsing liquid, a rinsing liquid including at least one organic solvent selected from the group consisting of a hydrocarbon-based solvent, a ketone-based solvent, an ester-based solvent, an alcohol-based solvent, an amide-based solvent, and an ether-based solvent is preferably used.

Specific examples of the hydrocarbon-based solvent, the ketone-based solvent, the ester-based solvent, the alcohol-based solvent, the amide-based solvent, and the ether-based solvent are the same solvents as those described for the developer including an organic solvent.

As the rinsing liquid used in the rinsing step in this case, a rinsing liquid including a monohydric alcohol is more preferable.

Here, examples of the monohydric alcohol used in the rinsing step include linear, branched, or cyclic monohydric alcohols. Specific examples thereof include 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol, 4-octanol, and methyl isobutyl carbinol. Examples of the monohydric alcohol having 5 or more carbon atoms include 1-hexanol, 2-hexanol, 4-methyl-2-pentanol, 1-pentanol, 3-methyl-1-butanol, and methyl isobutyl carbinol.

The respective components in plural number may be mixed or the components may be used in admixture with an organic solvent other than the above solvents.

The moisture content in the rinsing liquid is preferably 10% by mass or less, more preferably 5% by mass or less, and still more preferably 3% by mass or less. By setting the moisture content to 10% by mass or less, good development characteristics can be obtained.

The rinsing liquid may include an appropriate amount of a surfactant.

In the rinsing step, the substrate that has been subjected to development using an organic developer is subjected to a washing treatment using a rinsing liquid including an organic solvent. A method for the washing treatment method is not particularly limited, but examples thereof include a method in which a rinsing liquid is continuously discharged on a substrate rotated at a constant rate (a rotation application method), a method in which a substrate is immersed in a tank filled with a rinsing liquid for a certain period of time (a dip method), and a method in which a rinsing liquid is sprayed on a substrate surface (a spray method). Among those, it is preferable that a washing treatment is performed using the rotation application method, and a substrate is rotated at a rotation speed of 2,000 to 4,000 rpm after washing, thereby removing the rinsing liquid from the substrate. Furthermore, it is also preferable that the method includes a baking step after the rinsing step (post-baking). The developer and the rinsing liquid remaining between and inside the patterns are removed by the baking step. In the heating step after the rinsing step, the heating temperature is usually 40° C. to 160° C., and preferably 70° C. to 95° C., and typically for 10 seconds to 3 minutes, and preferably for 30 seconds to 90 seconds.

It is preferable that various materials (for example, a resist solvent, a developer, a rinsing liquid, a composition for forming an antireflection film, and a composition for forming a topcoat) used in the actinic ray-sensitive or radiation-sensitive resin composition of the embodiment of the present invention, and the pattern forming method of the embodiment of the present invention do not include impurities such as metals. The content of the impurities included in these materials is preferably 1 ppm by mass or less, more preferably 100 ppt by mass or less, and still more preferably 10 ppt by mass or less, and particularly preferably, the impurities are not substantially included (no higher than a detection limit of a measurement device).

Examples of a method for removing impurities such as metals from the various materials include filtration using a filter. As for the filter pore diameter, the pore size is preferably 10 nm or less, more preferably 5 nm or less, and still more preferably 3 nm or less. As for the materials of a filter, a polytetrafluoroethylene-made filter, a polyethylene-made filter, and a nylon-made filter are preferable. As the filter, a filter which had been washed with an organic solvent in advance may be used. In the step of filtration using a filter, plural kinds of filters connected in series or in parallel may be used. In a case of using the plural kinds of filters, a combination of filters having different pore diameters and/or materials may be used. In addition, various materials may be filtered plural times, and the step of filtering plural times may be a circulatory filtration step. As the filter, a filter having a reduced amount of elutes as disclosed in JP2016-201426A is preferable.

In addition to the filtration using a filter, removal of impurities by an adsorbing material may be performed, or a combination of filtration using a filter and an adsorbing material may be used. As the adsorbing material, known adsorbing materials can be used, and for example, inorganic adsorbing materials such as silica gel and zeolite, and organic adsorbing materials such as activated carbon can be used. Examples of the metal adsorbing agent include those disclosed in JP2016-206500A.

In addition, as a method for reducing the impurities such as metals included in various materials, metal content selects the less material as a raw material constituting the various materials, performing filtering using a filter of the raw material constituting the various materials, equipment the inner and a method such as performing distillation under conditions suppressing as much as possible equal to contamination is lined with TEFLON (registered trademark). Preferred conditions in the filtering using a filter to be performed on the raw material constituting the various materials are similar to the above-mentioned conditions.

In order to prevent impurities from being incorporated, it is preferable that various materials are stored in the container described in US2015/0227049A, JP2015-123351A, or the like.

A method for improving the surface roughness of a pattern may be applied to a pattern formed by the pattern forming method of the embodiment of the present invention. Examples of the method for improving the surface roughness of a pattern include the method of treating a resist pattern by plasma of a hydrogen-containing gas disclosed in US2015/0104957A. In addition, known methods as described in JP2004-235468A, US2010/0020297A, and Proc. of SPIE Vol. 832883280N-1 "EUV Resist Curing Technique for LWR Reduction and Etch Selectivity Enhancement" may be applied.

In addition, a pattern formed by the method can be used as a core material (core) of the spacer process disclosed in JP1991-270227A (JP-H03-270227A) and US2013/0209941A, for example.

[Method for Manufacturing Electronic Device]

In addition, the present invention further relates to a method for manufacturing an electronic device, including the above-described pattern forming method, and an electronic device manufactured by the method for manufacturing an electronic device. The electronic device of an embodiment of the present invention is suitably mounted on electric or electronic equipment (for example, home electronics, office automation (OA)-related equipment, media-related equipment, optical equipment, and telecommunication equipment).

EXAMPLES

Hereinbelow, the present invention will be described in more detail with reference to Examples. The materials, the amounts of materials used, the proportions, the treatment details, the treatment procedure, or the like shown in the Examples below may be modified if appropriate as long as the modifications do not depart from the spirit of the present invention. Therefore, the scope of the present invention should not be construed as being limited to the Examples shown below.

[Preparation of Actinic Ray-Sensitive or Radiation-Sensitive Resin Composition]

Various components included in the actinic ray-sensitive or radiation-sensitive resin compositions shown in Tables 3-1 and 3-2 are set forth below.

<Resin (A)>

As the resins A-1 to A-13 shown in Tables 3-1 and 3-2, resins synthesized in accordance with a synthesis method which will be described later were each used. The molar ratios, the weight-average molecular weight (Mw), and the dispersity (Mw/Mn) of the repeating units in the resins A-1 to A-13 are shown in Table 1.

Furthermore, the weight-average molecular weight (Mw) and the dispersity (Mw/Mn) of the resins A-1 to A-13 were measured by means of GPC (carrier: tetrahydrofuran (THF)) (an amount in terms of polystyrene). In addition, the compositional ratios (ratio in % by mole) of the resins were measured by means of $^{13}$C-nuclear magnetic resonance (NMR).

The monomer structures used for the synthesis of the resins A-1 to A-13 are set forth below.

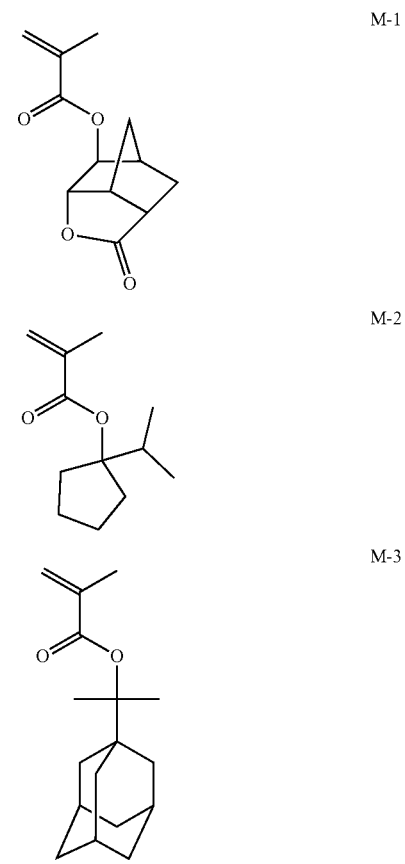

-continued
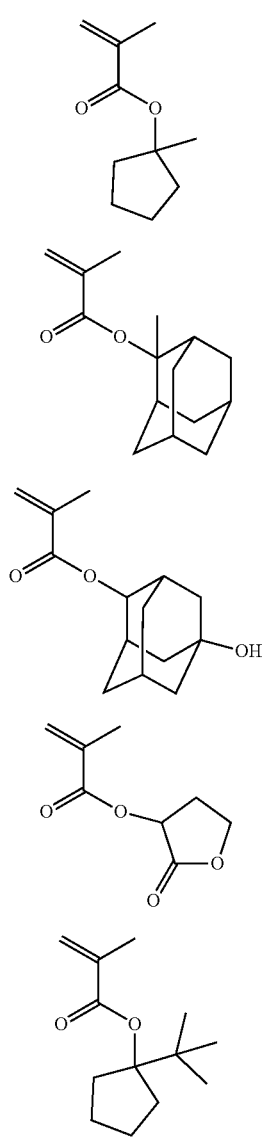
M-4
M-5
M-6
M-7
M-8
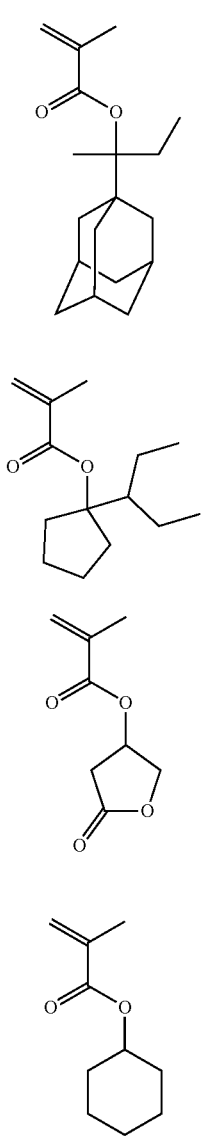
M-9
M-10
M-11
M-12
TABLE 1
| | First component | | Second component | | Third component | | Fourth component | | Fifth component | | | |
|---|---|---|---|---|---|---|---|---|---|---|---|---|
| | Type | % by mole | Type | % by mole | Type | % by mole | Type | % by mole | Type | % by mole | Mw | Dispersity |
| A-1 | M-1 | 40 | M-2 | 50 | M-3 | 10 | | | | | 16,900 | 1.7 |
| A-2 | M-1 | 40 | M-2 | 60 | | | | | | | 10,600 | 1.5 |
| A-3 | M-1 | 50 | M-4 | 50 | | | | | | | 6,800 | 1.4 |
| A-4 | M-1 | 20 | M-4 | 40 | M-5 | 10 | M-6 | 10 | M-7 | 20 | 7,200 | 1.4 |
| A-5 | M-1 | 40 | M-8 | 60 | | | | | | | 19,000 | 1.7 |
| A-6 | M-1 | 40 | M-2 | 50 | M-9 | 10 | | | | | 17,200 | 1.7 |
| A-7 | M-1 | 40 | M-8 | 50 | M-9 | 10 | | | | | 18,800 | 1.8 |
| A-8 | M-1 | 40 | M-10 | 60 | | | | | | | 19,900 | 1.8 |
| A-9 | M-11 | 40 | M-2 | 60 | | | | | | | 17,500 | 1.6 |
| A-10 | M-1 | 40 | M-2 | 60 | | | | | | | 20,200 | 1.7 |
| A-11 | M-1 | 20 | M-2 | 50 | M-11 | 20 | M-12 | 10 | | | 15,600 | 1.5 |
| A-12 | M-1 | 30 | M-2 | 70 | | | | | | | 19,900 | 1.7 |
| A-13 | M-1 | 40 | M-2 | 20 | M-10 | 40 | | | | | 16,800 | 1.7 |

Synthesis Example: Synthesis of Resin A-1, Resin A-2, and Resins A-5 to A-13

211.5 parts by mass of cyclohexanone was heated to 80° C. under a nitrogen gas stream. While stirring the liquid, a mixed solution of 44.5 parts by mass (40% by mole) of the monomer represented by Structural Formula M-1, 49.1 parts by mass (50% by mole) of the monomer represented by Structural Formula M-2, 13.1 parts by mass (10% by mole) of the monomer represented by Structural Formula M-3, 392.8 parts by mass of cyclohexanone, and 1.90 parts by mass of dimethyl 2,2'-azobisisobutyrate [V-601, manufactured by Wako Pure Chemical Industries, Ltd.] was added dropwise thereto for 6 hours to obtain a reaction solution. After finishing the dropwise addition, the reaction solution was further stirred at 80° C. for 2 hours. The obtained reaction solution was left to be cooled and re-precipitated with a large amount of methanol/water (mass ratio of 9:1). The resultant was filtered and the obtained solid was vacuum-dried to obtain 82.2 parts by mass of a resin A-1. The weight-average molecular weight in terms of polystyrene and the dispersity (Mw/Mn) of the obtained resin A-1 were 16,900 and 1.7, respectively.

A resin A-2 and resins A-5 to A-13 were synthesized by the same method as for the resin A-1, except that the monomer species and addition amounts thereof were changed.

Synthesis Example: Synthesis of Resin A-3 and Resin A-4

A copolymer (resin A-3) of Structural Formulae M-1 (50% by mole) and M-4 (50% by mole) were synthesized in accordance with Synthesis Example 1 of WO2012/053527A.

Similarly, a copolymer (resin A-4) of Structural Formulae M-1 (20% by mole), M-4 (40% by mole), M-5 (10% by mole), M-6 (10% by mole), and M-7 (20% by mole) was synthesized according to Synthesis Example 4 of WO2012/053527A.

<Acid Generator A>

The structures of the acid generators A (to which the acid generators B-1 to B-17 correspond) and the acid generator B-18 shown in Tables 3-1 and 3-2 are set forth below. In addition, the pKa's of the first acids generated by the acid generators A are shown in Tables 3-1 and 3-2. The pKa's of the first acids generated by the acid generators A were measured by the above-mentioned method.

B-1
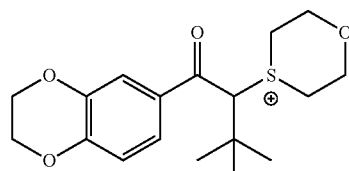

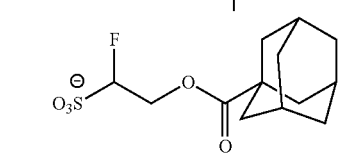

B-2
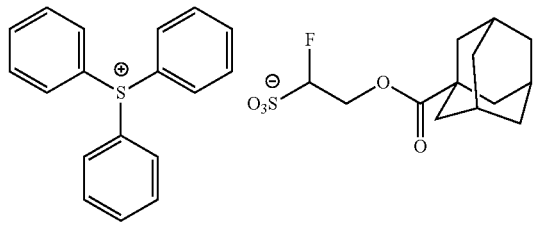

B-3
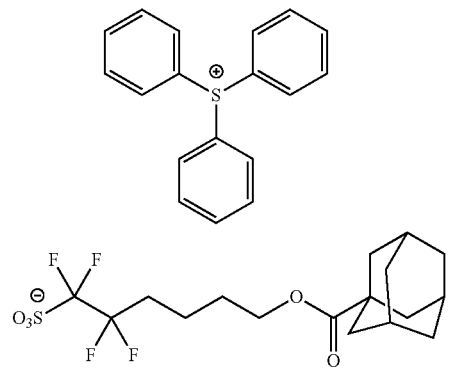

B-4
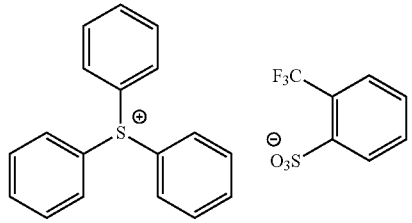

B-5
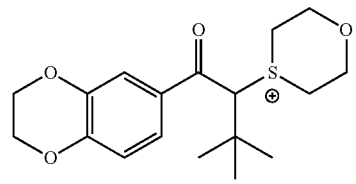

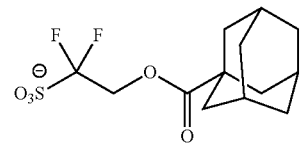

B-6
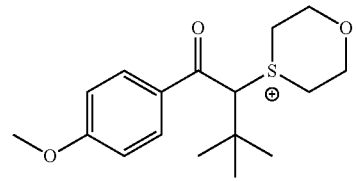

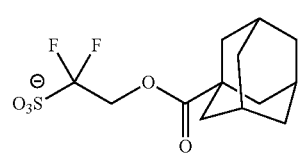

B-7
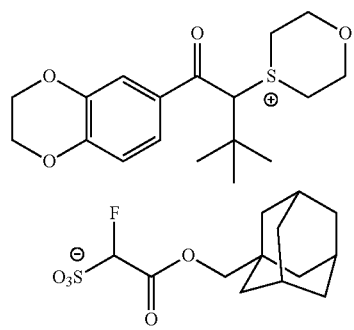
B-8
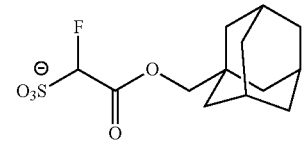
B-9
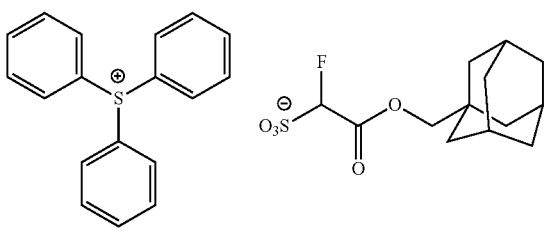
B-10
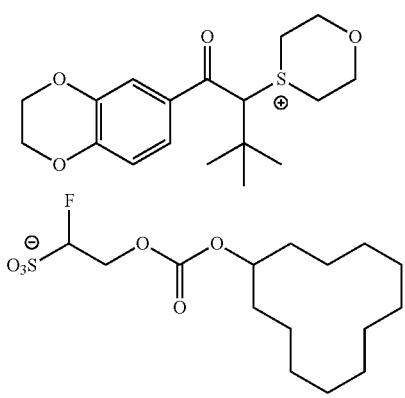
B-11
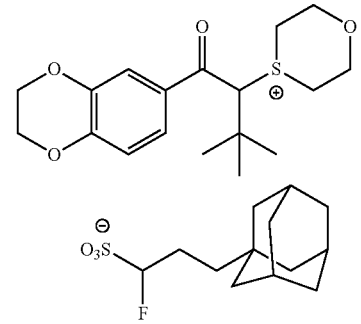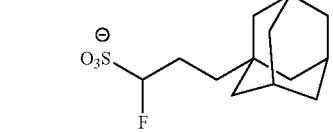
B-12
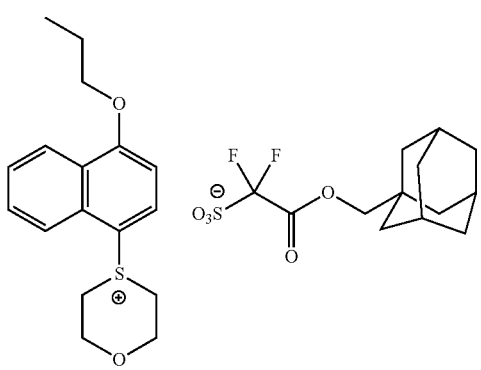
B-13
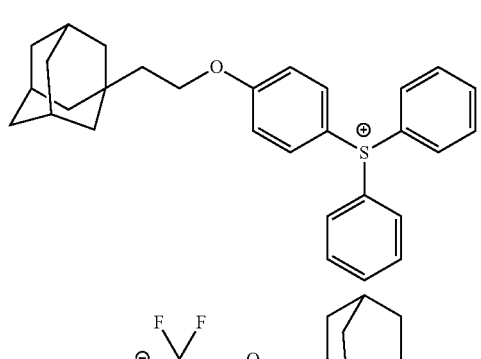
B-14
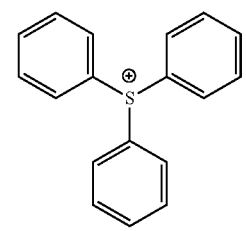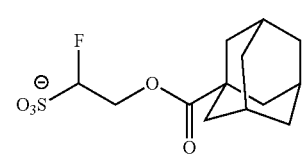
B-15
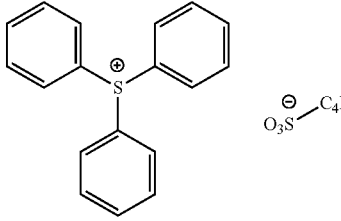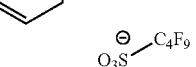
B-16
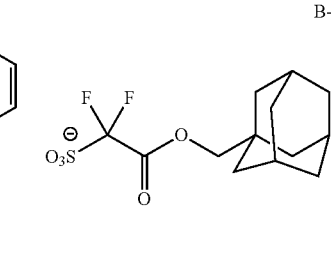

-continued

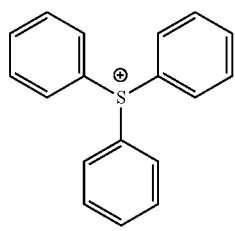
B-17

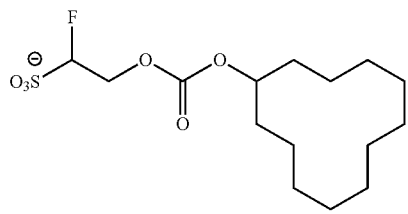

B-18

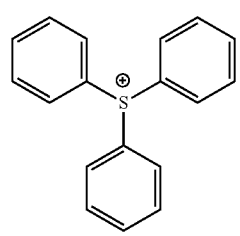
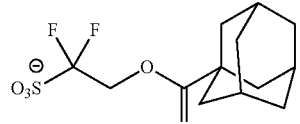

<Acid Generator B>

The structures of the acid generators B (to which the acid generators C-1 to C-9 correspond) shown in Tables 3-1 and 3-2 are set forth below. In addition, the pKa's of the second acids generated by the acid generators B are shown in Tables 3-1 and 3-2. The pKa's of the second acids generated by the acid generators B were measured by the above-mentioned method.

C-1

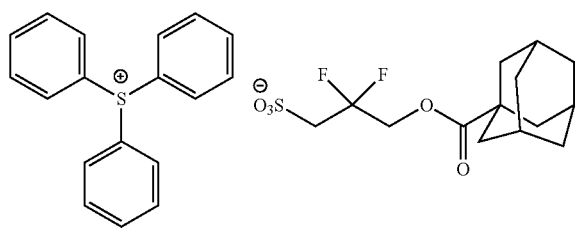

C-2

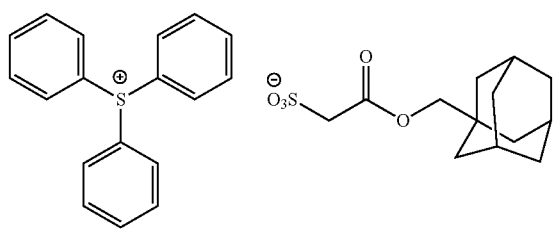

-continued

C-3

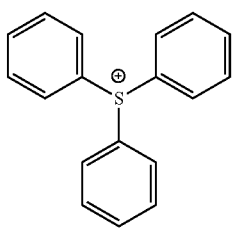
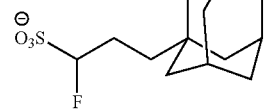

C-4

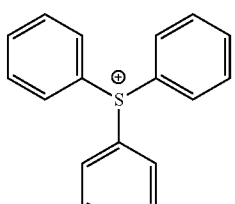
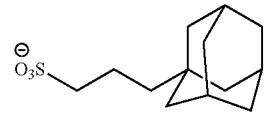

C-5

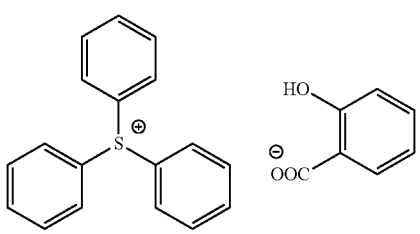
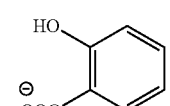

C-6

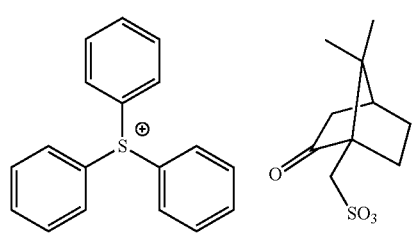

C-7

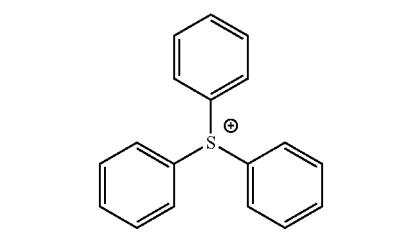

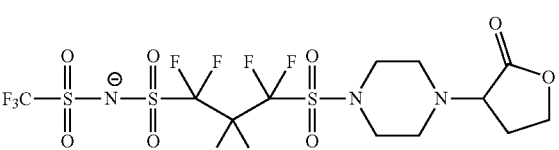

C-8

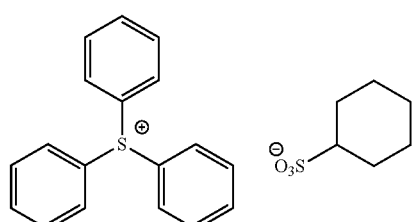
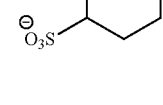

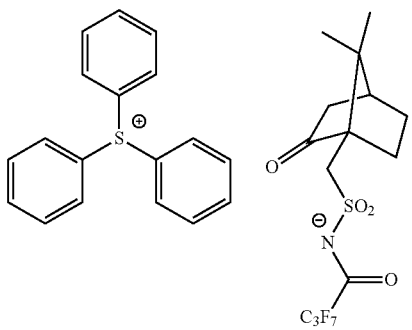

C-9

(Calculation of k0 and k'0)

Moreover, the decomposition reaction rate k0 of the acid-decomposable group by the first acid generated from the acid generator A and the decomposition reaction rate k'0 of the acid-decomposable group by the second acid generated from the acid generator B were determined, based on the above-mentioned method.

Hereinafter, methods for calculating k0 and k'0 will be described by way of examples of the actinic ray-sensitive or radiation-sensitive resin composition of Example 1.

Calculation of k0

A composition for forming an organic antireflection film, ARC29A (manufactured by Brewer Science Ltd.), was applied onto a silicon wafer and baked at 205° C. for 60 seconds to form an antireflection film having a film thickness of 86 nm. Subsequently, a test resist composition prepared by a method which will be described later was applied the antireflection film thus formed, and the film was prebaked at 100° C. for 60 seconds to form a resist film having a thickness of T.

Furthermore, the test resist composition included the resin A-1, a test acid generator A which is an onium salt including (1.94 mmol/the solid content g of the composition) including an anion of an acid generated from the acid generator B-1 and a triphenylsulfonium cation, and a mixed solvent of PGMEA/PGME=90/10 (mass ratio) as a solvent. Incidentally, the concentration of the solid content of the test resist composition was 3.5% by mass. In addition, the thickness T was 90 nm.

Next, a wafer having the resist film formed thereon was exposed at 99 points, not through an exposure mask, using an ArF excimer laser, while increasing an exposure dose from 1 mJ/cm² with an interval of 0.3 mJ/cm². Thereafter, the wafer was post-exposure baked (PEB) at 90° C. for 60 seconds.

Next, using this exposed film after PEB, a film thickness-exposure dose plot diagram after the exposure treatment was created (refer to FIG. 3). Specifically, the film thickness was measured at 99 points in the exposed area, and points corresponding to the exposure dose and the film thickness at each exposed position were plotted in an orthogonal coordinate having the film thicknesses (nm) on the vertical axis and the exposure doses (mJ/cm²) on the horizontal axis to create a film thickness-exposure dose plot diagram after the exposure treatment (refer to FIG. 3).

Next, the exposed film after PEB was subjected to a development treatment with butyl acetate for 30 seconds, and then spin-dried. The film thickness was measured at 99 points in the exposed area, and points corresponding to the exposure dose and the film thickness at each exposed position were plotted in an orthogonal coordinate having the film thicknesses (nm) on the vertical axis and the exposure doses (mJ/cm²) on the horizontal axis to create a film thickness-exposure dose plot diagram after the development treatment (refer to FIG. 2).

A coordinate $E_{0.4}$ on the horizontal axis at a point where the vertical axis on the line corresponded to Thickness T×0.4 and a coordinate $E_{0.8}$ on the horizontal axis at a point where the vertical axis on the line corresponded to Thickness T×0.8 were determined from the obtained film thickness-exposure dose plot diagram after the development treatment. Next, a point corresponding to the coordinate $E_{0.4}$ on the horizontal axis and a point corresponding to the coordinate $E_{0.8}$ on the horizontal axis on the obtained film thickness-exposure dose plot diagram after the exposure treatment were selected, and the absolute value of an inclination of a straight line obtained by connecting the two points was calculated as k0.

Calculation of k'0 k'0 was determined in the same manner as the method for calculating k0, except that a test resist composition (with a concentration of the solid content being 3.5% by mass) including the resin A-1, the acid generator C-1 (1.94 mmol/the solid content g of the composition), and a mixed solvent of PGMEA/PGME=90/10 (mass ratio) as a solvent was used.

In addition, as for the acid generator C-1, since the cation site was a triphenylsulfonium cation, the acid generator C-1 itself was used as the test acid generator B. In a case where the cation site of the acid generator was not the triphenylsulfonium cation, the test acid generator B which is an onium salt including an anion of an acid generated from the acid generator is used for calculation of k'0.

Calculation of k'0/k0

From the results k0 and k'0 obtained above, k'0/k0 of Example 1 was determined. Also with regard to Examples 2 to 32 and Comparative Examples 1 to 9, k'0/k0 was calculated by the same method. k'0/k0 of each of Examples and Comparative Examples are shown in Tables 3-1 and 3-2.

Furthermore, with regard to Examples 2 to 32 and Comparative Examples 1 to 9, measurement of the decomposition reaction rate k0 of the acid-decomposable group was carried out in the same manner as in Example 1 above, using the test acid generator A which is an onium salt including an anion of an acid generated from the acid generator A used in each of Examples and Comparative Examples and a triphenylsulfonium cation.

In addition, in a case where the acid generator A is, B-1, B-5, B-6, B-7, B-9, B-10, B-12, or B-13, B-2, B-18, B-18, B-16, B-17, B-11, B-16, or B-18 is used as each of the test photoacid generators A.

<Basic Compound>

The structures of the basic compounds C'-1 and C'-2 shown in Tables 3-1 and 3-2 are set forth below. Further, the following basic compounds do not correspond to compounds capable of generating an acid upon irradiation with actinic rays or radiation. That is, the decomposition reaction rate (k'0) of the acid-decomposable group is zero.

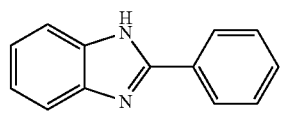

C'-1

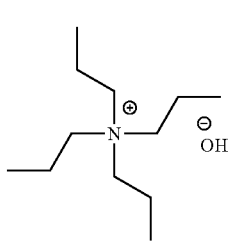

C'-2

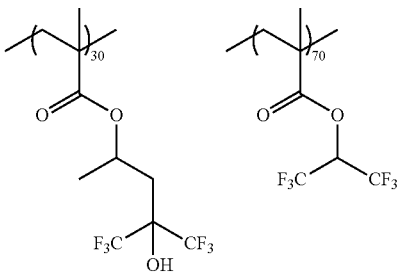

D-4

<Hydrophobic Resin>

The hydrophobic resins D-1 to D-4 shown in Tables 3-1 and 3-2 are set forth below. The weight-average molecular weights (Mw) and the dispersities (Mw/Mn) of the hydrophobic resins shown in Tables 3-1 and 3-2 are shown in Table 2

In addition, the weight-average molecular weights (Mw) and the dispersities (Mw/Mn) of the hydrophobic resins D-1 to D-4 were measured by means of GPC (carrier: THF) (an amount in terms of polystyrene). Further, the compositional ratio (a ratio in % by mole) was measured by $^{13}$C-NMR.

TABLE 2

|  | Mw | Dispersity |
|---|---|---|
| D-1 | 4,300 | 1.37 |
| D-2 | 30,000 | 1.8 |
| D-3 | 7,000 | 1.4 |
| D-4 | 7,100 | 1.89 |

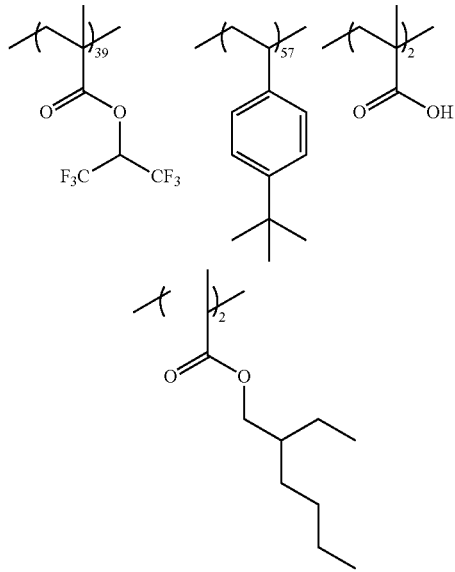

D-1

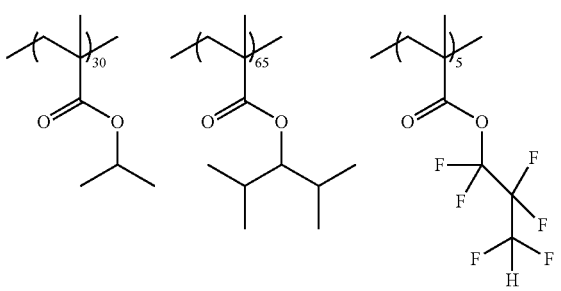

D-2

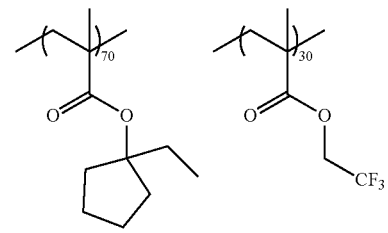

D-3

<Solvent>

The solvents shown in Tables 3-1 and 3-2 are set forth below.

SL-1: Propylene glycol monomethyl ether acetate (PGMEA)
SL-2: Propylene glycol monomethyl ether (PGME)
SL-3: Cyclohexanone
SL-4: γ-Butyrolactone <Preparation of Actinic Ray-Sensitive or Radiation-Sensitive Resin Composition>

The respective components shown in Tables 3-1 and 3-2 were mixed until the concentration of the solid content became 3.5% by mass. Then, the obtained mixed liquid was first filtered through a polyethylene-based filter having a pore diameter of 50 nm, then filtered through a nylon-based filter having a pore diameter of 10 nm, and lastly filtered through a polyethylene-based filter having a pore diameter of 5 nm to prepare an actinic ray-sensitive or radiation-sensitive resin composition (hereinafter also referred to as a resin composition). Further, the "solid content" in the resin composition means all components except for the solvent (F). The obtained resin composition was used in Examples and Comparative Examples.

[Pattern Formation and Various Evaluations]

<Pattern Formation: ArF Liquid Immersion Exposure and Organic Solvent Development>

A composition for forming an organic antireflection film, ARC29SR (manufactured by Brewer Science Ltd.) was applied onto a silicon wafer and baked at 205° C. for 60 seconds to form an antireflection film having a film thickness of 97 nm. The resist composition shown in Tables 3-1 and 3-2 was applied thereonto and baked at 100° C. for 60 seconds to form an actinic ray-sensitive or radiation-sensitive film having a film thickness of 90 nm (resist film).

With regard to the actinic ray-sensitive or radiation-sensitive resin film, a 1:1 line-and-space pattern with a line width 60 nm and a contact hole with a diameter of 45 nm were exposed through a 6% halftone mask, using an ArF excimer laser liquid immersion scanner (manufactured by ASML; XT1700i, NA1.20, C-Quad, outer sigma 0.730, inner sigma 0.630, XY deflection). The exposure dose resulting in each pattern size was taken as an optimal exposure dose. As the immersion liquid, ultrapure water was used.

The exposed resist film was baked at a temperature described in Tables 3-1 and 3-2 (PEB temperature (° C.)(for example, 90° C. in a case of Example 1) for 60 seconds, developed with n-butyl acetate for 30 seconds, and then rinsed with 4-methyl-2-pentanol for 30 seconds. Thereafter, the resultant was spin-dried to obtain a negative tone pattern.

<Performance Evaluation>

(Variation in Pattern Line Width (LWR, nm))

With regard to a pattern with a 60-nm (1:1) line-and-space pattern that had been resolved at an optimal exposure dose, in a case where the pattern was observed from the upper part thereof using a critical dimension scanning electron microscope (SEM (S-9380II manufactured by Hitachi High Technologies Corporation)), the line width was measured at an any point and a measurement deviation thereof was evaluated as 3σ. A smaller value thereof indicates better performance.

Evaluation of LWR was performed according to the following 5-step standard. Incidentally, 4 or more is preferable, and 5 is more preferable.

Evaluation Standard for LWR

"5": 3σ of the deviation is 6.0 nm or less.

"4": 3σ of the deviation is more than 6.0 and 6.5 nm or less.

"3": 3σ of the deviation is more than 6.5 and 7.0 nm or less.

"2": 3σ of the deviation is more than 7.0 and 8.0 nm or less.

"1": 3σ of the deviation is more than 8.0 nm.

The results are shown in Tables 3-1 and 3-2.

(Critical Dimension Uniformity (CDU))

With regard to a contact hole pattern with a diameter of 45 nm that had been resolved at an optimal exposure dose, the diameters of any 100 patterns among the respective hole patterns were measured, and a 3-fold value (3σ) of a standard deviation (σ) calculated from the measurement results was determined to evaluate critical dimension uniformity (CDU) (nm) of the hole diameters. A smaller value of the 3σ means that the critical dimension uniformity (CDU) of the hole diameters of the contact holes is higher.

Evaluation of CDU was performed according to the following 5-step standard.

Further, 4 or more is preferable, and 5 is more preferable.

Evaluation Standard for CDU

"5": 3σ of the deviation is 4.5 nm or less.

"4": 3σ of the deviation is more than 4.5 and 5.0 nm or less.

"3": 3σ of the deviation is more than 5.0 and 5.5 nm or less.

"2": 3σ of the deviation is more than 5.5 and 6.0 nm or less.

"1": 3σ of the deviation is more than 6.0 nm.

The results are shown in Tables 3-1 and 3-2.

Moreover, in Tables 3-1 and 3-2, the contents of the respective components in the actinic ray-sensitive or radiation-sensitive resin composition are all amounts with respect to the total solid content.

Furthermore, in Tables 3-1 and 3-2, the "molecular weight of the second acid" is intended to mean the molecular weight of an acid generated from the acid generator B.

In addition, in Tables 3-1 and 3-2, in a case where the basic compound C'-1 or C'-2 is used, k'0 is zero and k'0/k0 is zero.

TABLE 3-1

| | Actinic ray-sensitive or radiation-sensitive resin composition | | | | | | | | | | | |
|---|---|---|---|---|---|---|---|---|---|---|---|---|
| | Resin having acid-decomposable group | | Acid generator A | | | | | | Acid generator B or basic compound (1) | | | |
| | | | (1) | | | (2) | | | Molecular | | | |
| | Type | Content (% by mass) | Type | pKa | Content (% by mass) | Type | pKa | Content (% by mass) | Type | weight of second acid | pKa | Content (% by mass) | k'0/k0 |
| Example 1 | A-1 | 78.2 | B-1 | −0.82 | 16 | | | | C-1 | 338.4 | 0.77 | 5 | 0.82 |
| Example 2 | A-1 | 78.6 | B-1 | −0.82 | 16 | | | | C-2 | 288.4 | 0.52 | 4.6 | 0.54 |
| Example 3 | A-1 | 76.1 | B-1 | −0.82 | 16 | | | | C-3 | 276.4 | −0.02 | 4.9 | 0.68 |
| Example 4 | A-1 | 78.9 | B-1 | −0.82 | 16 | | | | C-4 | 258.4 | 1.8 | 4.3 | 0.22 |
| Example 5 | A-1 | 88.6 | B-2 | −0.82 | 3.3 | | | | C-3 | 276.4 | −0.02 | 7.3 | 0.71 |
| Example 6 | A-1 | 87 | B-3 | −2.75 | 4 | | | | C-1 | 338.4 | 0.77 | 8.2 | 0.18 |
| Example 7 | A-2 | 78.6 | B-1 | −0.82 | 16 | | | | C-2 | 288.4 | 0.52 | 4.6 | 0.61 |
| Example 8 | A-3 | 87 | B-3 | −2.75 | 4 | | | | C-1 | 338.4 | 0.77 | 8.2 | 0.14 |
| Example 9 | A-1 | 77.7 | B-1 | −0.82 | 16 | | | | C-3 | 276.4 | −0.02 | 3.9 | 0.68 |
| Example 10 | A-1 | 78.6 | B-1 | −0.82 | 16 | B-2 | −0.82 | 0.9 | C-4 | 258.4 | 1.8 | 3.4 | 0.22 |
| Example 11 | A-5 | 80.7 | B-9 | −0.82 | 12 | | | | C-3 | 276.4 | −0.02 | 6.5 | 0.78 |
| Example 12 | A-6 | 80.7 | B-9 | −0.82 | 12 | | | | C-3 | 276.4 | −0.02 | 6.5 | 0.71 |
| Example 13 | A-7 | 80.7 | B-9 | −0.82 | 12 | | | | C-3 | 276.4 | −0.02 | 6.5 | 0.8 |
| Example 14 | A-8 | 82 | B-10 | −0.02 | 11 | | | | C-4 | 258.4 | 1.8 | 6.2 | 0.31 |
| Example 15 | A-9 | 80 | B-9 | −0.82 | 12 | | | | C-1 | 338.4 | 0.77 | 7.2 | 0.76 |
| Example 16 | A-10 | 80 | B-9 | −0.82 | 12 | | | | C-1 | 338.4 | 0.77 | 7.2 | 0.73 |
| Example 17 | A-11 | 80 | B-9 | −0.82 | 12 | | | | C-1 | 338.4 | 0.77 | 7.2 | 0.79 |
| Example 18 | A-12 | 80 | B-9 | −0.82 | 12 | | | | C-1 | 338.4 | 0.77 | 7.2 | 0.81 |
| Example 19 | A-10 | 80 | B-5 | −2.7 | 12 | | | | C-3 | 276.4 | −0.02 | 7.2 | 0.19 |
| Example 20 | A-10 | 81 | B-6 | −2.7 | 11 | | | | C-3 | 276.4 | −0.02 | 7.2 | 0.21 |

TABLE 3-1-continued

Actinic ray-sensitive or radiation-sensitive resin composition

| | Acid generator B or basic compound (2) | | | | | Hydrophobic resin | | Solvent | | PEB temperature [° C.] | Evaluation | |
|---|---|---|---|---|---|---|---|---|---|---|---|---|
| | Type | Molecular weight of second acid | pKa | Content (% by mass) | k'0/k0 | Type | Content (% by mass) | Type | Mass ratio | | LWR | CDU |
| Example 1 | | | | | | D-1 | 0.8 | SL-1/SL-2 | 90/10 | 90 | 5 | 5 |
| Example 2 | | | | | | D-1 | 0.8 | SL-1/SL-2 | 90/10 | 90 | 5 | 5 |
| Example 3 | | | | | | D-2 | 3 | SL-1/SL-2 | 90/10 | 90 | 5 | 5 |
| Example 4 | | | | | | D-1 | 0.8 | SL-1/SL-2 | 90/10 | 90 | 5 | 5 |
| Example 5 | | | | | | D-1 | 0.8 | SL-1/SL-2 | 90/10 | 90 | 5 | 4 |
| Example 6 | | | | | | D-1 | 0.8 | SL-1/SL-3 | 70/30 | 85 | 4 | 4 |
| Example 7 | | | | | | D-1 | 0.8 | SL-1/SL-2 | 90/10 | 90 | 5 | 5 |
| Example 8 | | | | | | D-1 | 0.8 | SL-1/SL-3 | 70/30 | 105 | 4 | 4 |
| Example 9 | C-7 | 595.44 | 4.2 | 1.6 | ≤0.05 | D-1 | 0.8 | SL-1/SL-2 | 90/10 | 90 | 5 | 5 |
| Example 10 | C'-1 | — | — | 0.3 | ≤0.05 | D-1 | 0.8 | SL-1/SL-2 | 90/10 | 90 | 4 | 4 |
| Example 11 | | | | | | D-1 | 0.8 | SL-1/SL-2 | 90/10 | 90 | 5 | 5 |
| Example 12 | | | | | | D-1 | 0.8 | SL-1/SL-2 | 90/10 | 90 | 5 | 5 |
| Example 13 | | | | | | D-1 | 0.8 | SL-1/SL-2 | 90/10 | 90 | 5 | 5 |
| Example 14 | | | | | | D-1 | 0.8 | SL-1/SL-2 | 90/10 | 90 | 5 | 5 |
| Example 15 | | | | | | D-1 | 0.8 | SL-1/SL-2 | 90/10 | 90 | 5 | 5 |
| Example 16 | | | | | | D-1 | 0.8 | SL-1/SL-2 | 90/10 | 90 | 5 | 5 |
| Example 17 | | | | | | D-1 | 0.8 | SL-1/SL-2 | 90/10 | 90 | 5 | 5 |
| Example 18 | | | | | | D-1 | 0.8 | SL-1/SL-2 | 90/10 | 90 | 5 | 5 |
| Example 19 | | | | | | D-1 | 0.8 | SL-1/SL-2 | 90/10 | 85 | 5 | 5 |
| Example 20 | | | | | | D-1 | 0.8 | SL-1/SL-2 | 90/10 | 90 | 5 | 5 |

TABLE 3-2

Actinic ray-sensitive or radiation-sensitive resin composition

| | Resin having acid-decomposable group | | Acid generator A | | | | | | Acid generator B or basic compound (1) | | | | |
|---|---|---|---|---|---|---|---|---|---|---|---|---|---|
| | | | (1) | | | (2) | | | | | | | |
| | Type | Content (% by mass) | Type | pKa | Content (% by mass) | Type | pKa | Content (% by mass) | Type | Molecular weight of second acid | pKa | Content (% by mass) | k'0/k0 |
| Example 21 | A-10 | 80 | B7 | −3.26 | 12 | | | | C-3 | 292.4 | −0.02 | 7.2 | 0.18 |
| Example 22 | A-10 | 88.4 | B-8 | −1.37 | 6.6 | | | | C-3 | 276.4 | −0.02 | 4.2 | 0.38 |
| Example 23 | A-10 | 80.7 | B-9 | −0.82 | 12 | | | | C-3 | 276.4 | −0.02 | 6.5 | 0.8 |
| Example 24 | A-10 | 83.2 | B-12 | −3.26 | 10 | | | | C-3 | 276.4 | −0.02 | 6 | 0.2 |
| Example 25 | A-10 | 86 | B-13 | −2.7 | 9 | | | | C-3 | 276.4 | −0.02 | 4.2 | 0.22 |
| Example 26 | A-10 | 88.4 | B-14 | −0.82 | 6.6 | | | | C-3 | 276.4 | −0.02 | 4.2 | 0.77 |
| Example 27 | A-10 | 88.5 | B-15 | −3.57 | 6.5 | | | | C-3 | 276.4 | −0.02 | 4.2 | 0.09 |
| Example 28 | A-10 | 88.2 | B-16 | −3.26 | 6.8 | | | | C-3 | 276.4 | −0.02 | 4.2 | 0.16 |
| Example 29 | A-1 | 84.6 | B-2 | −0.82 | 9 | | | | C-3 | 276.4 | −0.02 | 5.6 | 0.8 |
| Example 30 | A-1 | 84.8 | B-2 | −0.82 | 11 | B-2 | −0.82 | 2 | C-1 | 338.4 | 0.77 | 1.4 | 0.82 |
| Example 31 | A-10 | 80.5 | B-9 | −0.82 | 8.3 | B-17 | −0.82 | 5.6 | C-3 | 276.4 | −0.02 | 4.8 | 0.8 |
| Example 32 | A-13 | 86.9 | B-11 | −0.02 | 7.5 | | | | C-4 | 258.4 | 1.8 | 4.8 | 0.22 |
| Comparative Example 1 | A-3 | 79.9 | B-3 | −2.75 | 12.1 | | | | C-5 | 138.1 | 3.01 | 5 | ≤0.05 |
| Comparative Example 2 | A-4 | 78.7 | B-3 | −2.75 | 12.1 | | | | C-6 | 232.3 | 1.17 | 6.2 | ≤0.05 |
| Comparative Example 3 | A-2 | 89.7 | B-4 | −1.21 | 7.1 | | | | C-6 | 232.3 | 1.17 | 2.4 | 0.92 |
| Comparative Example 4 | A-1 | 86.6 | B-2 | −0.82 | 11 | | | | C'-1 | — | — | 1.6 | ≤0.05 |
| Comparative Example 5 | A-1 | 86.5 | B-2 | −0.82 | 11 | | | | C'-2 | — | — | 1.7 | ≤0.05 |
| Comparative Example 6 | A-1 | 87.5 | | | | | | | C-1 | 338.4 | 0.77 | 11.7 | — |
| Comparative Example 7 | A-5 | 89.1 | B-16 | −3.26 | 6.8 | | | | C-8 | 164.2 | 2.1 | 3.3 | ≤0.05 |
| Comparative Example 8 | A-10 | 77.5 | B-1 | −0.82 | 16 | | | | C-9 | 427.3 | 0.15 | 5.7 | ≤0.05 |
| Comparative Example 9 | A-1 | 77.5 | B-6 | −2.7 | 5.7 | B-18 | −2.7 | 10.2 | C-7 | 595.4 | 4.2 | 5.5 | ≤0.05 |

TABLE 3-2-continued

| | Acid generator B or basic compound (2) | | | | Hydrophobic resin | | Solvent | | PEB temperature [° C.] | Evaluation | |
|---|---|---|---|---|---|---|---|---|---|---|---|
| | Type | Molecular weight of second acid | pKa | Content (% by mass) | k'0/k0 | Type | Content (% by mass) | Type | Mass ratio | | LWR | CDU |
| Example 21 | | | | | | D-1 | 0.8 | SL-1/SL-2 | 90/10 | 85 | 5 | 5 |
| Example 22 | | | | | | D-1 | 0.8 | SL-1/SL-2 | 90/10 | 90 | 5 | 4 |
| Example 23 | | | | | | D-1 | 0.8 | SL-1/SL-2 | 90/10 | 90 | 5 | 5 |
| Example 24 | | | | | | D-1 | 0.8 | SL-1/SL-2 | 90/10 | 90 | 4 | 4 |
| Example 25 | | | | | | D-1 | 0.8 | SL-1/SL-2 | 90/10 | 90 | 4 | 4 |
| Example 26 | | | | | | D-1 | 0.8 | SL-1/SL-2 | 90/10 | 90 | 5 | 4 |
| Example 27 | | | | | | D-1 | 0.8 | SL-1/SL-2 | 90/10 | 85 | 4 | 4 |
| Example 28 | | | | | | D-1 | 0.8 | SL-1/SL-2 | 90/10 | 85 | 4 | 4 |
| Example 29 | | | | | | D-1 | 0.8 | SL-1/SL-2 | 90/10 | 90 | 5 | 4 |
| Example 30 | | | | | | D-1 | 0.8 | SL-1/SL-2 | 90/10 | 90 | 5 | 5 |
| Example 31 | | | | | | D-1 | 0.8 | SL-1/SL-2 | 90/10 | 90 | 5 | 5 |
| Example 32 | | | | | | D-1 | 0.8 | SL-1/SL-2 | 90/10 | 90 | 5 | 4 |
| Comparative Example 1 | | | | | | D-3 | 3 | SL-1/SL-3/SL-4 | 69/30/1 | 105 | 3 | 3 |
| Comparative Example 2 | | | | | | D-4 | 3 | SL-1/SL-3/SL-4 | 69/30/1 | 105 | 4 | 3 |
| Comparative Example 3 | | | | | | D-1 | 0.8 | SL-1/SL-2 | 90/10 | 120 | 2 | 1 |
| Comparative Example 4 | | | | | | D-1 | 0.8 | SL-1/SL-2 | 90/10 | 90 | 3 | 2 |
| Comparative Example 5 | | | | | | D-1 | 0.8 | SL-1/SL-2 | 90/10 | 90 | 2 | 2 |
| Comparative Example 6 | | | | | | D-1 | 0.8 | SL-1/SL-2 | 90/10 | 95 | 3 | 3 |
| Comparative Example 7 | | | | | | D-1 | 0.8 | SL-1/SL-2 | 90/10 | 90 | 3 | 4 |
| Comparative Example 8 | | | | | | D-1 | 0.8 | SL-1/SL-2 | 90/10 | 95 | 3 | 3 |
| Comparative Example 9 | C'-1 | — | — | 0.3 | ≤0.05 | D-1 | 0.8 | SL-1/SL-2 | 90/10 | 90 | 4 | 3 |

From the results of Tables 3-1 and 3-2, it was confirmed that LWR and CDU are both excellent with the actinic ray-sensitive or radiation-sensitive resin composition of Examples.

From comparison between Examples and Comparative Examples 1 and 2, it was shown that even in a case where the actinic ray-sensitive or radiation-sensitive resin composition contains two or more kinds of acid generators, LWR and CDU cannot be improved with k'0/k0 of 0.05 or less. Further, the actinic ray-sensitive or radiation-sensitive resin compositions of Comparative Examples 1 and 2 both correspond to the compositions specifically described in the section of Examples of WO2012/053527A.

On the other hand, from comparison between Examples and Comparative Example 3, it was shown that even in a case where the actinic ray-sensitive or radiation-sensitive resin composition contains two or more kinds of acid generators, LWR and CDU cannot be improved with k'0/k0 of more than 0.90.

The actinic ray-sensitive or radiation-sensitive resin compositions of Comparative Examples 4 and 5 correspond to examples in which a basic compound is contained as a neutralizing agent for an acid generated from the acid generator, but from comparison between Examples and Comparative Examples 4 and 5, it was shown that the actinic ray-sensitive or radiation-sensitive resin compositions of Examples exhibit a more excellent acid diffusion control effect, as compared with the related art where a basic compound is contained as a neutralizing agent for an acid generated from the acid generator.

From comparison between Examples and Comparative Example 6, it was shown that in a case where one kind of acid generator is included, LWR and CDU cannot be improved.

From comparison between Examples and Comparative Examples 7 to 9, it was shown that even in a case where the actinic ray-sensitive or radiation-sensitive resin composition contains two or more kinds of acid generators, LWR and CDU cannot be improved with k'0/k0 of 0.05 or less.

Furthermore, in Comparative Example 9, the decomposition reaction rate ratio (k'0/k0) of the decomposition reaction rate of the acid-decomposable group by the acid generator C-7 to the decomposition reaction rate of the acid-decomposable group by the test acid generator A which is an onium salt including an anion derived from the acid generator B-18 and a triphenylsulfonium cation was 0.05 or less. In addition, the decomposition reaction rate ratio (k'0/k0) of the decomposition reaction rate of the acid-decomposable group by the acid generator C-7 to the decomposition reaction rate of the acid-decomposable group by the test acid generator A which is an onium salt including an anion derived from the acid generator B-6 and a triphenylsulfonium cation was also 0.05 or less.

From comparison between Example 1 and Example 9, it could be seen that the results of Example 1 in which the acid decomposition reaction rate ratio is 0.05 or less and the compound C-7 substantially not contributing to the deprotection reaction is not added and the results of Example 9 in which the compound C-7 is added are equivalent to each other. From these results, it is clear that the actinic rays-sensitive or radiation-sensitive resin composition of the embodiment of the present invention does not necessarily require an acid diffusion control agent.

Moreover, from comparison of Examples 1 to 9 and Examples 11 to 32, it was confirmed that in a case where the acid generator A is a compound having a phenacylsulfonium structure represented by General Formula (ZI-3), LWR and/or CDU is more excellent.

Furthermore, from comparison of Examples 1 to 9 and Examples 11 to 32, it was confirmed that in a case where the acid generator A is other than the compound having a phenacylsulfonium structure represented by General Formula (ZI-3), LWR tends to be more excellent with a pKa of −2.50 or more.

In addition, from the results of Example 10, it was confirmed that in a case where the actinic rays-sensitive or radiation-sensitive resin composition does not substantially contain a basic compound, LWR and/or CDU is more excellent.

EXPLANATION OF REFERENCES 10 substrate
12 film (resist film)

What is claimed is:

1. An actinic ray-sensitive or radiation-sensitive resin composition comprising:
    a resin having an acid-decomposable group whose polarity increases through decomposition by the action of an acid;
    an acid generator A capable of generating a first acid upon irradiation with actinic rays or radiation; and
    an acid generator B capable of generating a second acid upon irradiation with actinic rays or radiation,
    wherein the second acid is capable of decomposing the acid-decomposable group and has a larger pKa than the first acid, and
    in a case where a decomposition reaction rate of the acid-decomposable group by the first acid is defined as k0 and a decomposition reaction rate of the acid-decomposable group by the second acid is defined as k'0, k'0/k0 is more than 0.05 and 0.90 or less,
    provided that k0 and k'0 are determined as follows:
    an actinic ray-sensitive or radiation-sensitive resin film having a film thickness T formed by applying an actinic ray-sensitive or radiation-sensitive resin composition including the resin, a test acid generator A which is an onium salt including an anion of the first acid and a triphenylsulfonium cation, and a solvent onto a substrate is subjected to exposure at 99 positions while increasing an exposure dose from 1 mJ/cm² with an interval of 0.3 mJ/cm² using an ArF excimer laser, the film after the exposure is subjected to a baking treatment at 90° C. for 60 seconds, and the film thickness after the exposure treatment is calculated; thereafter, the film is subjected to a development treatment with butyl acetate for 30 seconds and the film thickness of the film after the development treatment at each exposed position is calculated; points corresponding to the film thickness and the exposure dose after the development treatment at each exposed position are plotted in an orthogonal coordinate having the film thicknesses on the vertical axis and the exposure doses on the horizontal axis, a line obtained by connecting the plotted points is created, and coordinates $E_{0.4}$ and $E_{0.8}$ on the horizontal axis at points where the vertical axes on the line become Film thickness T×0.4 and Film thickness T×0.8, respectively, are each calculated; next, points corresponding to the film thickness and the exposure dose after the exposure treatment at each exposed position are plotted in an orthogonal coordinate having the film thicknesses on the vertical axis and the exposure doses on the horizontal axis, a line obtained by connecting the plotted points is created, and an absolute value of an inclination of a straight line obtained by connecting points at which the horizontal axes on the line become $E_{0.4}$ and $E_{0.8}$, respectively, is taken as k0; and
    next, k'0 is determined by the same calculation method as k0 using an actinic ray-sensitive or radiation-sensitive resin film having a film thickness T formed by applying an actinic ray-sensitive or radiation-sensitive resin composition including the resin, a test acid generator B which is an onium salt including an anion of the second acid and a triphenylsulfonium cation, and a solvent onto a substrate, and k'0/k0 is calculated.

2. The actinic ray-sensitive or radiation-sensitive resin composition according to claim 1,
    wherein a pKa of the first acid is −3.50 or more.

3. The actinic ray-sensitive or radiation-sensitive resin composition according to claim 1,
    wherein a molecular weight of the second acid is 250 or more.

4. The actinic ray-sensitive or radiation-sensitive resin composition according to claim 1,
    wherein the acid generator A and the acid generator B have a cation structure containing a sulfonium ion.

5. The actinic ray-sensitive or radiation-sensitive resin composition according to claim 1,
    wherein at least one of the acid generator A or the acid generator B is a compound represented by General Formula (ZI-3),

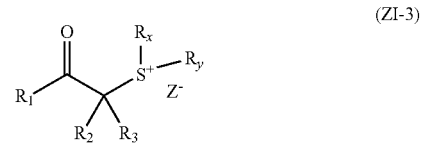

(ZI-3)

in General Formula (ZI-3), $R_1$ represents an alkyl group, a cycloalkyl group, an alkoxy group, a cycloalkoxy group, an aryl group, or an alkenyl group, $R_2$ and $R_3$ each independently represent a hydrogen atom, an alkyl group, a cycloalkyl group, a halogen atom, a cyano group, or an aryl group, and $R_x$ and $R_y$ each independently represent an alkyl group, a cycloalkyl group, an alkenyl group, an aryl group, a 2-oxoalkyl group, a 2-oxocycloalkyl group, an alkoxycarbonylalkyl group, an alkoxycarbonylcycloalkyl group, an allyl group, or a vinyl group;

$R_2$ and $R_3$ may be linked to each other to form a ring, and $R_1$ and $R_2$ may be linked to each other to form a ring, $R_x$ and $R_y$ may be linked to each other to form a ring, and a ring structure formed by mutual linking of $R_x$ and $R_y$ may include an oxygen atom, a nitrogen atom, a sulfur atom, a ketone group, an ether bond, an ester bond, or an amide bond; and $Z^-$ represents an anion.

6. A resist film formed using the actinic ray-sensitive or radiation-sensitive resin composition according to claim 1.

7. A pattern forming method comprising:
forming a resist film using the actinic ray-sensitive or radiation-sensitive resin composition according to claim 1;
exposing the resist film; and
developing the exposed resist film using a developer.

8. A method for manufacturing an electronic device, comprising the pattern forming method according to claim 7.

\* \* \* \* \*